United States Patent

Omura et al.

[11] Patent Number: 5,883,402
[45] Date of Patent: *Mar. 16, 1999

[54] SEMICONDUCTOR DEVICE AND PROTECTION METHOD

[75] Inventors: Ichiro Omura, Zurich, Switzerland; Tsuneo Ogura, Kamakura, Japan; Kenichi Matsushita, Tokyo, Japan; Hideaki Ninomiya, Yokohama, Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 744,245

[22] Filed: Nov. 5, 1996

[30] Foreign Application Priority Data

Nov. 6, 1995 [JP] Japan .................................. 7-287208
Mar. 29, 1996 [JP] Japan .................................. 8-075632

[51] Int. Cl.$^6$ .................................................. H01L 29/74
[52] U.S. Cl. ........................................ 257/146; 257/487
[58] Field of Search ................................ 257/146, 487

[56] References Cited

U.S. PATENT DOCUMENTS 4,646,121  2/1987  Ogura .
5,343,067  8/1994  Nakagawa et al. ..................... 257/487

OTHER PUBLICATIONS

"The IGBT With Monolithic Overvoltage Protection Circuit," Tomoyuki Yamazaki et al. Proceedings of 5th International Symposium on Power Semiconductor Devices and ICs; May 18, 1993. p. 41–45.

"Active Surge Voltage Clamped 600A IPM For High Power Application," G. Majumdar et al. Proceeding of 1995 International Symposium of Power Semiconductor Devices & ICs; May 23, 1995. p. 75–79.

*Primary Examiner*—Valencia Martin-Wallace
*Attorney, Agent, or Firm*—Oblon, Spivak, McClelland, Maier & Neustadt, P.C.

[57] ABSTRACT

A semiconductor device comprises a main switching element, an electric field detector and an on-voltage application unit. The main switching element includes a high-voltage main electrode, at least a low-voltage main electrode and at least a first gate electrode. The electric field detector has a MOS structure making conductive between the high-voltage main electrode and the first gate electrode in a path other than the main switching element in accordance with a predetermined electric field generated in the main switching element. The on-voltage application unit applies an on-voltage to the first gate electrode on the basis of the conductive state.

10 Claims, 34 Drawing Sheets

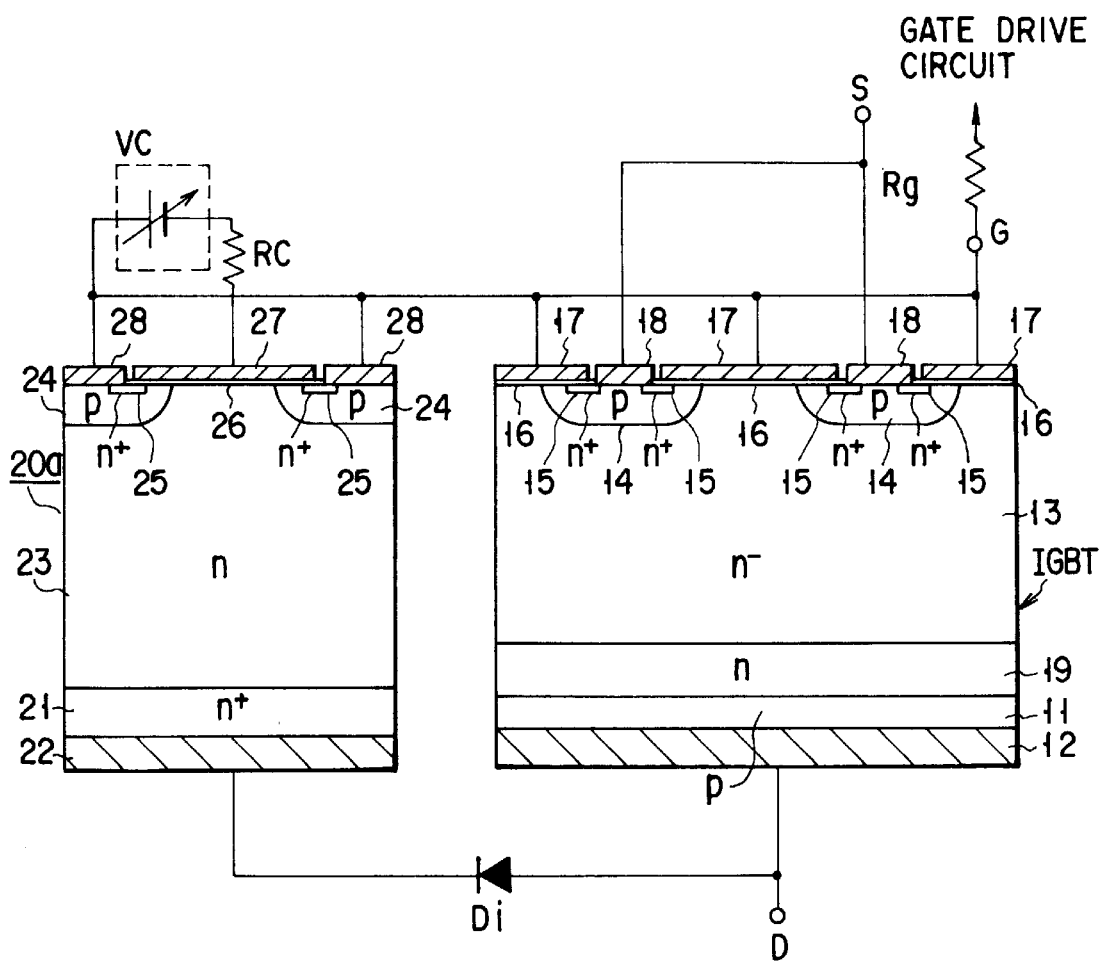
F I G. 5

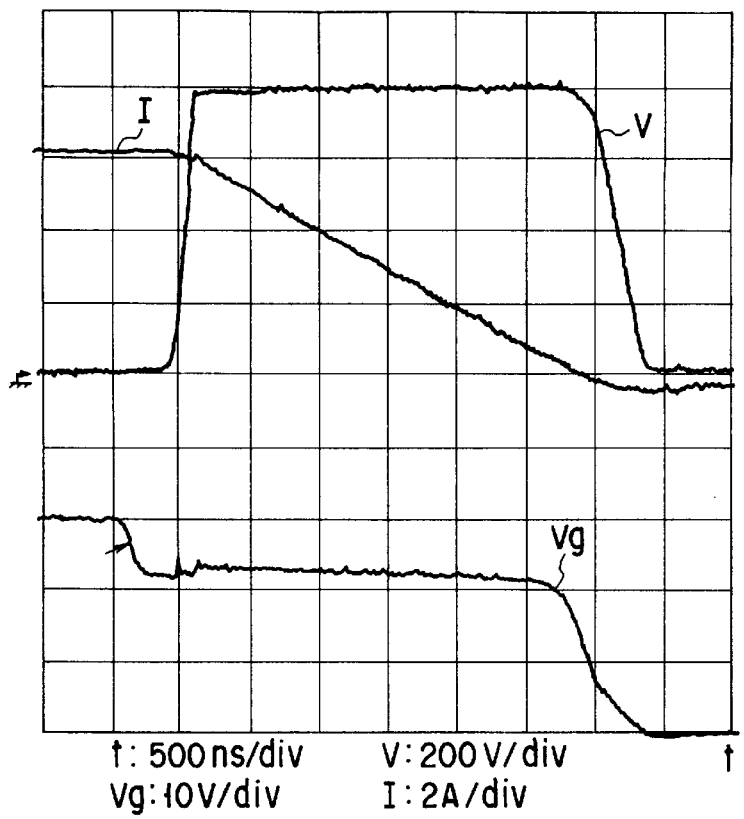
F I G. 8
t: 500 ns/div    V: 200 V/div
Vg: 10 V/div    I: 2A/div
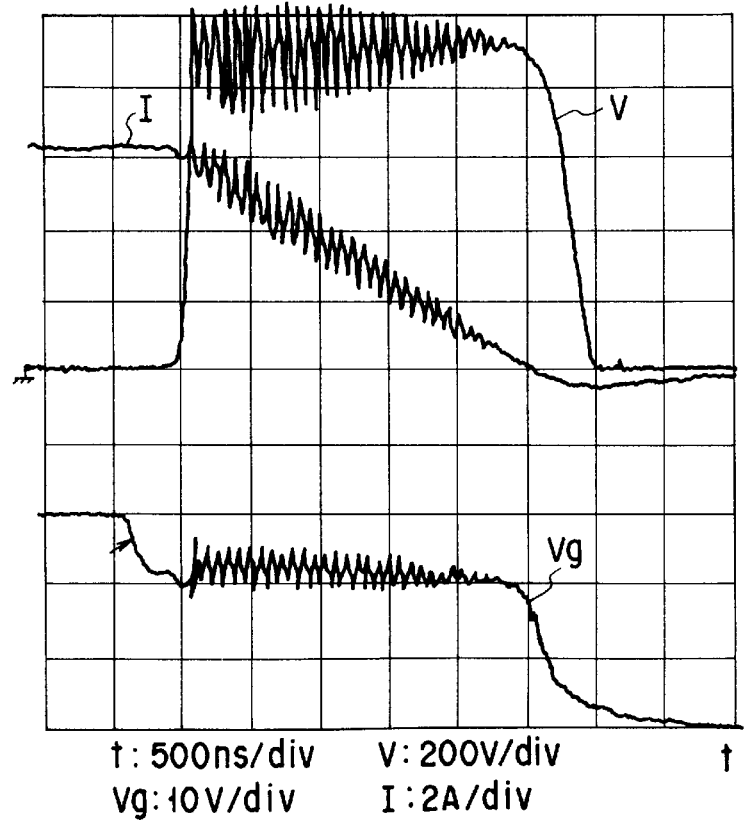
F I G. 9
t: 500ns/div    V: 200V/div
Vg: 10V/div    I: 2A/div

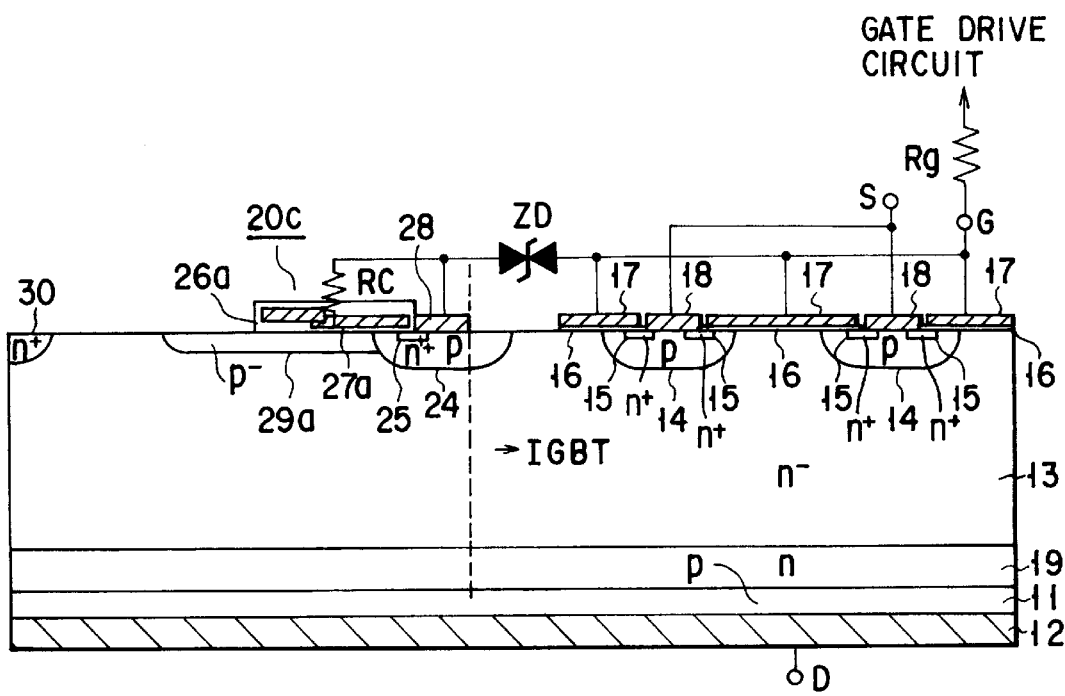
F I G. 12
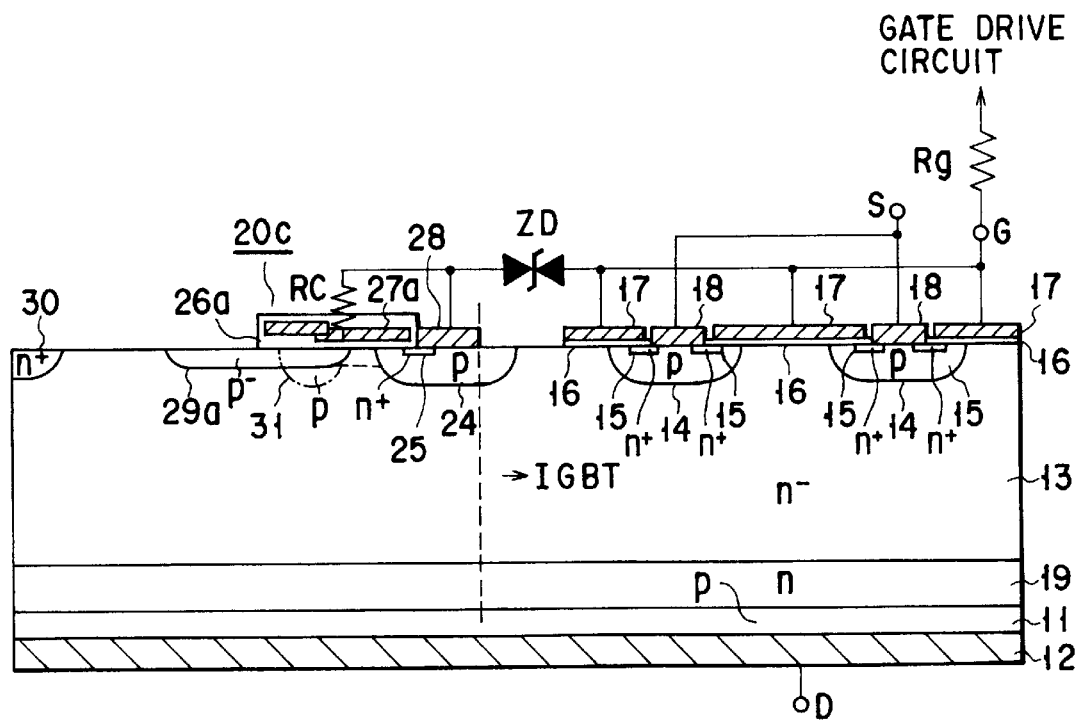
F I G. 13

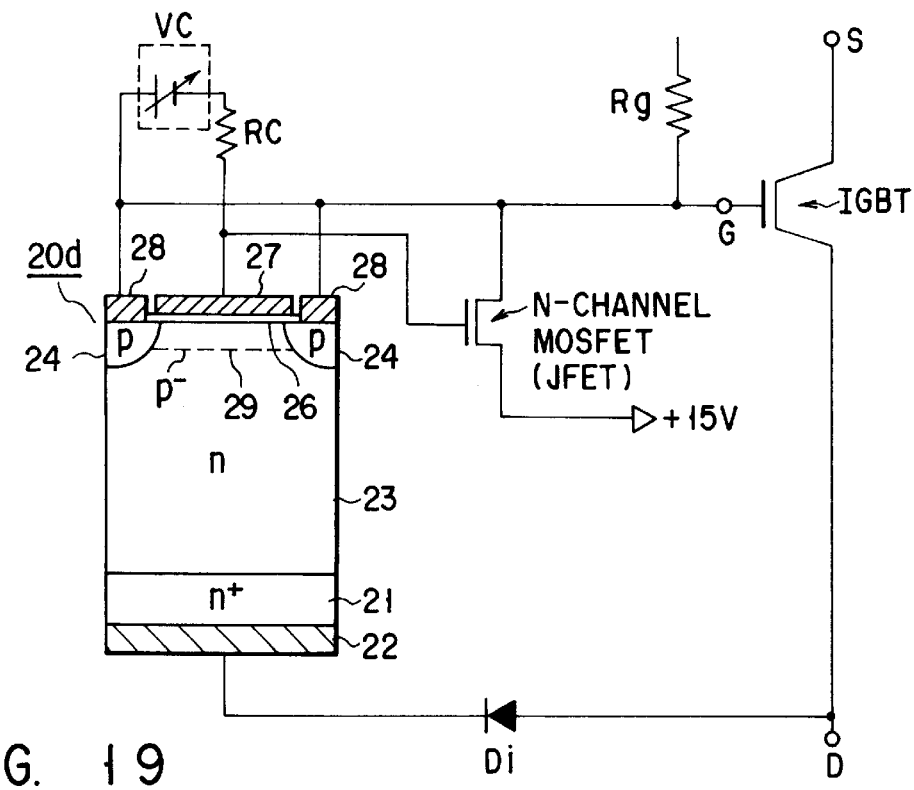
F I G. 19
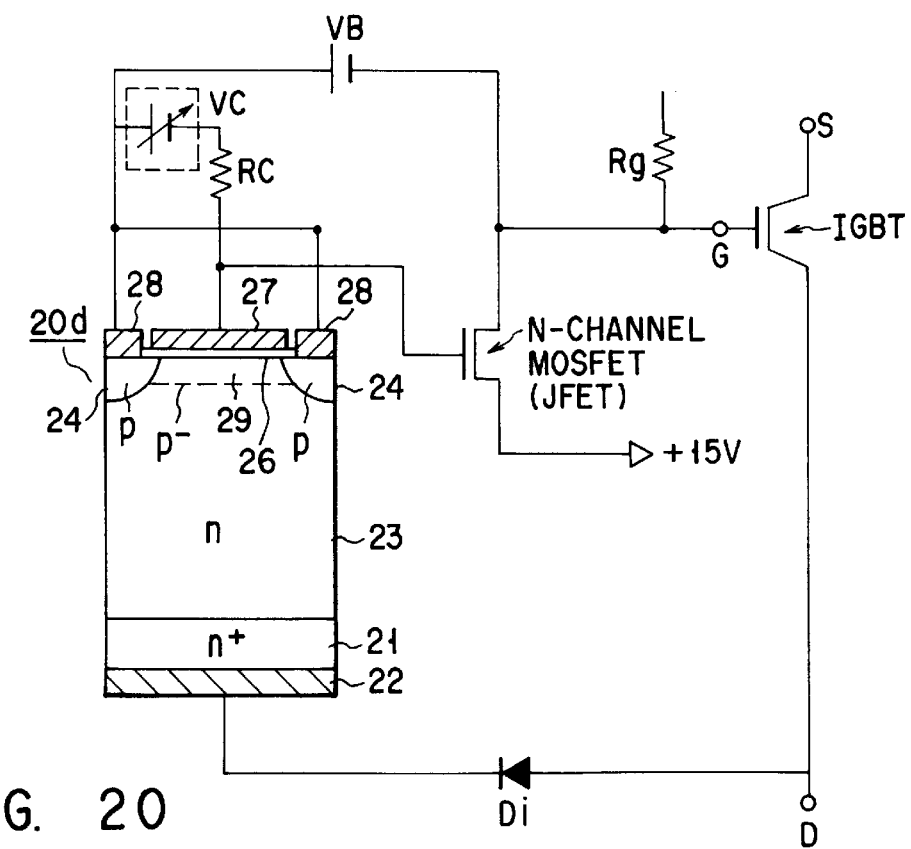
F I G. 20

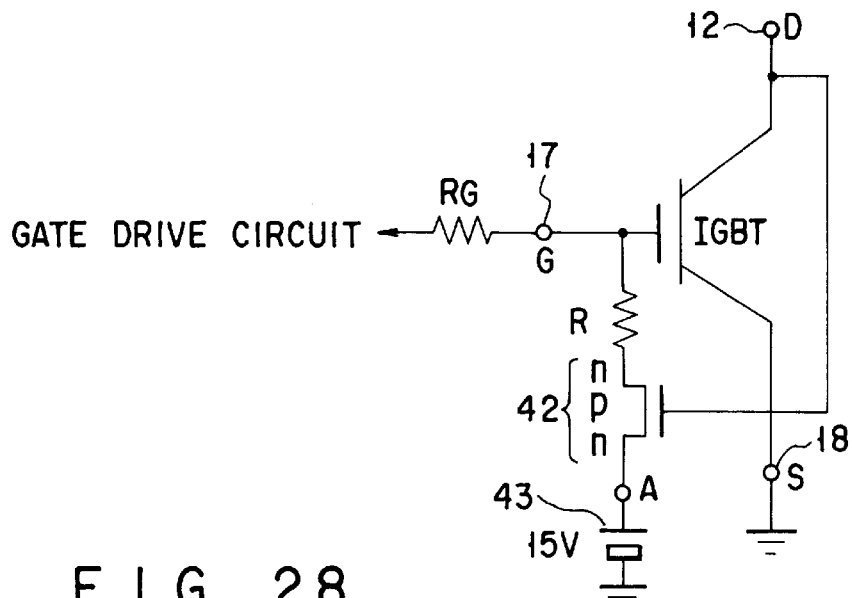
F I G. 28
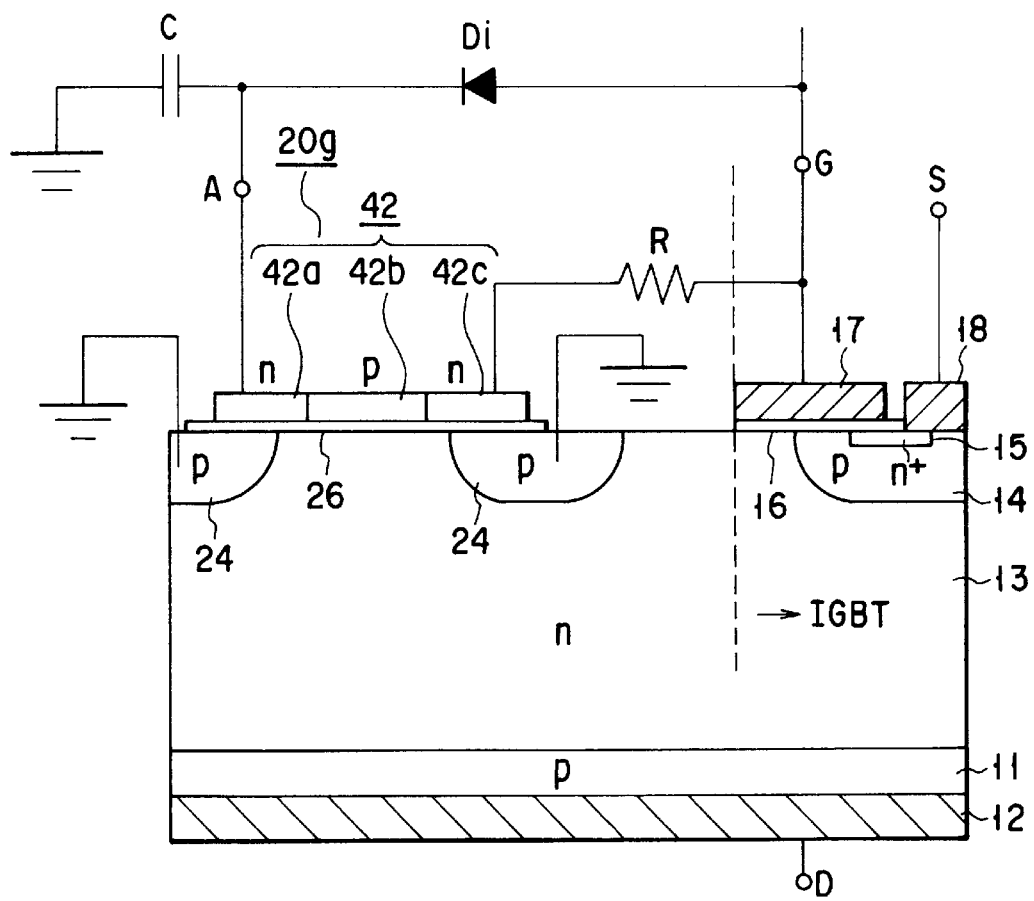
F I G. 29

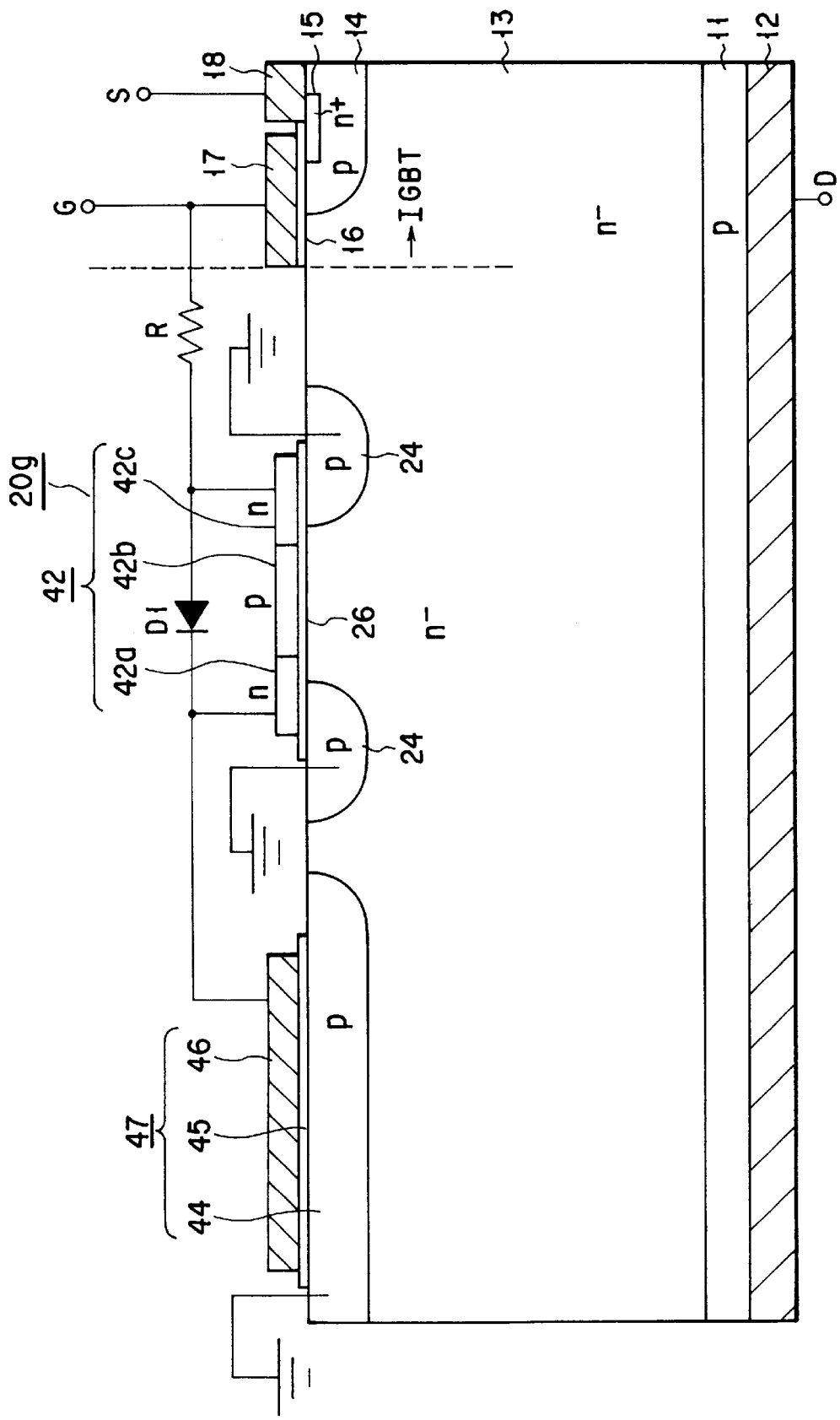
F I G. 32

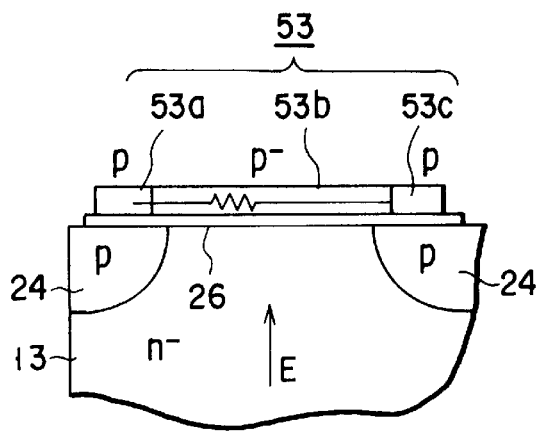
F I G. 35
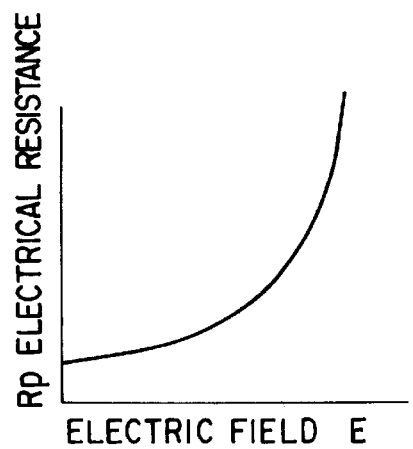
F I G. 36
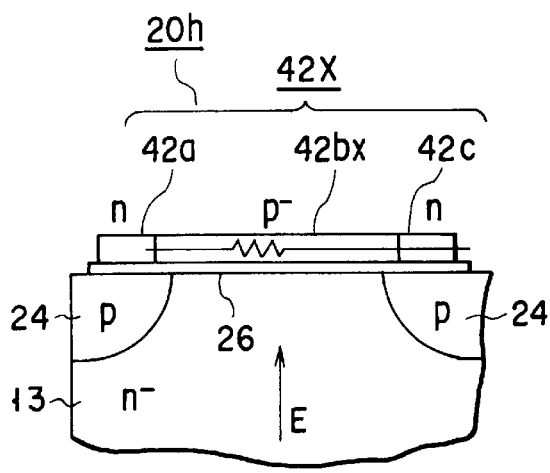
F I G. 37
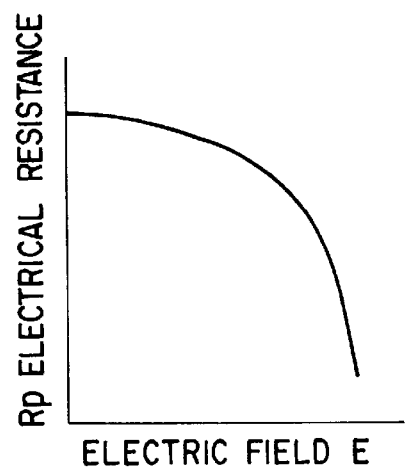
F I G. 38
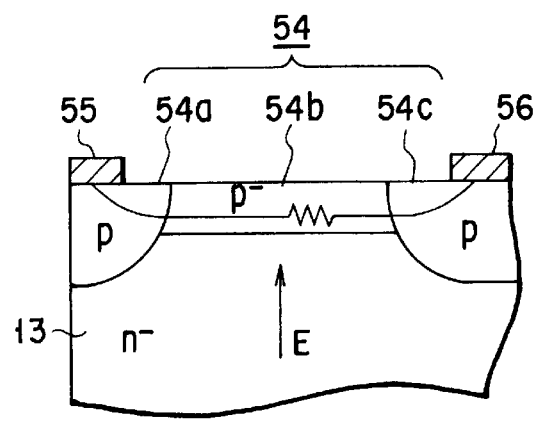
F I G. 39

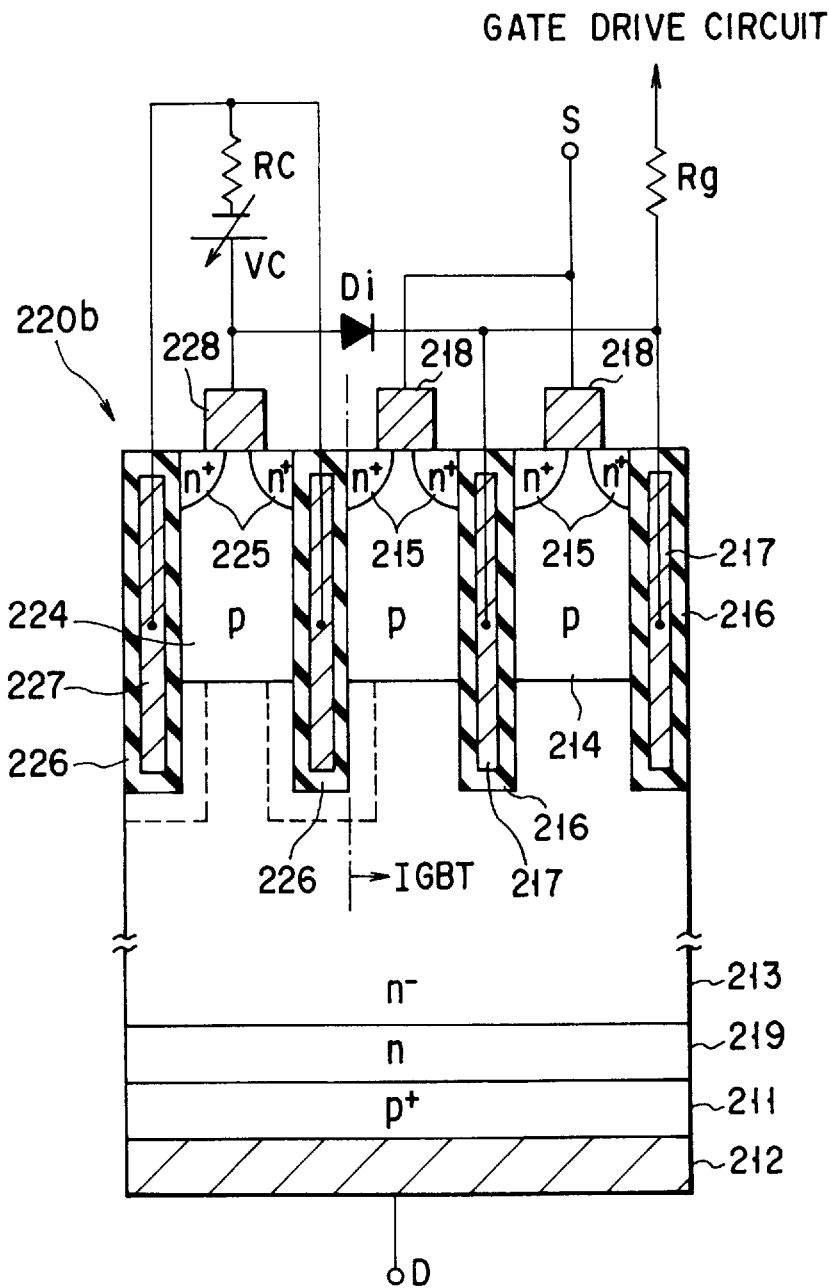
F I G. 50

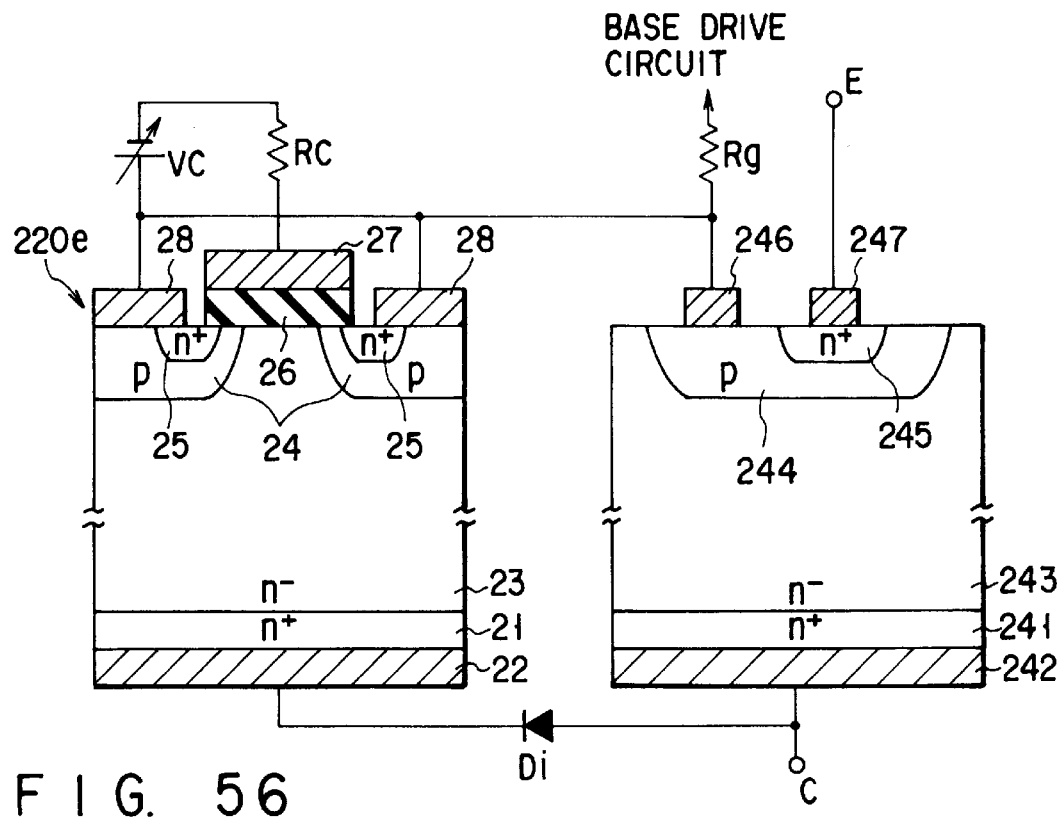
F I G. 56
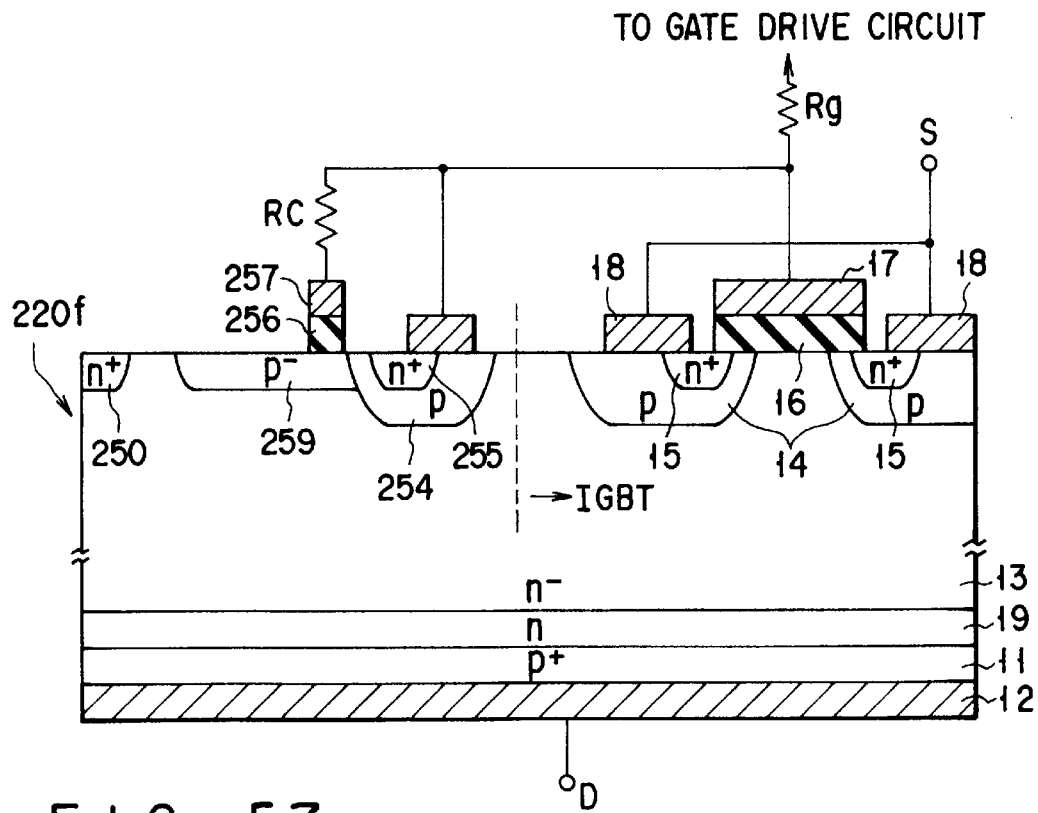
F I G. 57

SEMICONDUCTOR DEVICE AND PROTECTION METHOD

BACKGROUND OF THE INVENTION

1. Field of the Invention

The present invention relates to a semiconductor device and a protection method, and more in particular to a power control semiconductor device and a protection method capable of protecting a switching element from a high voltage applied in off state or in a state leading to an off state.

2. Description of the Related Art

In recent years, an IGBT (Insulated Gate Bipolar Transistor) has been closely watched as a power control semiconductor device. The IGBT, which is a bipolar device having a MOS structure, has a high-speed switching characteristic of a power MOSFET and high withstand voltage, and high conduction characteristics of a bipolar transistor.

The IGBT of this type is used as a main switching device connected with the drain electrode D thereof as a positive potential side and the source electrode S thereof as a negative potential side in a series circuit of a DC power supply 301 of E1 in voltage and a motor coil 302, as shown in FIG. 1. The potential of the gate electrode G of the IGBT is controlled by a gate control circuit 303 thereby to turn the series circuit on and off.

An on-off control timing chart is shown in FIG. 2, for example. Character V designates a drain-source voltage (hereinafter referred to as the main voltage), and I designates the drain-source current or the current in the series circuit. Vg designates a gate voltage.

Now, assume that Vg is 0 and IGBT is off (time t=T1). In other words, assume that I is 0, and V is substantially equal to a power source voltage value. Next, it is assumed that a predetermined voltage is applied to Vg and the IGBT is turned on (time t=T2). When the IGBT is turned on, V is rapidly reduced while I gradually increases. In this case, a coil 302 stores energy of $(½)LI^2$ when the self-inductance is assumed to be L.

Next, assume that Vg is 0 and that IGBT is turned to off state (time t=T3). When IGBT is turned off, V rapidly rises to a value higher than the power source voltage value E1 and then settles at the power source voltage value E1. The rapidly rising portion of V occurs as the IGBT receives the coil energy when the IGBT changes from on to off state. Like other semiconductor devices, the IGBT is highly liable to break down upon application thereto of a voltage higher than the voltage allowed for the operation (hereinafter referred to as the overvoltage). It is therefore necessary to protect the IGBT by suppressing the overvoltage of the rapidly-rising V portion below a certain value.

The IGBT is liable to reach to an overvoltage state when it is off or transferring to an off state. In other words, the overvoltage condition of the IGBT occurs when the gate voltage Vg is zero or assumes a low negative value, or the gate voltage Vg is reduced. If the IGBT is to be protected, therefore, the gate voltage Vg is required to be increased so that the IGBT is turned on incompletely and thereby the IGBT resistance is reduced to prevent the main voltage from increasing beyond an allowable value.

The IGBT has its own function of preventing a voltage of a predetermined value or more from being applied thereto. This is called the self-clamping function, and the value of the voltage thereof is called the self-clamp voltage. The self-clamp function, however, is difficult to control since it is a current conduction attributable to the avalanche phenomenon due to a high electric field. The IGBT thus is liable to break down due to local current concentration within itself.

In order to protect the IGBT from the overvoltage at the time of turning off, a zener diode ZD is conventionally connected between the drain and gate as shown in FIG. 3. Also, the gate is connected to a gate drive circuit 303 through a resistor Rg. Now, this protection circuit will be explained in detail with reference to FIG. 4.

FIG. 4 is a sectional view schematically showing an IGBT of this type and a peripheral configuration thereof. This IGBT includes a drain electrode 312 formed on a p-type drain layer 311. An n-type base layer 313 is also formed on the surface of the p-type drain layer 311 opposite to the drain electrode 312. A plurality of p-type base layers 314 are selectively formed by diffusion in the surface of the n-type base layer 313. A plurality of n-type source layers 315 are selectively formed in the surface of each p-type base layer 314.

A gate electrode 317 is formed through a gate insulating film 316 on each p-type base layer 314 formed between each n-type source layer 315 and the n-type base layer 313. Also, a source electrode 318 is formed on each p-type base layer 314 and the n-type source layers 315.

Each gate electrode 317 is connected to a gate drive circuit 303 through a gate resistor Rg.

Further, a zener diode ZD is interposed between the gate electrodes 317 and the drain electrode 312 in order to protect the IGBT from the overvoltage described above.

If this IGBT is to be turned on, a voltage positive with respect to the source electrodes 318 is applied to the gate electrodes 317 with a voltage (main voltage) positive with respect to the source electrodes 318 being applied to the drain electrode 312. As a result, a n-type channel is formed in the surface of the p-type base layer 314 held between the n-type base layer 313 and the n-type source layer 315, so that an electron current flows into the n-type base layer 313. On the other hand, a hole current flows into the n-type base layer 313 from the p-type drain layer 311. Thus a conduction modulation occurs in the n-type base layer thereby to turn on the IGBT.

If the IGBT is to be turned off, on the other hand, a zero or a negative voltage with respect to the source electrode 318 is applied to the gate electrode 317. As a result, the n-type channel disappears and electron injection into the n-type base layer 313 ceases, and the IGBT soon turns off. The main voltage is applied even in this state.

The IGBT is liable to suffer an overvoltage when in an off state or transferring to the off state.

In the configuration of FIG. 4, a zener diode ZD is provided for preventing the overvoltage condition. This zener diode ZD has a zener voltage (peak inverse withstand voltage) lower than the self-clamp voltage of the IGBT. A current flows in the zener diode ZD when an inverse voltage higher than the zener voltage is applied thereto. As a result, when the main voltage higher than the zener voltage is applied between drain and source of the IGBT, a current flows through the zener diode ZD to the gate drive circuit 303 from the drain of the IGBT. Consequently, the voltage drop due to the gate resistor Rg increases the gate voltage Vg and turns on the IGBT incompletely thereby to protect the IGBT from an overvoltage.

The use of a zener diode thus can prevent the breakdown of the conventional IGBT but poses the problem described below.

First, when the drain-source main voltage rapidly rises to a value higher than the power source voltage value due to the inductance, the zener diode ZD protects the IGBT from an overvoltage. In the process, however, the negative resistance of the zener diode ZD generates a large noise. This noise in turns causes a gate operating error and the breakdown of the IGBT.

Also, the zener voltage across the zener diode ZD is subject to considerable variations. Even when the same type of zener diode ZD is used in the same circuit, therefore, the same voltage is not necessarily generated for protection. Due to the variations in zener voltage, the protection voltage (clamp voltage) is difficult to design. Further, the clamp voltage cannot be changed once the zener diode ZD is built in the circuit. It is therefore difficult to change the clamp voltage in accordance with the operating conditions, temperature or circuit conditions of the IGBT.

Also, since the IGBT has a high operating voltage, the clamp voltage also assumes a high value. The zener voltage of the zener diode ZD, however, assumes a value considerably lower than the clamp voltage of the IGBT. Actually, therefore, the zener diode ZD in FIG. 4 is configured of a series circuit of a plurality of zener diodes, leading to the problem that a large area is required.

Furthermore, in the case where the rate dv/dt at which the main voltage rises is large, the IGBT may be broken. This is called the dv/dt breakdown, which is difficult to prevent for the IGBT using a zener diode ZD.

SUMMARY OF THE INVENTION

The object of the present invention is to provide a semiconductor device and a protection method in which few noises are generated and stable protection is possible from an overvoltage.

In order to achieve the above-mentioned object, according to the present invention, there is provided a first semiconductor device comprising a main switching element including a high-voltage main electrode, a low-voltage main electrode and a first gate electrode, an electric field detector having a MOS structure making conductive between the high-voltage main electrode and the first gate electrode in a path other than the main switching element in accordance with a predetermined electric field generated in the main switching element, and on-voltage application means for applying an on-voltage to the first gate electrode on the basis of the conductive state.

Also, the MOS structure may include a semi-conductor layer of first conductivity type and an insulating film formed on the semiconductor layer of first conductivity type. In this case, the portion of the semiconductor layer of first conductivity type adjacent to the insulating film may be formed with a channel layer of second conductivity type or a shield layer of second conductivity type.

Further, according to the invention, there is provided a second semiconductor device comprising: a main switching element including a high-voltage main electrode, a low-voltage main electrode and a first gate electrode; an electric field detector including a semiconductor layer of first conductivity type electrically connected to the high-voltage main electrode, a plurality of semiconductor layers of second conductivity type formed selectively in the surface of the semiconductor layer of first conductivity type and a second gate electrode formed through a gate insulating film on the semiconductor layer of first conductivity type held between the semiconductor layers of second conductivity type and electrically connected to the first gate electrode, the electric field detector being adapted to making conductive between the high-voltage main electrode and the first gate electrode in a path other than the main switching element in accordance with a predetermined electric field generated in the main switching element; and on-voltage application means for applying an on-voltage to the first gate electrode on the basis of the conductive state described above.

Also, in the second semiconductor described above, a channel layer of second conductivity type or a shield layer of second conductivity type may be formed between the semiconductor layers of second conductivity type.

Further, in the second semiconductor device described above, the electric field detector may have a MOSFET structure by forming an emitter layer of first conductivity type selectively in the semiconductor layer of second conductivity type.

Furthermore, the second semiconductor device may have a variable power supply electrically connected between the first gate electrode and the second gate electrode.

In addition, according to the invention, there is provided a third semiconductor device comprising: a main switching element including a high-voltage main electrode, a low-voltage main electrode and a first gate electrode; an electric field detector including a semiconductor layer of first conductivity type electrically connected to the high-voltage main electrode and a semiconductor layer formed on the semiconductor layer of first conductivity type through an insulating film and having the electrical resistance of an interface thereof with the insulating film decreasing in accordance with the electric field of the main switching element; and on-voltage application means for applying an on-voltage to the first gate electrode on the basis of the reduction in the electrical resistance.

In the first to third semiconductor devices described above, the main switching element may be an IGBT or a MOSFET.

Further, according to the invention, there is provided a method of protecting the above-mentioned semiconductor device comprising a main switching element including a high-voltage main electrode, a low-voltage main electrode and a first gate electrode, and an electric field detector having a MOS structure, the method comprising the step of making conductive between the high-voltage main electrode and the first gate electrode in a path other than the main switching element in accordance with a predetermined electric field generated in the main switching element by the electric field detector and the step of applying an on-voltage to the first gate electrode on the basis of the conductive state by the on-voltage application means.

Now, the above-mentioned device and method will be explained in complementary fashion.

The gist of the invention is to protect the main switching element by an electric field detector having a MOS structure in place of a conventional zener diode. More specifically, in the MOS structure, the carriers condition of semiconductor at the interface between the insulating film and the semiconductor changes with the voltage applied to the MOS structure. Hence, the condition of carriers changes when the electric field increases over the value corresponding to the clamp voltage while the main switching element remains off or being turned on. Therefore, the carriers move between the high-voltage main electrode and the first gate electrode through a path other than the main switching element. That is, a current is fed back from the high-voltage main electrode to the first gate electrode via the electric field detector. As a result, the gate voltage of the first gate electrode increases, incompletely turning on the main switching element. The resistance of the main switching element is thereby reduced, thus decreasing the main voltage between the high-voltage and low-voltage main electrodes below the clamp voltage.

Further, the "path other than the main switching element" is meant that the path through in the electric field detector is different from the path through in the main switching element when the two paths are shown by circuit diagram, however the main switching element and electric field detector may be formed integrally.

In this way, according to this invention, an overvoltage is protected by utilizing the conductive state due to the change in the carrier conditions of the MOS structure but not by using the local current conduction accompanied by the negative resistance due to the avalanche phenomenon. Consequently, according to the invention, as compared with the conventional case using a zener diode, noises can be reduced and the main switching element can be protected stably from an overvoltage. In other words, noises which are liable to occur when using the current conduction due to the avalanche for about 5 V or more in a zener diode can be prevented according to this invention.

The MOS structure referred to herein is defined in such a broad sense as to include not only the structure but also the function of a sandwich configuration of layers composed of a metal, an oxide film and a semiconductor. For example, it also includes a structure having a polycrystal semiconductor in place of a metal and a structure including an insulating film of other type than an oxide film.

In this MOS structure, assume that the semi-conductor layer constitutes a semiconductor layer of first conductivity type and the main voltage of the main switching element is lower than the clamp voltage. The electric field detector is required to be made non-conductive. The electric field detector can be made non-conductive by either first or second means described below.

In the first means, for a voltage lower than the clamp voltage, a MOS structure is controlled in such a manner that a channel layer of second conductivity type is formed in the interface of the semiconductor layer of first conductivity type with the insulating film and the current from the high-voltage main electrode is shielded by the channel layer of second conductivity type.

In the second means, a high-resistance shield layer of second conductivity type is formed in advance, whereby the current from the high-voltage main electrode is shielded.

Specifically, the electric field detector is formed in such a way that a plurality of semiconductor layers of second conductivity type are formed selectively in the surface of a semiconductor layer of first conductivity type, and a second gate electrode is formed through a gate insulating film on the semiconductor layer of first conductivity type held between the semiconductor layers of second conductivity type. The second gate electrode is electrically connected with the first gate electrode, and the semiconductor layer of first conductivity type is also electrically connected with the high-voltage main electrode.

A channel layer of second conductivity type or a shield layer of second conductivity type is formed in the portion of the semiconductor layer of first conductivity type held between the semiconductor layers of second conductivity type and in contact with the gate insulating film.

Also, an emitter layer of first conductivity type is formed in the semiconductor layers of second conductivity type, and the gate insulating film and the second gate electrode are extended over the emitter layer of first conductivity type.

Then, a channel layer of first conductivity type can be formed in the semiconductor layer of second conductivity type held between the emitter layer of first conductivity type and the semiconductor layer of first conductivity type. In the case where what is called a MOSFET structure is employed in which the formation of a channel of first conductivity type turns on the electric field detector and makes conductive between the high-voltage main electrode and the first gate electrode, then the electric field detector can double as an on-voltage application means thereby simplifying the circuit configuration.

In the case where it is desired to make variable the voltage at which the electric field detector turns on, i.e., the clamp voltage, a variable power supply is electrically connected between the first gate electrode and the second gate electrode so that the gate voltage of the second gate electrode is made variable.

As another configuration example of an electric field detector, a semiconductor layer is formed on a semiconductor of first conductivity type through an insulating film, and using a structure in which the electrical resistance of the interface between this semiconductor layer and the insulating film is reduced in accordance with the electric field generated in the main switching element, the first gate electrode is supplied with an on-voltage on the basis of the reduction of the electrical resistance. In this case, the semiconductor layer of first conductivity type functions as a metal in the MOS structure.

The gist of the present invention lies in the protection of the main switching element. This switching element may take any form as long as it is driven by a gate. An example will be described below.

For example, an applicable structure of a main switching element according to the invention includes a high-resistance base layer of first conductivity type, an emitter layer of second conductivity type forming a PN junction with the base layer of first conductivity type, a base layer of second conductivity type selectively formed on the surface of the base layer of first conductivity type, and an emitter layer of first conductivity type formed selectively in the base layer of second conductivity type, wherein a channel layer of first conductivity type is formed by the first gate electrode in the base layer of second conductivity type held between the emitter layer of first conductivity type and the base layer of first conductivity type. The main switching element of this structure includes an IGBT or a MOS thyristor.

Also, the invention is applicable to a MOSFET, a GTO, a thyristor, a SIT, a MESFET, a SIThy, etc.

Further, the invention is applicable to various main switching elements having the planar structure, the trench structure, mesa structure or the counter mesa structure. The structure of the main switching element may be either vertical or lateral.

The above and other objects, features and advantages will be made apparent by the detailed description taken in conjunction with the accompanying drawings, in which similar reference numerals designate similar components parts respectively.

BRIEF DESCRIPTION OF THE DRAWINGS

FIG. 5 is a sectional view schematically showing a configuration of a semiconductor device according to a first embodiment of the invention;

FIG. 8 a waveform diagram showing the measurement result of a clamp voltage according to the same embodiment;

FIG. 9 is a waveform diagram for comparison with the prior art according to the same embodiment;

FIG. 12 is a sectional view schematically showing a configuration of a semiconductor device according to a fourth embodiment of the invention;

FIG. 13 is a sectional view schematically showing a configuration of a semiconductor device according to a fifth embodiment of the invention;

FIG. 19 is a sectional view schematically showing a configuration of a semiconductor device according to a seventh embodiment of the invention;

FIG. 20 is a sectional view schematically showing a configuration of a semiconductor device according to an eighth embodiment of the invention;

FIG. 28 is a diagram showing an equivalent circuit of a semiconductor device according to the same embodiment;

FIG. 29 is a sectional view schematically showing a configuration of a 14th embodiment of the invention;

FIG. 32 a sectional view schematically showing a configuration of a semiconductor device according to a 16th embodiment of the invention;

FIG. 35 a partial sectional view schematically showing a part of a configuration of a semiconductor device according to the same embodiment;

FIG. 36 is a diagram showing the relation between the electric field and the electric resistance of a semiconductor device according to the same embodiment;

FIG. 37 is a partial sectional view schematically showing a part of a configuration of a semiconductor device according to a 19th embodiment of the invention;

FIG. 38 is a diagram showing the relation between the electric field and the electric resistance of a semiconductor device according to the same embodiment;

FIG. 39 is a partial sectional view schematically showing a part of a configuration of a semiconductor device according to a 20th embodiment of the invention;

FIG. 50 is a sectional view schematically showing a configuration of a semiconductor device according to a 29th embodiment of the invention;

FIG. 56 is a sectional view schematically showing a configuration of a semiconductor device according to a 35th embodiment of the invention;

FIG. 57 is a sectional view schematically showing a configuration of a semiconductor device according to a 36th embodiment of the invention;

DETAILED DESCRIPTION OF THE PREFERRED EMBODIMENTS

Now, embodiments of the present invention will be described with reference to the accompanying drawings. In the embodiments described below, the first conductivity type is referred to as n type, and the second conduction type as p type.

(First embodiment)

Figure 1:
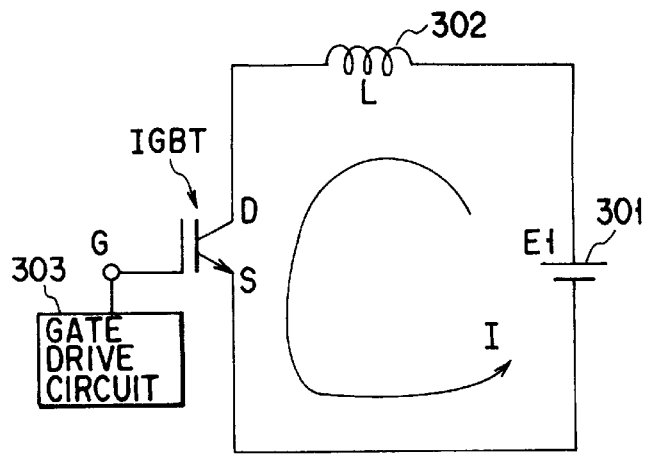
FIG. 1 is a diagram showing a conventional series circuit having a main switching element.
Figure 2:
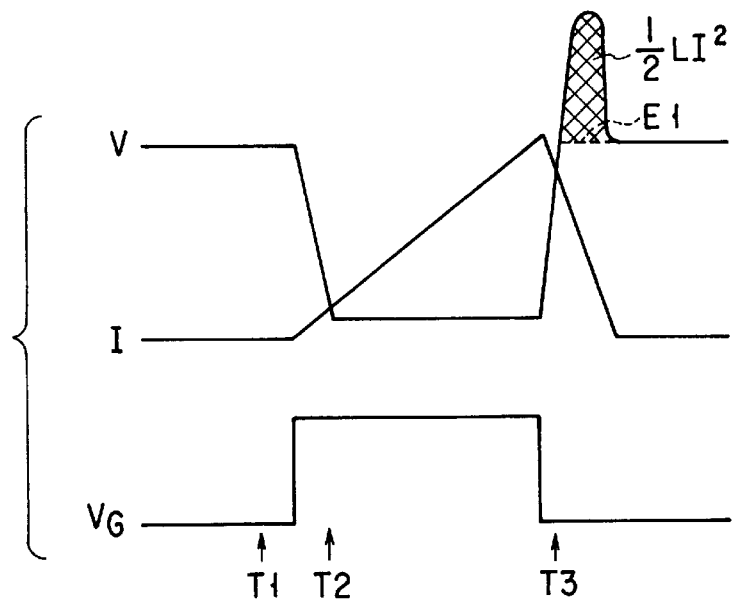
FIG. 2 a timing chart for explaining the on-off control operation of the conventional series circuit.
Figure 3:
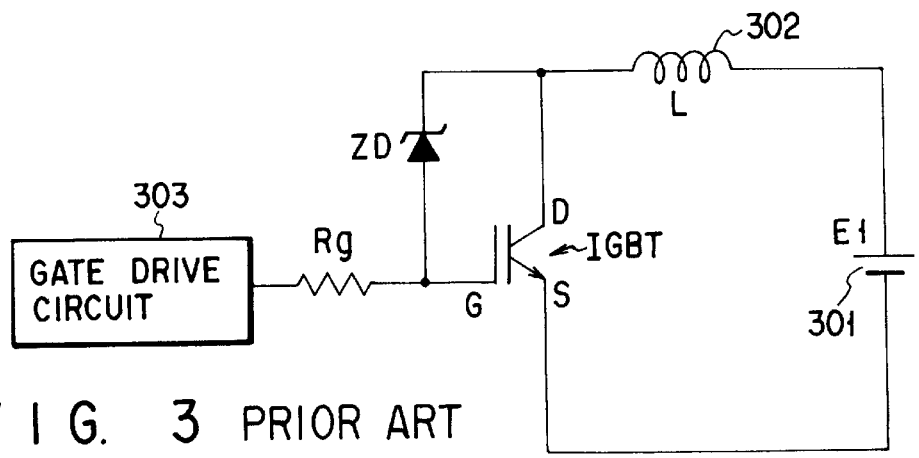
FIG. 3 is a diagram showing a conventional series circuit having a protective zener diode.
Figure 4:
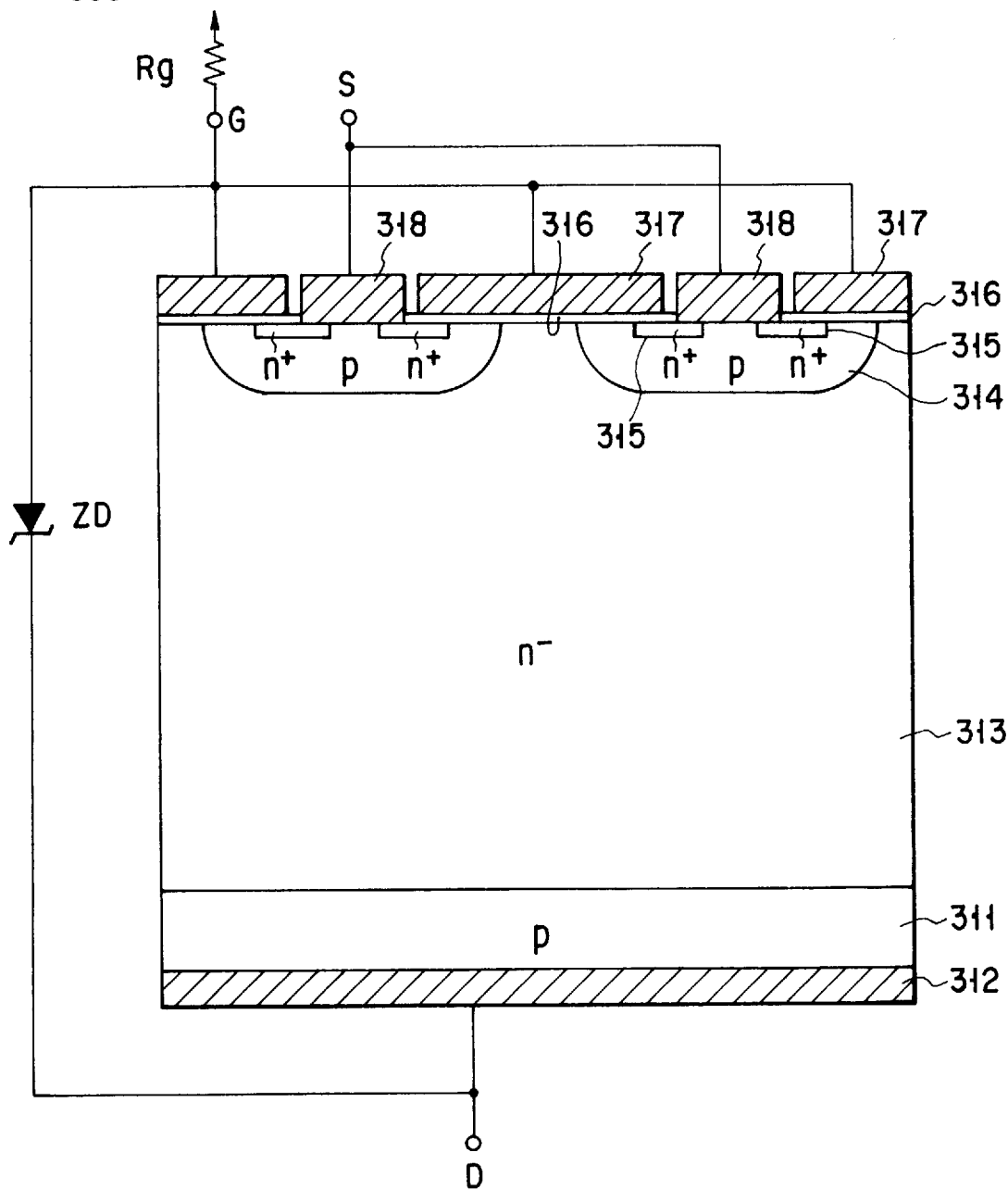
FIG. 4 is a sectional view schematically showing a conventional IGBT and a peripheral configuration thereof.
Figure 6:
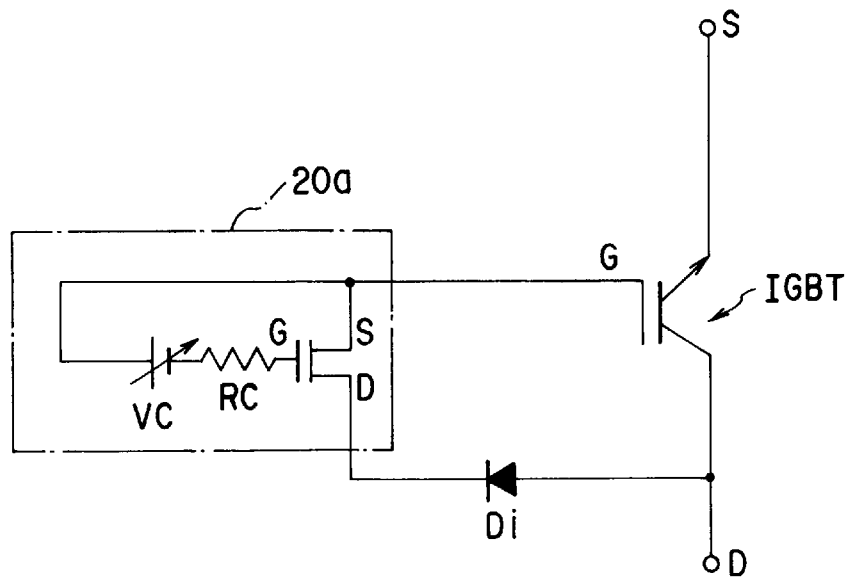
FIG. 6 is a circuit diagram schematically showing a configuration of a semiconductor device according to the same embodiment.

FIG. 5 is a sectional view schematically showing a configuration of a semiconductor device according to a first embodiment of the invention. FIG. 6 is a diagram schematically showing a circuit having the configuration of the same semiconductor device.

In FIG. 5, reference numeral 11 designates a p-type drain layer as an emitter layer of second conductivity type. A drain electrode 12 constituting a high-voltage main electrode is formed on one surface of the p-type drain layer 11.

A high-resistance n-type base layer 13 constituting a base layer of first conductivity type is formed on the surface of the p-type drain layer 11 opposite to the drain electrode 12. The surface of the n-type base layer 13 is formed with a plurality of p-type base layers 14 constituting base layers of second conductivity type selectively by diffusion. The surface of each p-type base layer 14 is formed selectively with n-type source layers 15 constituting an emitter layer of first conductivity type.

A first gate electrode 17 is formed on each p-type base layer 14 held between the n-type source layers 15 and the n-type base layer 13 through a gate insulating film 16 composed of an oxide film. Also, a source electrode 18 constituting a low-voltage main electrode is formed on the p-type base layer 14 and the n-type source layers 15.

Further, an n-type buffer layer 19 is formed between the p-type drain layer 11 and the n-type base layer 13.

In this way, a planar and vertical IGBT is formed as a main switching element.

Also, each gain electrode 17 is connected to a gate drive circuit through a gate resistor Rg.

An electric field detector 20a is formed externally to the IGBT in such a manner as to connect the drain electrode 12 of the IGBT and the first gate electrode.

The electric field detector 20a has a MOSFET structure, and specifically is structured as described below. An n-type drain layer 21 is formed on the drain electrode 12 side. One of the surface of the n-type drain layer 21 is formed with a drain electrode 22. This drain electrode 22 is connected to the drain electrode 12 through a diode Di.

The diode Di is for blocking the current flow to the drain electrode 12 from the gate drive circuit through the electric field detector 20a. The series connection of the electric field detector 20a and the diode Di may be reversed.

The surface of the n-type drain layer 21 opposite to the drain electrode 22 is formed with an n-type base layer 23 making up a semiconductor layer of first conductivity type. The surface of the n-type base layer 23 is formed selectively by diffusion with two p-type base layers 24 making up semiconductor layers of second conductivity type. The surface of each p-type base layer 24 is selectively formed with an n-type source layer 25 constituting an emitter layer of first conductivity type.

A second gate electrode 27 is formed on the n-type source layers 25 and the p-type base layers 24 held between each n-type base layer through a gate insulating film 26. Also, a source electrode 28 is formed on each p-type base layer 24 and the n-type source layer 25.

The second gate electrode 27 is connected to the first gate electrodes 17 through a gate resistor RC and a variable power supply VC. Also, the source electrodes 28 are connected to the first gate electrodes 17.

The semiconductor device configured as described above is protected from an overvoltage in the manner described below.

When a negative voltage is applied to a terminal of the gate resistor Rg by the gate drive circuit in order to turn off the IGBT, the gate voltage of each first gate electrode 17 (hereinafter referred to as the first gate voltage) begins to fall. With the fall of the first gate voltage, the main voltage between the source and drain of the IGBT begins to rise, and the first gate voltage assumes a substantially constant value due to Miller effect.

In the meantime, the second gate electrode 27 is supplied with a negative voltage from the variable power supply VC. As a result, a p-type channel layer is formed on the surface of the n-type base layer 23 held between the p-type base layers 24. This p-type channel layer shields the electric field due to the main voltage of the IGBT, and therefore the potential of the second gate electrode 27 remains unchanged. The electric field detector 20a thus is maintained in a non-conductive state.

Then, the main voltage of the IGBT increases to a predetermined level and the internal electric field of the IGBT reaches a predetermined electric field intensity. The internal electric field of the electric field detector 20a thus increases and the p-type channel layer disappears, while a capacitance is generated between the drain and gate of the electric field detector 20a. More specifically, in the electric field detector 20a, the increased electric field extends the depletion layer thus far existent in the n-type base layer 23, which extinguishes the p-type channel layer and reaches the gate insulating film. The drain and gate are thus connected through the capacitance of the gate insulating film and the depletion layer. As a consequence, the gate voltage of the second gate electrode 27 (hereinafter referred to as the second gate voltage) rapidly increases, so that the polarities of the second gate voltage and the voltage of the source electrodes 28 are reversed. In other words, the second gate voltage assumes a positive voltage, and the source electrodes 28 are supplied with a negative voltage. The surface of the p-type base layers 24 held between the n-type source layers 25 and the n-type base layer 23 is formed with an n-type channel layer. An electron current thus flows into the n-type base layer 23 and turns on the MOSFET structure of the electric field detector 20a into a conductive state.

As a result, a current flows from the drain electrode 12 of the IGBT to the first gate electrodes 17 of the IGBT through the electric field detector 20a. With the voltage drop across the gate resistor Rg, the first gate voltage increases. Consequently, the IGBT is turned on incompletely and the IGBT resistance drops, thereby protecting the IGBT from an overvoltage.

The main voltage of the IGBT at which the electric field detector 20a becomes conductive, i.e., the clamp voltage, changes with the charge stored per unit area of the p-type channel layer. This stored charge can be changed according to the variable power supply VC.

In the case where Si is used for the semiconductor, and $SiO_2$ is used for the gate insulating film 26, the stored charge Q is given by equation (1) below.

$$Q = (\epsilon_{OX} \cdot VC)/t_{OX} \quad (1)$$

where $\epsilon_{OX}$ is the dielectric constant of $SiO_2$, VC is a negative voltage of the variable power supply VC, and $t_{OX}$ is the thickness of the gate insulating film 26.

The clamp voltage, on the o ther hand, can be expressed by equation (2) below.

$$V_{clamp} = Q^2/(2qN \cdot \epsilon_{si}) \quad (2)$$

where q is a unit charge, N is an impurities concentration of the n-type base layer 23 and $\epsilon_{si}$ is the dielectric constant of Si.

From equations (1) and (2), $$V_{clamp} = (\epsilon_{OX}^2 \cdot VC^2)/(2qN \cdot \epsilon_{si} \cdot t_{OX}^2) \quad (3)$$

As seen, with the increase in VC, the clamp voltage is increased, while by increasing the thickness $t_{OX}$, the clamp voltage is decreased.

If the voltage applied to the second gate electrode 27 is excessively high, the electric field detector 20a breaks down. The value VC, therefore, has a preferable range on its own right. This range can be expressed by equation (4) below.

$$VC \leq (2.5 \times 10^5 \cdot \epsilon_{si} \cdot t_{OX})/\epsilon_{OX} \quad (4)$$

The maximum VC value is about 7.5 V when the thickness of the insulating film 26 is assumed to be about 100 nm. The insulating film 26, which may have a thickness in the range of 10 nm to 100 nm equivalent to a normal gate oxide film, can be used with a larger thickness.

In this way, the clamp voltage can be made variable by changing the VC. This is impossible with the conventional device using a zener diode.

The gate resistance RC is set to 10 kΩ to 1 MΩ per square centimeter of the element area of the electric field detector 20a.

Figure 7:
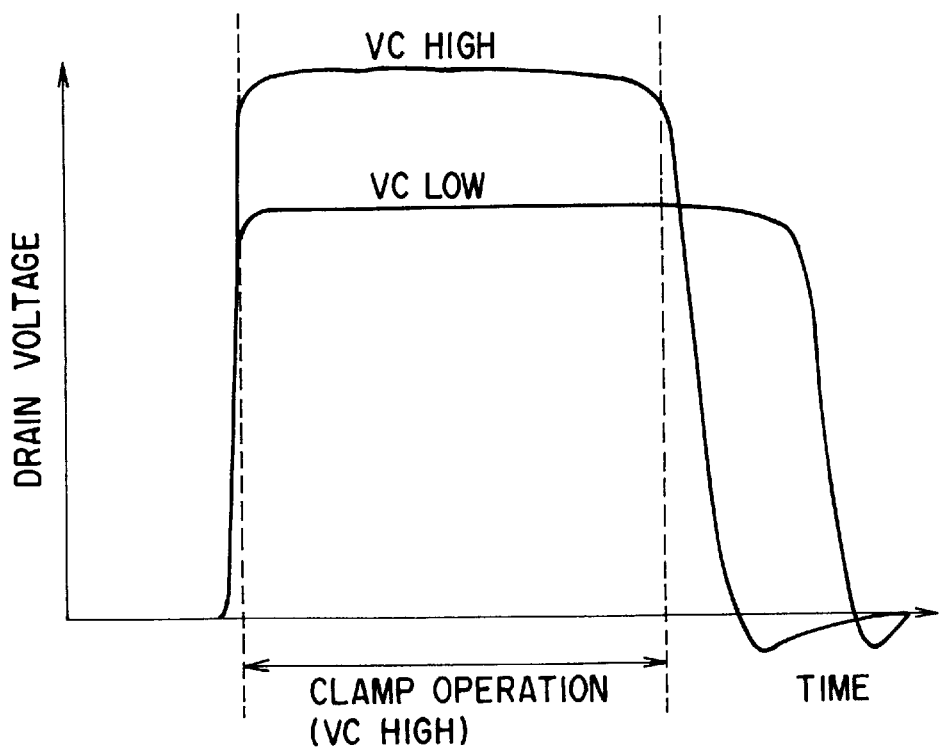
FIG. 7 is a waveform diagram of a clamp voltage according to the same embodiment.

Next, a waveform of the clamp voltage is shown in FIG. 7. In FIG. 7, the abscissa represents time and the ordinate the drain voltage (main voltage).

As seen from FIG. 7, a high VC increases the clamp voltage, and vice versa. The two curves in FIG. 7 represent the case where the inductance is constant.

An actual measurement of the clamp voltage is shown in FIG. 8. In FIG. 8, the abscissa represents time with a unit scale of 500 ns. The ordinate, on the other hand, represents the drain voltage V, the current I and the first gate voltage Vg of the IGBT. The drain voltage V is scaled with 200 V as a unit, and the current I is 2A in unit scale. The first gate voltage Vg has a unit scale of 10 V.

As seen from FIG. 8, the signal is clamped at 800 V, at which a waveform substantially free of noises is produced.

In comparison, a measurement using a zener diode is shown in FIG. 9. T he abscissa and the ordinate represent the same factors respectively as in FIG. 8.

As understood from FIG. 9, although the signal is clamped, the waveform carries a large noise.

As described above, according to this embodiment, the electric field detector 20a begins to conduct in accordance with the high electric field, and the current from the drain electrode 12 is fed back to the first gate electrodes 17. The main switching element is thus made conductive incompletely. As a result, the resistance of the main switching element is reduced thereby to suppress the main voltage at a level below the clamp voltage. In this process, the avalanche of the zener diode causing a noise and the self-clamping function of the IGBT are not used. Protection which is stable and gives rise to few noises is thus made possible.

In addition, the clamp voltage $V_{clamp}$ can also be made variable in accordance with the negative voltage VC of the variable power supply in the protection circuit.

(Second embodiment)

Figure 10:
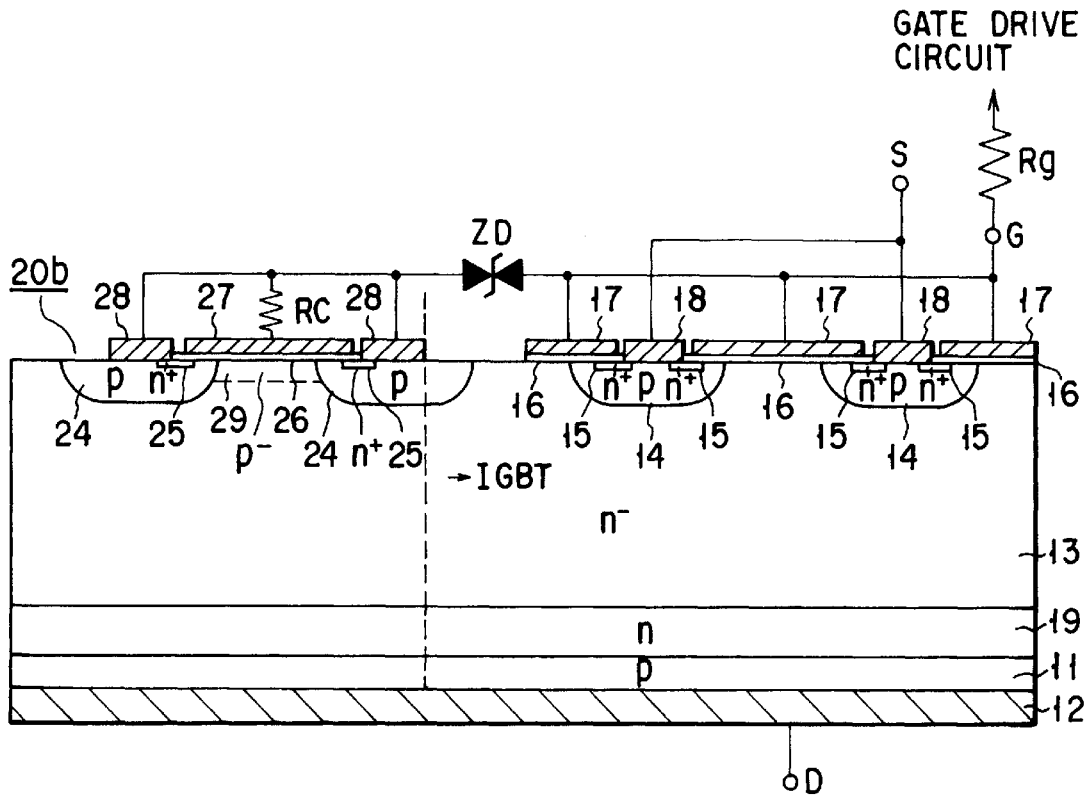
FIG. 10 is a sectional view schematically showing a configuration of a semiconductor device according to a second embodiment of the invention.

FIG. 10 is a sectional view schematically showing a configuration of a semiconductor device according to a second embodiment of the invention. In FIG. 10, the component parts similar to those in FIG. 5 are designated by the same reference numerals, respectively, as in FIG. 5 and will not be described in detail any further.

The semiconductor device according to this embodiment is different from the semiconductor device of the first embodiment in four points. First, an electric field detector 20b is formed on the same substrate as the IGBT. Secondly, a high-resistance p-type shield layer 29 is formed in advance on the surface of an n-type base layer 23 held between p-type base layers 24, and the electric field is shielded by this p-type shield layer 29. Thirdly, the variable power supply VC is omitted. Fourthly, a zener diode ZD has replaced the diode Di, and the series arrangement of the zener diode ZD and the electric field detector 20b is reversed.

These four modifications may be embodied independently of each other or in any arbitrary combinations. Also, the zener diode ZD is provided complementarily for gate protection and may be eliminated without adversely affecting the circuit operation.

In the above-mentioned configuration, the p-type shield layer 29 has the same function as the p-type channel layer of the semiconductor device according to the first embodiment, thereby making possible overvoltage protection. The electric field detector 20b becomes conductive when the p-type shield layer 29 is completely depleted.

The impurities concentration of the p-type shield layer 29 is substantially the same as that of the resurf layer.

The reason that the variable power supply VC can be eliminated will be described below.

Suppose that the p-type shield layer 29 is provided together with the variable power supply VC. Equation (1) is replaced by equation (5).

$$Q=\{(\epsilon_{OX}\cdot VC)/t_{OX}\}+(q\cdot Dp) \qquad (5)$$

where Dp is the total amount of impurities per unit area of the p-type shield layer 29.

Omitting the variable power supply VC, the first term of the right side in equation (5) is zero. In other words, the clamp voltage changes with Dp. As a result, the variable power supply VC can be omitted by changing the impurities concentration of the p-type shield layer 29 in accordance with the desired clamp voltage.

In this case, although the clamp voltage is fixed, the clamp voltage required by the IGBT is substantially constant and therefore no serious problem is posed. Also, according to this embodiment, the circuit configuration is simplified more than in the first embodiment having the variable power supply VC. Further, this embodiment generates fewer noises like the first embodiment.

The second gate electrode 27 may be supplied with a positive voltage with respect to the source electrodes 28 lower than the threshold level. Consequently, the time is shortened before the n-type channel layer is formed, so that the speed of driving the first gate electrode 27 and detecting an over-voltage can be desirably improved.

In the case where the electric field detector is formed on the same substrate as a bipolar element like the IGBT, the electric field detector is preferably formed at a distance from the bipolar element by at least 1/20 of the thickness of the n-type base layer 13 in order to prevent the influence of the plasma (stored carriers) in the n-type base layer 13.

The portion of the p-type drain layer 11 under the electric field detector 20b can also be eliminated.

As described above, according to the second embodiment, the p-type shield layer 29 functions the same way as the p-type channel layer of the semi-conductor layer according to the first embodiment, and therefore the same effect as the first embodiment can be achieved.

Also, in view of the fact that the electric field detector 20b is formed on the same substrate as the IGBT, the chip has its own protective function.

Furthermore, the circuit configuration is simplified by the elimination of the variable power supply VC.

(Third embodiment)

Figure 11:
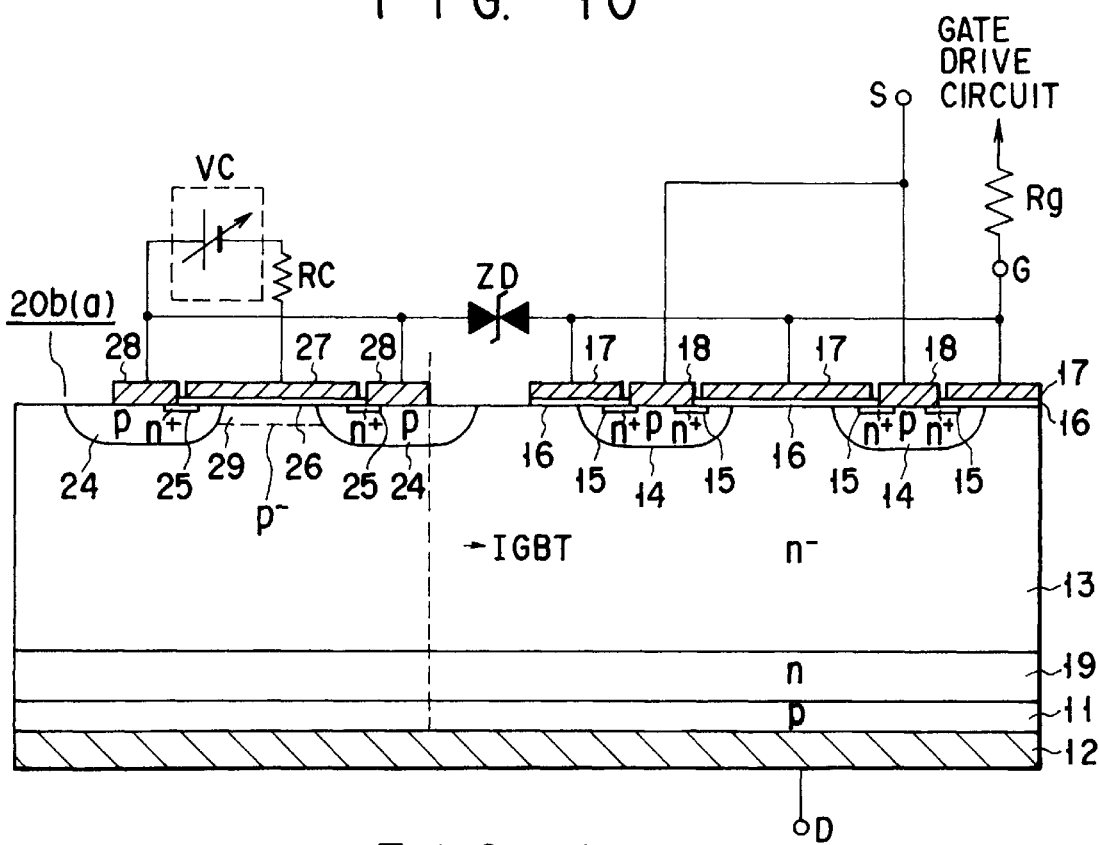
FIG. 11 is a sectional view schematically showing a configuration of a semiconductor device according to a third embodiment of the invention.

FIG. 11 is a sectional view schematically showing a configuration of a semiconductor device according to a third embodiment of the invention.

This semiconductor device is a modification of the second embodiment, and is different from the semi-conductor of the second embodiment in that this embodiment further comprises a variable power supply VC for supplying a positive voltage to the source electrode 28 and a negative voltage to the gate electrode 17.

In this configuration, the stored charge Q is expressed by equation (5). Unlike in the second embodiment, therefore, the clamp voltage can be made variable.

Since the variable power supply VC is inserted, the p-type shield layer 29 can be omitted.

(Fourth embodiment)

FIG. 12 is a sectional view schematically showing a configuration of a semiconductor device according to a fourth embodiment of the invention.

This semiconductor device is a modification of the second embodiment, and unlike the semiconductor device of the second embodiment, is such that the p-type shield layer 29a of the electric field detector 20c doubles as a p-type resurf layer at the end of the IGBT. As a result, only one p-type base layer 24 is formed and the second gate electrode 27a doubles as a field plate at the end portion.

Reference numeral 30 designates an n-type depletion layer stopper layer.

In this configuration, in addition to the effects of the second embodiment, the function of protecting the main switching element can be realized without reducing the effective area of the main switching element for the same chip size.

(Fifth embodiment)

FIG. 13 is a sectional view schematically showing a configuration of a semiconductor device according to a fifth embodiment of the invention.

This semiconductor device is a modification of the fourth embodiment, and unlike the semiconductor of the fourth embodiment, is so constructed that the p-type base layer 24 and the p-type shield layer 29a are separated from each other.

In this configuration, the electric field detector 20c has the MOSFET structure. Even when the p-type shield layer 29a is not completely depleted, therefore, the main switching element can be protected from an overvoltage while suppressing noises at the same time.

As shown by dotted line in FIG. 13, the p-type base layer 24 and the p-type shield layer 29a may be partially connected with each other.

As shown by a one-dot chain in FIG. 13, a deep p-type layer 31 is preferably formed in such a position as to cover the p-type shield layer 29a in order to provide a withstand voltage.

Figure 14:
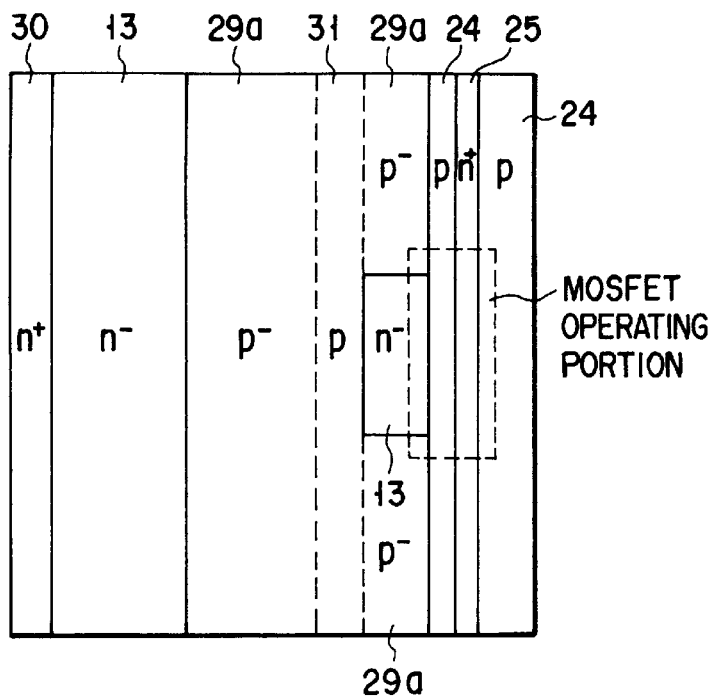
FIG. 14 is a plan view schematically showing a configuration of a modification of the same embodiment.

A plan view of FIG. 14 shows the case in which the p-type base layer 24 is partially connected with the p-type shield layer 29a. In FIG. 14, the portion defined by dotted line where the p-type base layer 24 is separated from the p-type shield layer 29a operates as a MOSFET.

In the above-mentioned embodiments, a case was explained in which an electric field detector is used as an overvoltage protection means. Now, explanation will be made about the case of using an electric field detector for preventing the dv/dt breakdown.

(Sixth embodiment)

Figure 15:
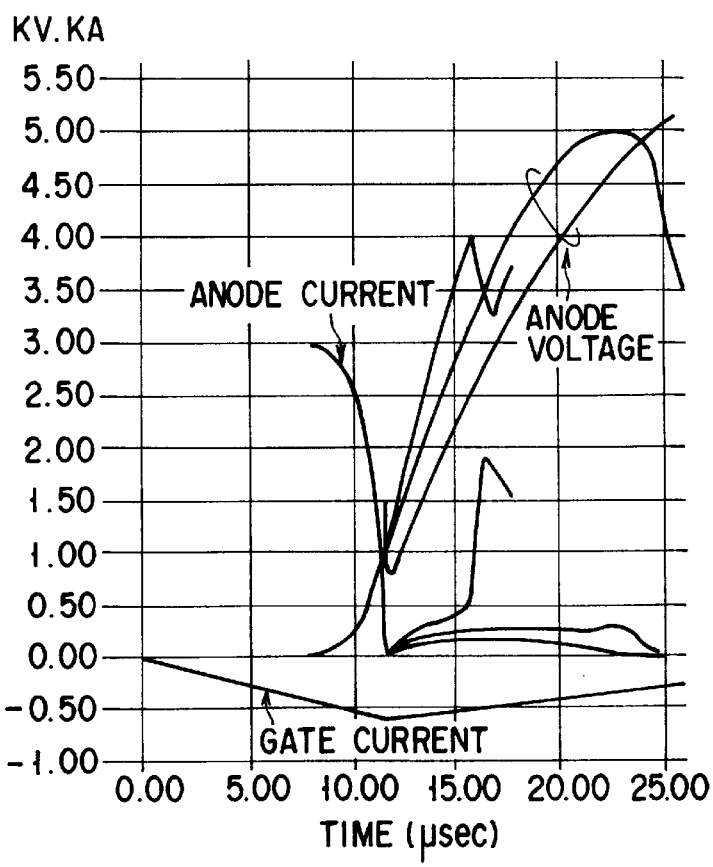
FIG. 15 is a diagram for explaining a common dv/dt breakdown.

Before explaining this embodiment, the manner in which the dv/dt breakdown occurs in the main switching element will be explained with reference to FIG. 15. FIG. 15 represents the case where the main switching element is a GTO and indicates that with the increase in dt/dv, the main switching element is broken.

Figure 16:
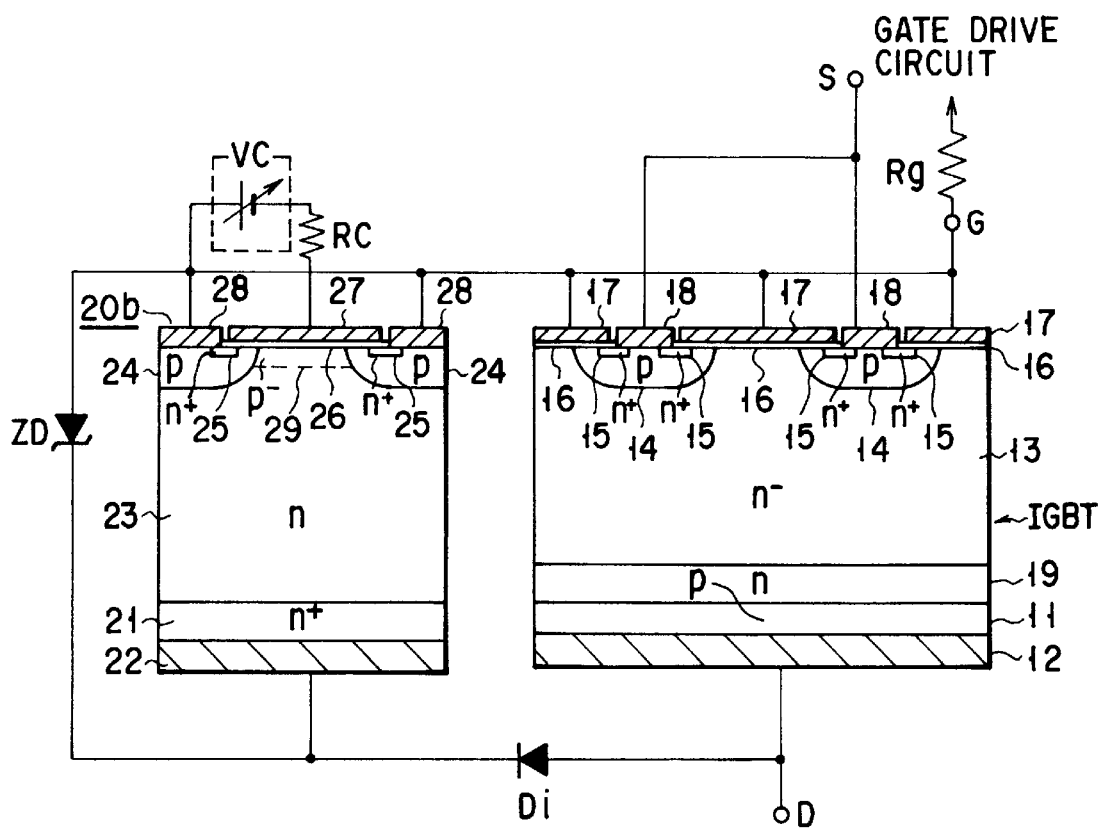
FIG. 16 is a sectional view schematically showing a configuration of a semiconductor device according to a sixth embodiment of the invention.

Now, FIG. 16 is a sectional view showing schematically a semiconductor device according to a sixth embodiment of the invention.

This semiconductor device is different from that of the first embodiment in two points. The first difference lies in that a p-type shield layer 29 is formed. A second difference resides in that a zener diode ZD is inserted in parallel with the electric field detector 20b.

In this configuration, the zener diode ZD is used for overvoltage protection, and the electric field detector 20b is used for dv/dt suppression.

In the case where the electric field detector 20b is used not for overvoltage protection but for dv/dt suppression, the gate resistor RC is preferably in the range of several ohms to several kilo-ohms per element area of 1 cm 2 of the electric field detector 20b.

Figure 17:
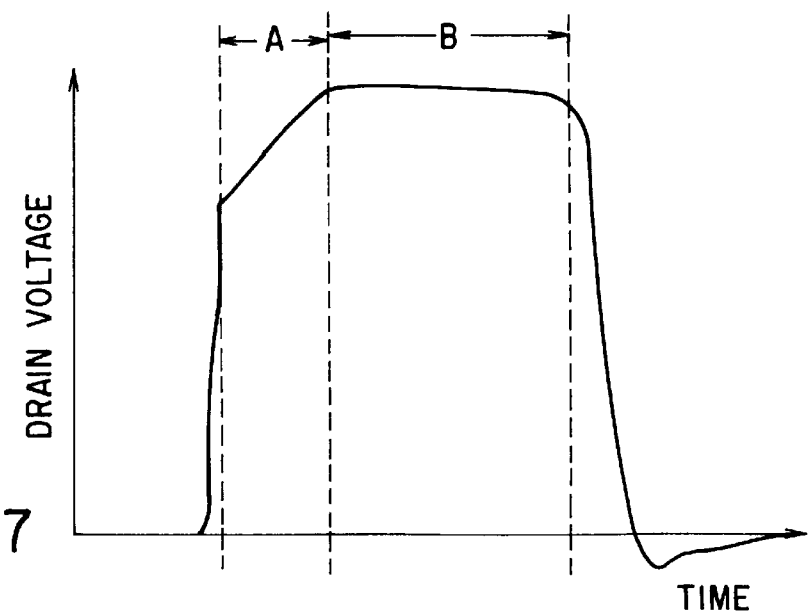
FIG. 17 is a waveform diagram showing a clamp voltage according to the same embodiment.

A waveform of the clamp voltage is shown in FIG. 17. In FIG. 17, the abscissa represents time and the ordinate the drain voltage.

The portion A in FIG. 17 is where the dv/dt is suppressed by the electric field detector 20b, and the portion designated by B is where the overvoltage protection is effected by the zener diode ZD. More specifically, the bent point of transfer to the portion A after the increase of the drain voltage indicates the start of suppression by the electric field detector 20b. The bent point from portion A to portion B, on the other hand, represents the start of overvoltage protection by the zener diode.

Since the dv/dt is suppressed by the electric field detector 20b, noises are reduced in spite of the use of the zener diode ZD for overvoltage protection as in the prior art.

Of course, two electric field detectors may be used to replace the zener diode with an electric field detector for overvoltage protection.

In the case where dv/dt is suppressed by the electric field detector 20b, the voltage increase rate dv/dt is suppressed by a gate resistance RC. The voltage at which the voltage increase rate dv/dt begins to be suppressed is controlled by the negative voltage VC of the variable power supply. This operation will be explained with reference to FIGS. 18A and 18B.

Figure 18A:
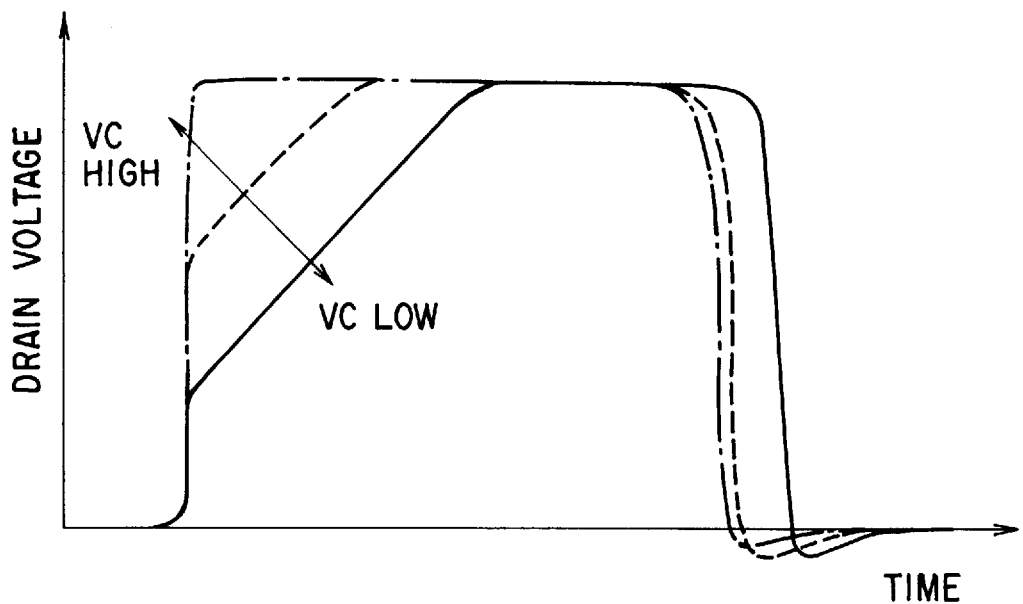
FIG. 18A is a diagram for explaining the dv/dt suppression according to the same embodiment.

First, assume that the voltage increase rate dv/dt is constant with a constant gate resistor RC. As shown in FIG. 18A, with the increase in the negative voltage VC, the voltage at which control starts is increased.

Figure 18B:
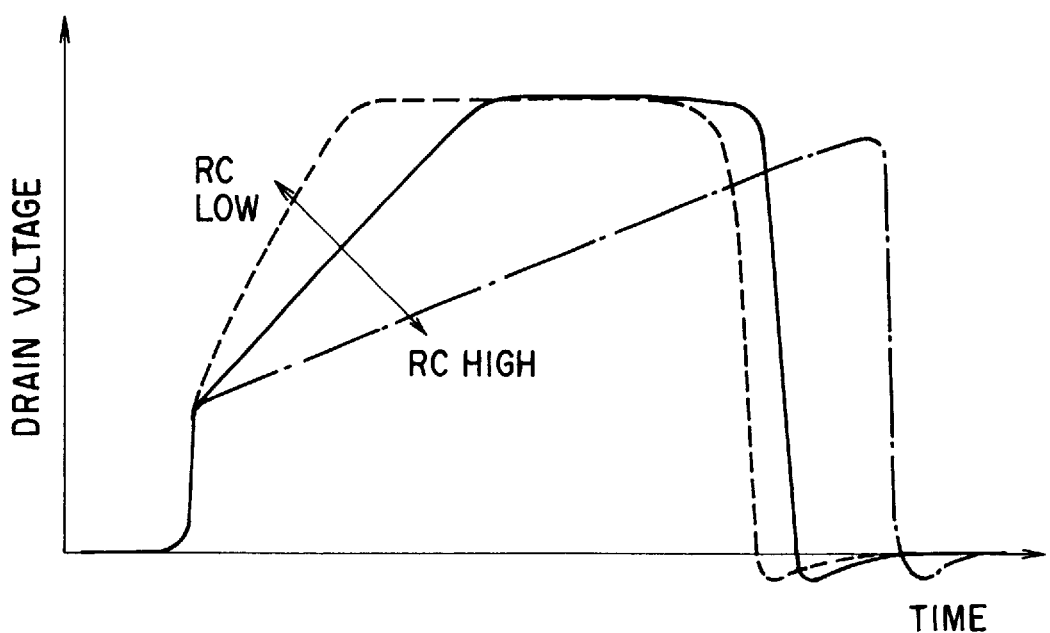
FIG. 18B is a diagram for explaining the dv/dt suppression according to the same embodiment.

Assume, then, that the voltage at which control starts is fixed with a fixed negative voltage VC. As shown in FIG. 18B, with the increase in the gate resistance RC, the voltage increase rate dv/dt is reduced. Within the range of the gate resistor RC, therefore, a higher gate resistor RC is more preferable for preventing the element breakdown due to dv/dt.

As described above, this embodiment, in addition to the effects of the first embodiment, has the advantage that by changing the gate resistor RC and/or the negative voltage of the variable power supply, the semiconductor device can be protected in detail in accordance with the operating conditions and the current density of the device and external circuits.

Three embodiments described below use an electric field detector for voltage detection and other elements for driving the gate of the IGBT.

(Seventh embodiment)

FIG. 19 is a sectional view schematically showing a configuration of a semiconductor device according to a seventh embodiment of the invention.

This semiconductor device is different from the semiconductor device of the first embodiment in two points. First, the electric field detector 20d includes no n-type source layer but a p-type shield layer 29. Secondly, in addition to the electric field detector 20d, a MOSFET or a JFET of n-type channel is provided. In each of the following-described embodiments, the n-channel MOSFET is used and can be replaced with a JFET.

The n-channel MOSFET has the gate thereof connected to the second gate electrode 27, and the source thereof connected to the first gate electrode of the IGBT. Also, the n-channel MOSFET has the drain thereof connected to a +15 V power supply.

In this configuration, like in the preceding case, conduction begins as the electric field detector 20d detects a high electric field. The gate of the n-channel MOSFET is supplied with a positive voltage thereby to drive the n-channel MOSFET. The n-channel MOSFET becomes conductive and the source voltage is applied to the first gate electrode 17 of the IGBT, thereby turning on the IGBT incompletely.

As described above, according to this embodiment, the electric field is detected by the electric field detector 20d, and therefore the withstand voltage of the n-type MOSFET may be low. In addition to the effects of the first embodiment, therefore, this embodiment has the advantage that the overvoltage protection can be accomplished at high speed. As shown in FIG. 19, for example, the drain voltage may be as low as 15 V. Also, in the case of MOSFET as compared with JFET, a low threshold level of the gate suffices and therefore the operating speed is further improved.

(Eighth embodiment)

FIG. 20 is a sectional view schematically showing a configuration of a semiconductor device according to an eighth embodiment of the invention.

This semiconductor device is a modification of the seventh embodiment and is different from the semi-conductor device of the seventh embodiment in that this embodiment further comprises a bias power supply VB for applying a positive voltage lower than the threshold level to the gate of the n-channel MOSFET.

Since a predetermined positive voltage is applied to the gate of the n-channel MOSFET from the bias power supply VB in advance, the speed at which the first gate electrode is driven can be improved over the seventh embodiment.

(Ninth embodiment)

Figure 21:
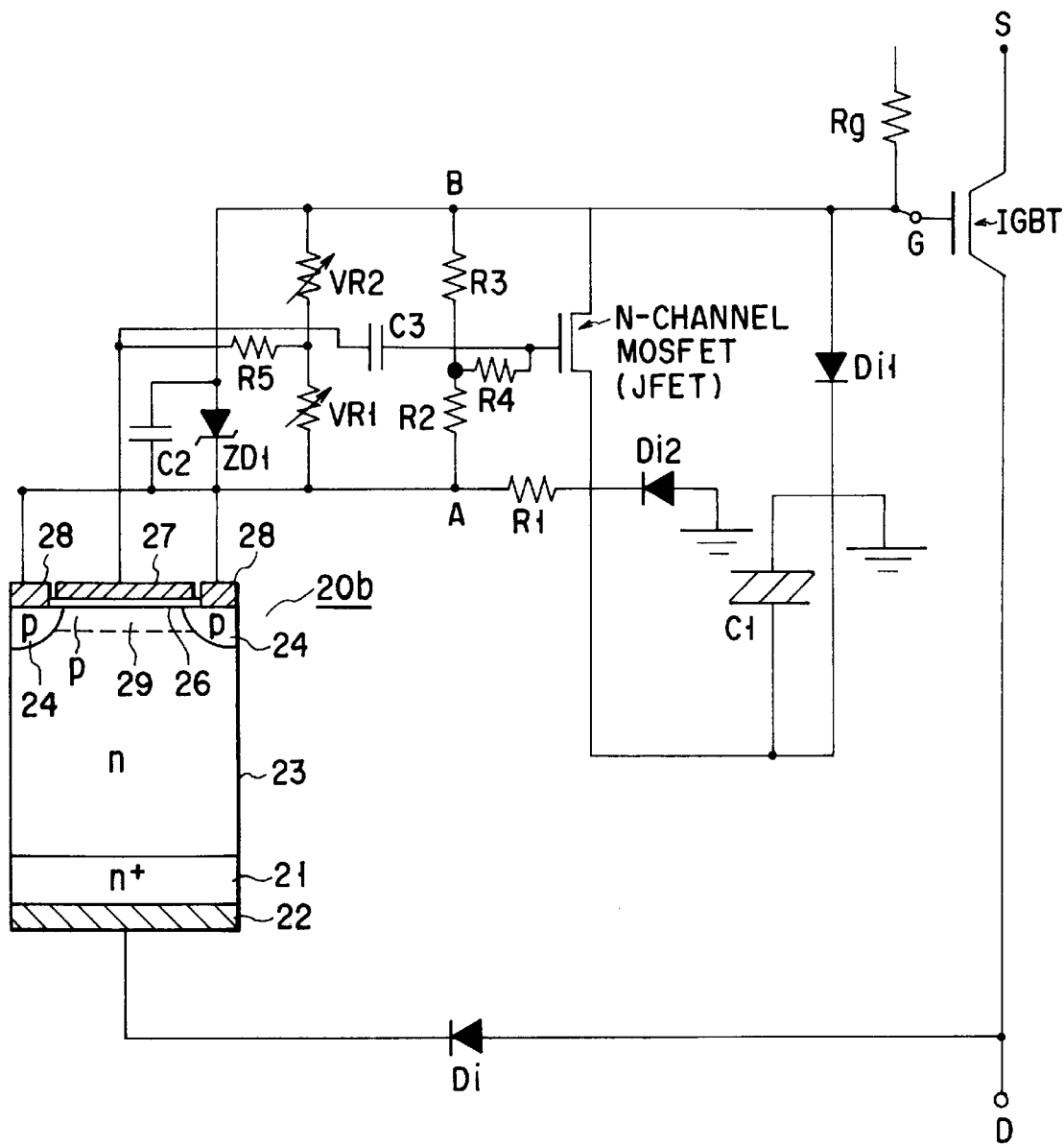
FIG. 21 is a sectional view schematically showing a configuration of a semiconductor device according to a ninth embodiment of the invention.

FIG. 21 is a sectional view schematically showing a configuration of a semiconductor device according to a ninth embodiment of the invention.

In this semiconductor device, a bias voltage for the n-channel MOSFET is derived from the gate drive circuit of the IGBT without providing a bias power supply unlike in the eighth embodiment.

A specific configuration is described below.

When the IGBT is in on state, the positive voltage applied to the first gate electrode is applied also to a capacitor C1 through Di1 connected to the gate electrode, thereby charging the capacitor C1. After being completely charged, the capacitor C1 can operate the same way as the bias power supply. With respect to the capacitor C1, the first gate electrode assumes a negative potential. This negative potential is determined by a zener diode ZD1 and a capacitor C2. Assume, for example, that the first gate electrode is positive. The current flow can be blocked by a diode Di2. Also, a resistor R1 is provided for flattening the current.

The capacitor C1 causes a potential difference between A and B in FIG. 21, the potential being higher at A. This potential difference is shared by two resistors R2 and R3, whereby a gate voltage of the n-channel MOSFET is supplied. The gate voltage is determined by a resistor R4 with a large resistance value.

In similar fashion, a second gate voltage is supplied by two variable resistors VR1 and VR2. The second gate voltage is determined by a resistor R5.

A capacitor C3 is for preventing the shorting between the n-channel MOSFET and the second gate electrode 27. This capacitor C3 causes only the change of the current to flow but not the DC component thereof to flow.

This configuration makes operation possible in the absence of the bias power supply and reduces the device size as compared with the eighth embodiment.

(10th embodiment)

Figure 22:
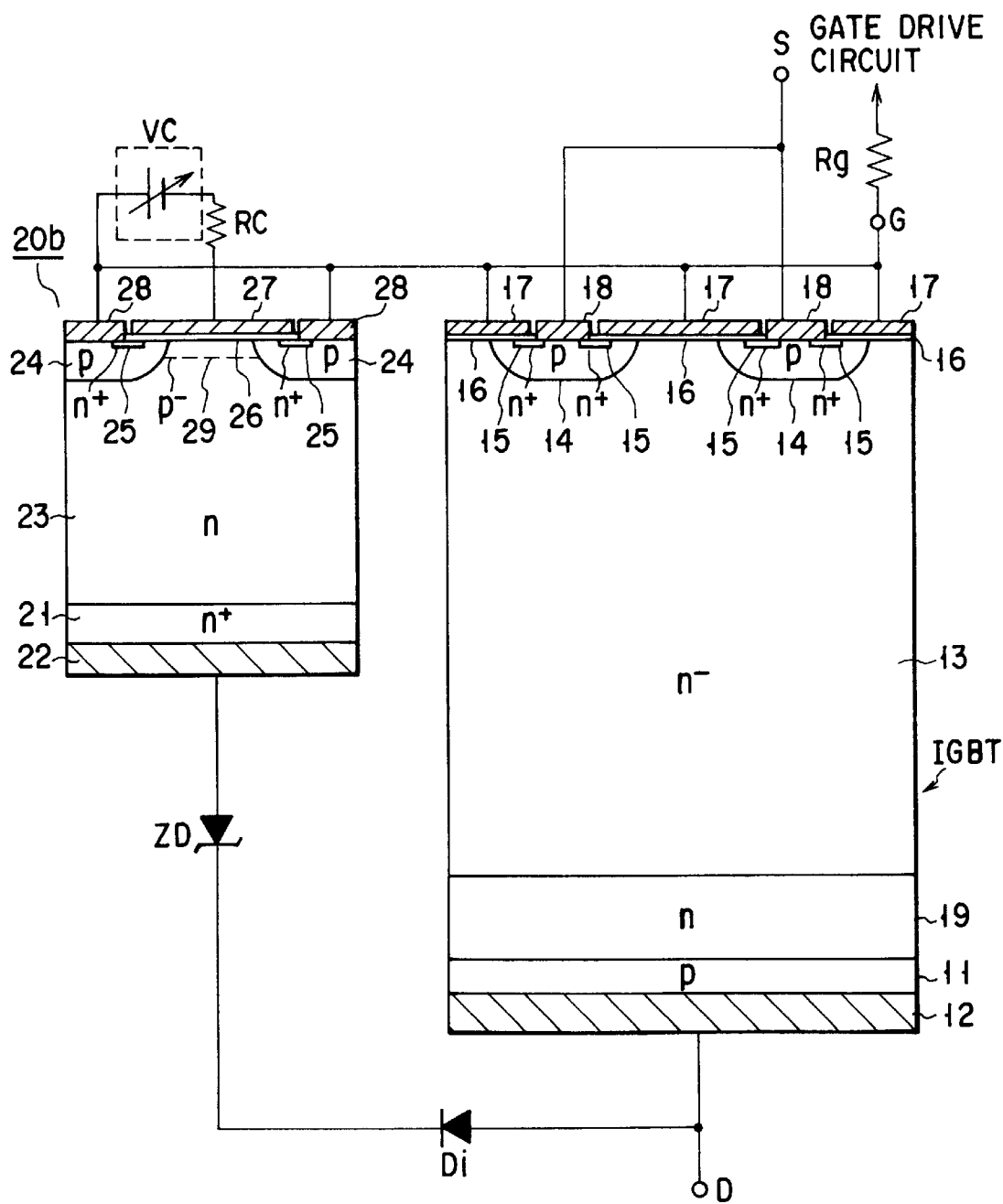
FIG. 22 is a sectional view schematically showing a configuration of a semiconductor device according to a tenth embodiment of the invention.

FIG. 22 is a sectional view schematically showing a configuration of a semiconductor device according to the tenth embodiment of the invention.

This semiconductor device is a modification of the sixth embodiment, and unlike the semiconductor device of the sixth embodiment, is so constructed that a zener diode ZD is arranged in series between an electric field detector 20b and a diode Di.

In the modified device the electric field detector 20b is used for overvoltage protection. Since the zener diode ZD is connected in series between the detector 20b and the diode Di, the zener diode ZD can share the voltage if the main switching element 4 has a high withstand voltage of about 4.5 kV and the detector 20b has a withstand voltage of less 4.5 kV.

The modified device not only achieves the same advantages as the sixth embodiment, but also effectively protects the main switching element even if the withstand voltage of the electric field detector is lower than that of the main switching element.

(11th embodiment)

Figure 23:
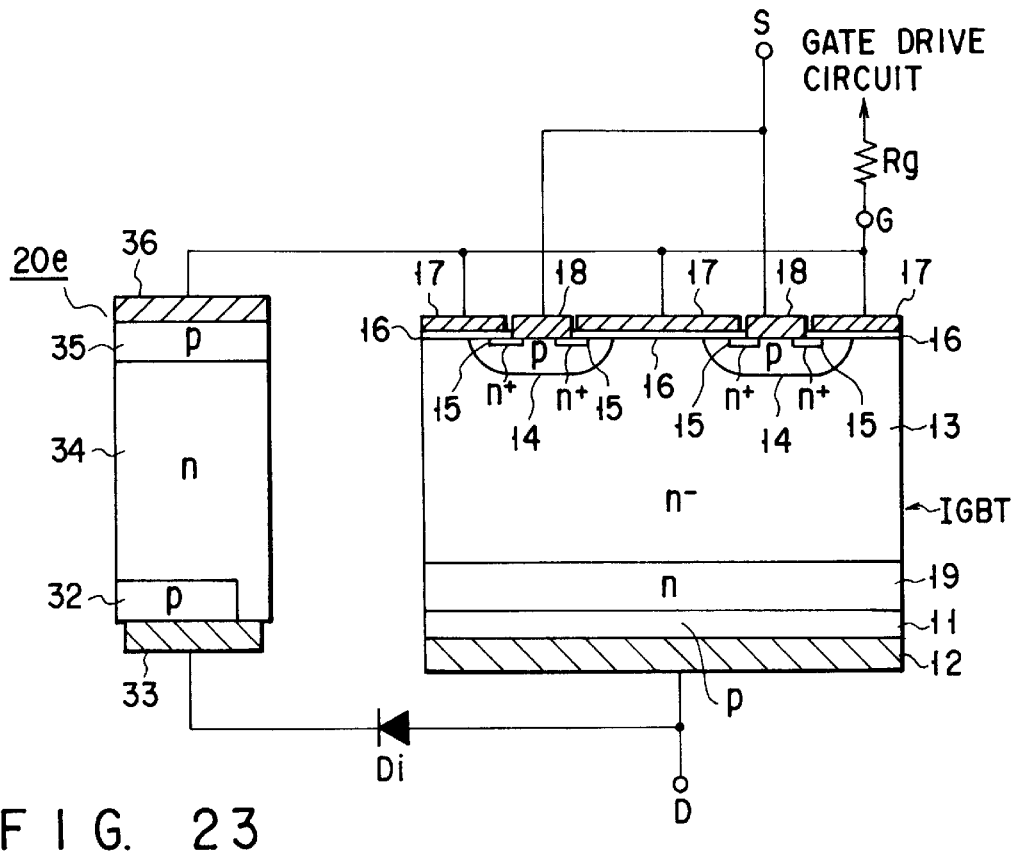
FIG. 23 is a sectional view schematically showing a configuration of a semiconductor device according to an 11th embodiment of the invention.

FIG. 23 is a sectional view schematically showing a configuration of a semiconductor device according to an 11th embodiment of the invention.

This semiconductor device, different from the first to 10th embodiments described above, uses the punch-through phenomenon for overvoltage protection. Specifically, the embodiment includes a p-type layer 32 formed on the drain electrode 12 side of the IGBT and an electrode 33 in contact with both this p-type layer 32 and an n-type layer 34 providing an intermediate layer. Also, a p-type layer 35 is arranged on the surface of the n-type layer 34 opposite to the p-type layer 32. The p-type layer 35 has an electrode 36 which is connected to the first gate electrodes 17. An electric field detector 20e is thus configured.

Now, the operation of protecting against an overvoltage will be explained.

The intermediate n-type layer 34 is designed to be completely depleted by a clamp voltage. When a clamp voltage is attained, therefore, the n-type layer 34 is depleted and the p-type layers 32, 35 punch through. This punch-through causes a current to flow in the electric field detector 20e, increases the first gate voltage of the first gate electrode, turns on the IGBT incompletely, and thus protects the IGBT from overvoltage.

Also with this configuration, like in the other embodiments, the main switching element can be protected from an overvoltage while suppressing noises.

(12th embodiment)

Figure 24:
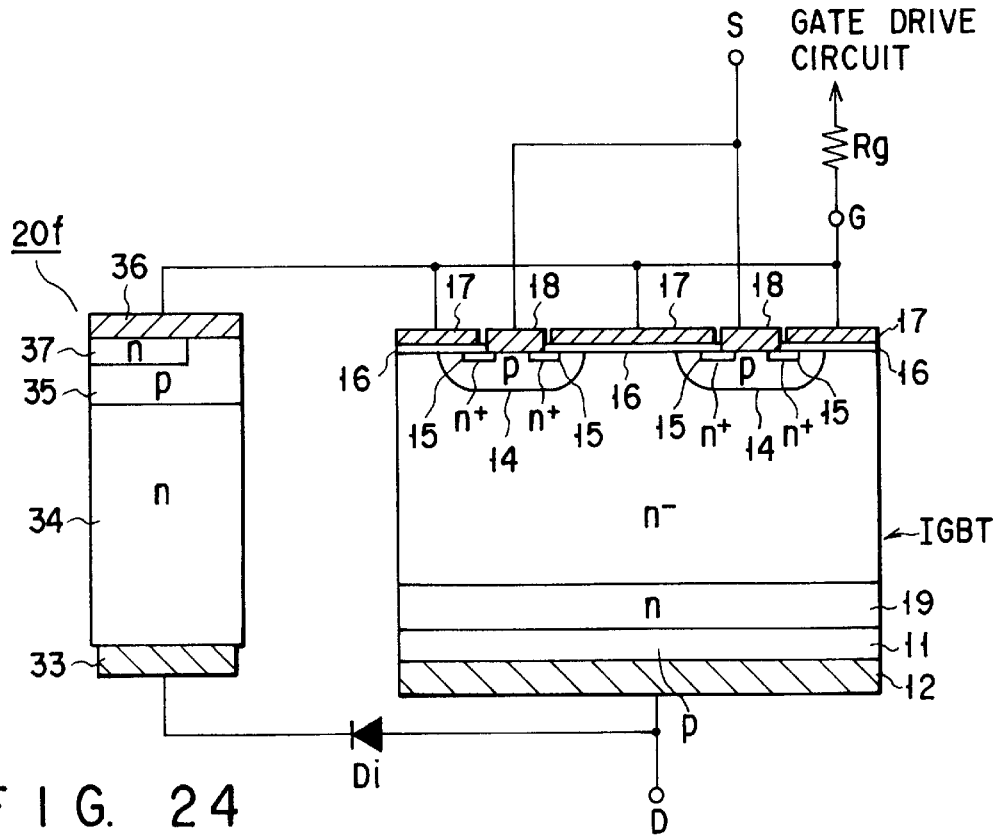
FIG. 24 is a sectional view schematically showing a configuration of a semiconductor device according to a 12th embodiment of the invention.

FIG. 24 is a sectional view schematically showing a configuration of a semiconductor device according to a 12th embodiment of the invention.

This semiconductor device, which is a modification of the 11th embodiment and is different from the semiconductor device of the 11th embodiment, comprises an n-type layer 37 in contact with the electrode 36 in the p-type layer 35 in place of the p-type layer 32, and also has the p-type layer 35 as an intermediate layer.

This configuration also can produce effects similar to those of the 11th embodiment.

(13th embodiment)

Figures 25, 26:
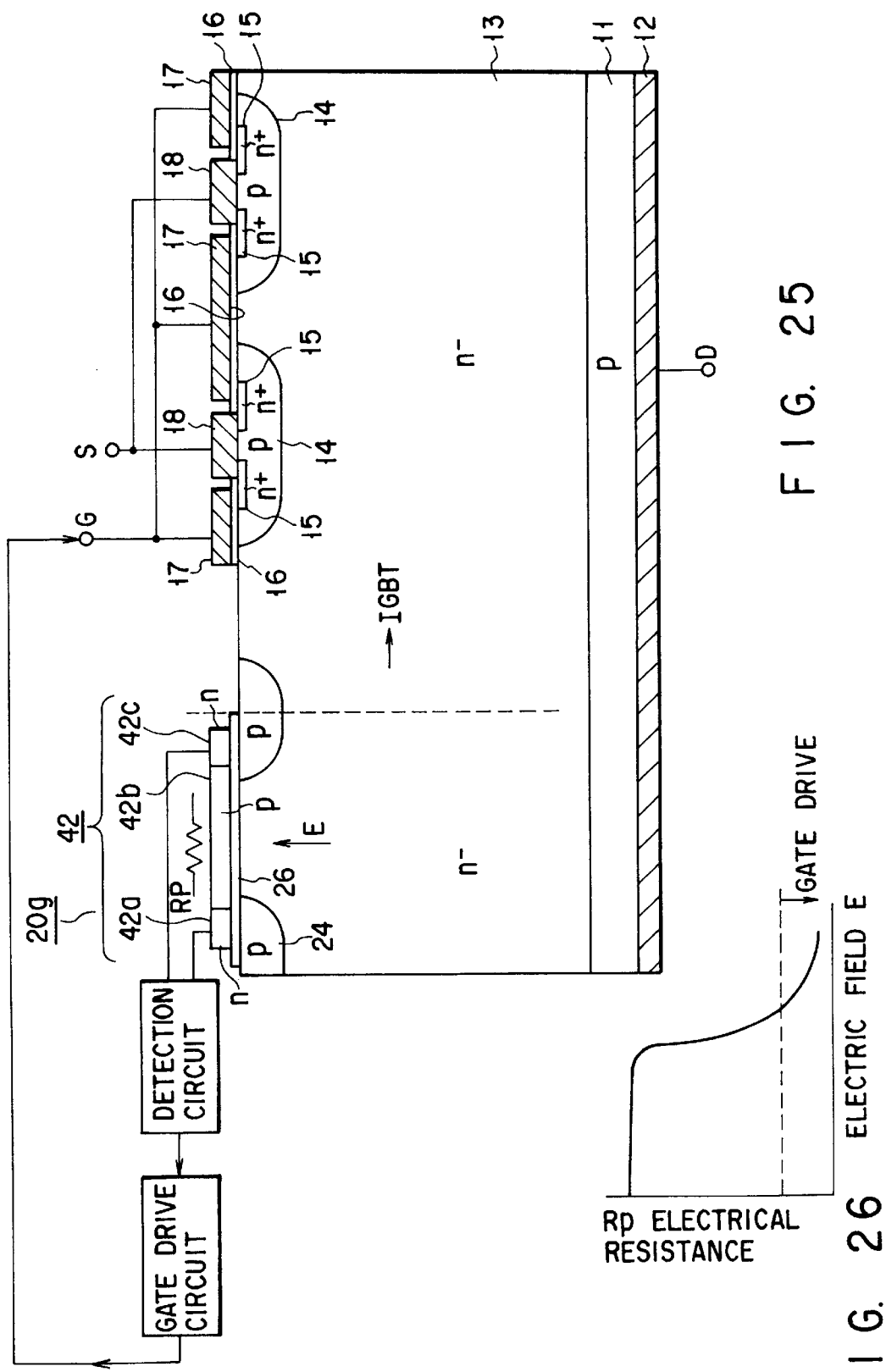
FIG. 25 is a sectional view schematically showing a configuration of a semiconductor device according to a 13th embodiment of the invention.
FIG. 26 is a diagram showing the relation between the electric field and the electrical resistance of the semiconductor device according to the same embodiment.

FIG. 25 is a sectional view schematically showing a configuration of a semiconductor device according to a 13th embodiment of the invention.

In this semiconductor device, the second gate electrode 27 of the first to tenth embodiments is replaced by a semiconductor device equivalent to the gate electrode 27 formed on an n-type base layer 13 through an insulating film 26.

Specifically, an n-p-n structure 42 including a n-type layer 42a, a p-type layer 42b and a n-type layer 42c is formed laterally on a n-type base layer 13 constituting the same substrate as the IGBT through an insulating film 26 to provide an electric field detector 20g. Of all the components of this n-p-n structure 42, the n-type layers 42a, 42c at the ends thereof are connected to a detection circuit which in turn is connected to a gate drive circuit.

The n-p-n structure 42 has such a characteristic that the electrical resistance Rp of the interface of the central p-type layer 42b with the insulating film 26 decreases in correspondence with the electric field E in the n-type base layer 13. The reduction of the electrical resistance Rp of the p-type layer 42b is detected by the detection circuit through the n-type layers 42a, 42c.

The detection circuit detects the drop of the electrical resistance Rp of the n-p-n structure 42 from the n-type layers 42a, 42c, and when the drop of the electrical resistance Rp exceeds a predetermined threshold level, sends a drive signal to the gate drive circuit.

This manner is shown in FIG. 26 with the abscissa representing the electric field E and the ordinate the electrical resistance Rp.

The gate drive circuit, upon receipt of a drive signal from the detection circuit, applies an on-voltage to the first gate electrodes 17.

As a result, the IGBT turns on and the electric field E in the n-type base layer 13 is reduced.

More specifically, in the case where a high voltage beyond an allowable value is applied when the IGBT is in off state or in the process of turning on or off, the generation of an electric field E in the n-type base layer 13 reduces the electrical resistance Rp of the n-p-n structure 42 according to the magnitude of the electric field E. When the drop of the electric resistance Rp exceeds a threshold, the on-voltage is applied to the first gate electrodes 17 thereby to turn on the IGBT. The electric field E of the n-type base layer 13 thus is reduced, thereby preventing the breakdown of the IGBT.

A more specific explanation will be made with reference to FIGS. 27 and 28.

Figure 27:
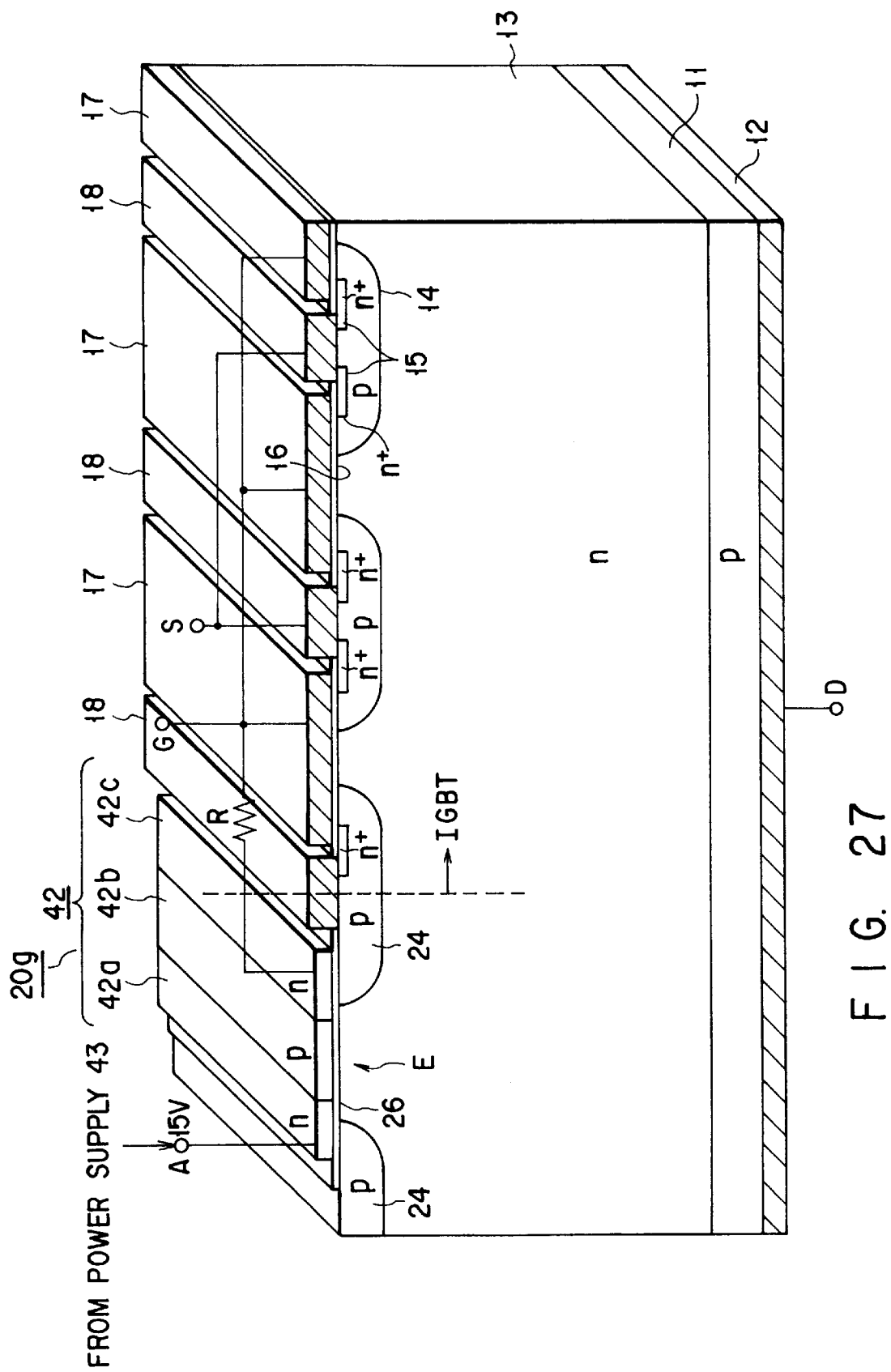
FIG. 27 is a perspective sectional view schematically showing a configuration of a semi-conductor device according to the same embodiment of the invention.

FIG. 27 is a perspective sectional view schematically showing a configuration of the semiconductor device mentioned above, and FIG. 28 a diagram showing an equivalent circuit of the semiconductor device.

An n-p-n structure 42 including a n-type layer 42a, a p-type layer 42b and n-type layer 42c made of polycrystal Si is formed laterally on the n-type base layer 13 of the same substrate as the IGBT through an insulating film 26. In the n-p-n structure 42, the n-type layer 42a is connected to a power supply 43, and the other n-type layer 42c is connected to a first gate electrode 17 through a resistor R.

The n-p-n structure 42 is such that as shown in FIG. 28, a MOSFET is formed with the n-type base layer 13 equivalent to the gate electrode. The p-type layer 42b of the n-p-n structure 42 may be shorted with one of the n-type layers 42a, 42c in potential or may be floating in potential.

Now, assume that the IGBT is in off state, and a positive voltage exceeding an allowable value is applied to the drain electrode 12 from an external circuit (not shown) and a negative voltage is applied to the source electrodes 18.

The high voltage of the drain electrode 12 is applied as a high electric field E exceeding the allowable value to the n-type base layer 13. This high electric field E acts on the n-p-n structure 42 and generates a n-type channel layer in the interface with the insulating film 26 of the p-type layer 42b. This channel shorts the n-type layers 42a and 42c at the ends of the n-p-n structure 42.

As a result, the power supply 43 is connected to the first gate electrodes 17 through the n-p-n structure 42 and the resistor R and applies a positive voltage to the gate electrodes 17.

Consequently, the IGBT is turned on and the high electric field E in the n-type base layer 13 is reduced. The breakdown of the IGBT thus can be prevented.

This operation will be explained with reference to the equivalent circuit shown in FIG. 28. When the positive voltage applied to the drain electrode 12 of the IGBT turns on the MOSFET of the n-p-n structure 42, the voltage of the power supply 43 is applied to the first gate electrodes 17. The IGBT is thus turned on thereby to prevent the breakdown of the IGBT.

As described above, this embodiment makes overvoltage protection possible the same way as if the second gate electrode is provided. The n-p-n structure 42 and the IGBT are not necessarily adjacent to each other.

(14th embodiment)

Figure 30:
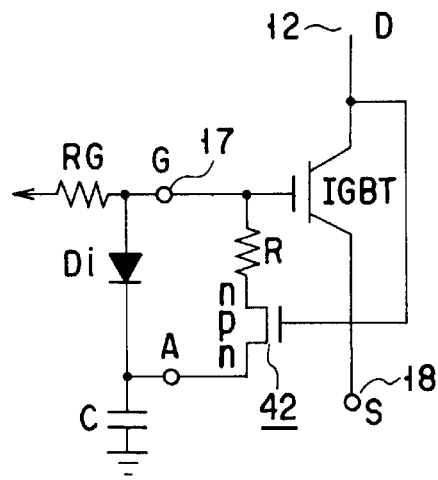
FIG. 30 is a diagram showing an equivalent circuit of a semiconductor device according to the same embodiment.

FIG. 29 is a sectional view schematically showing a configuration of a semiconductor device according to a 14th embodiment of the invention. FIG. 30 is a diagram showing an equivalent circuit of the semiconductor device.

This semiconductor device is a modification of the 13th embodiment, and lacks the power supply 43 for simplifying the peripheral configuration. The power supply 43 is replaced by a capacitor C, which is connected to the first gate electrode 17 of the IGBT trough a diode Di. The anode of the diode Di is connected to the first gate electrode 17 and the cathode thereof is connected to the capacitor C.

When the IGBT is in on state, the positive voltage applied to the first gate electrode 17 is also applied to the capacitor C through the diode Di thereby to charge the capacitor C. After being completely charged, the capacitor C becomes operable like the power supply 43.

More specifically, in the case where the n-p-n structure 42 is shorted by the high electric field E exceeding an allowable value, the capacitor C is connected to the n-p-n structure 42 and the resistor R and begins discharging, so that a positive voltage is applied to the first gate electrode 17. The IGBT thus is turned off and thereby is prevented from breakdown.

This configuration not only can produce the effects of the 13th embodiment but also reduces the size of the device as compared with the 13th embodiment.

(15th embodiment)

Figure 31:
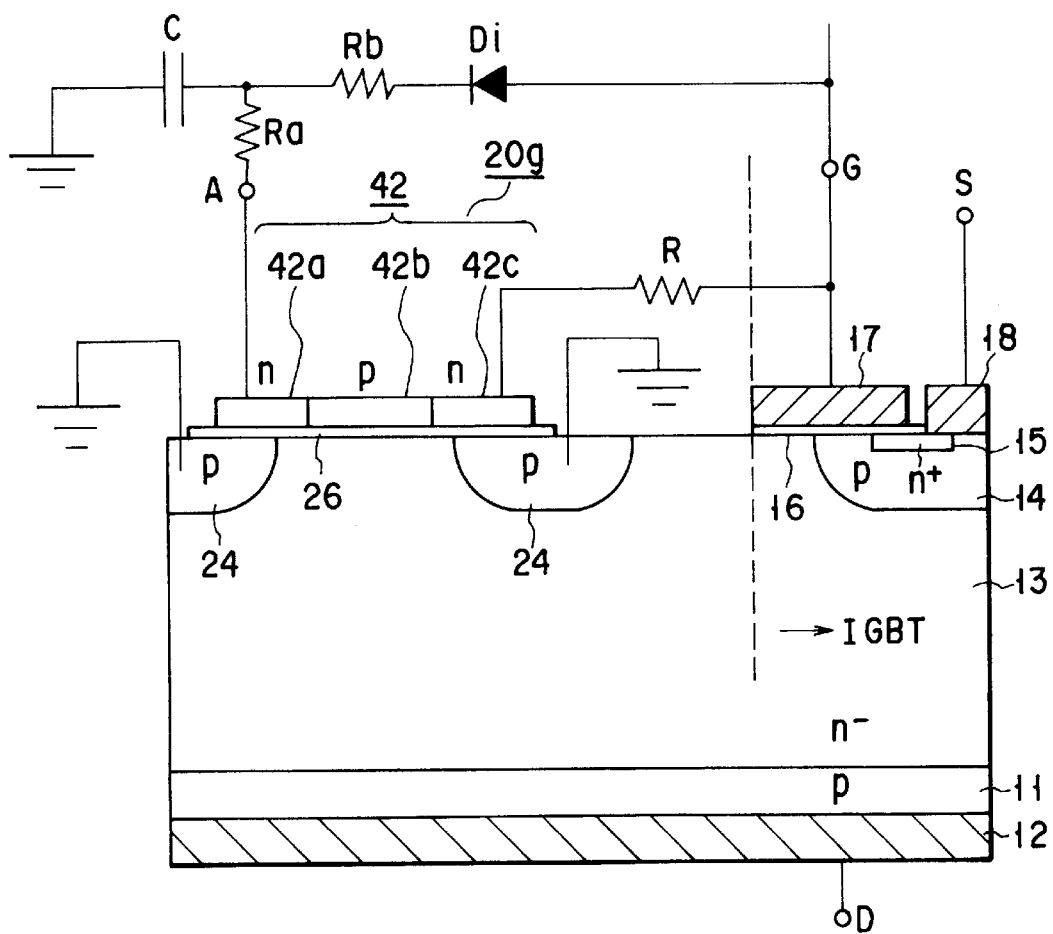
FIG. 31 is a sectional view schematically showing a configuration of a semiconductor device according to a 15th embodiment of the invention.

FIG. 31 is a sectional view schematically showing a configuration of a semiconductor device according to a 15th embodiment of the invention.

This semiconductor device, which is a modification of the 14th embodiment, comprises a resistor Ra interposed between the n-p-n structure 42 and the capacitor C and a resistor Rb interposed between the capacitor C and the diode Di.

The resistor Ra is for adjusting the time constant for charging the capacitor C and has the function of protecting the capacitor C and the wiring against overvoltage.

The resistor Rb, on the other hand, is for adjusting the time constant for discharging the capacitor C and is capable of regulating the positive voltage applied to the first gate electrodes 17.

This configuration can also produce the same effects as the 14th embodiment and can individually regulate the charge and discharge time constants of the capacitor C.

(16th embodiment)

FIG. 32 is a sectional view schematically showing a configuration of a semiconductor device according to a 16th embodiment of the invention.

This semiconductor device, which is a modification of the 14th embodiment, is so constructed that the capacitor C is formed on the same substrate as the IGBT in place of the power supply 43 thereby to protect the chip. In place of the capacitor C, the embodiment comprises a MOS capacitor 47 including a p-type layer 44 formed selectively on the surface of the n-type base layer 13, an insulating film 45 selectively formed on the p-type layer 44 and an electrode 46 formed on the insulating layer 45.

In this MOS capacitor 47, the electrode 46 is connected to the n-type layer 42a of the n-p-n structure 42 and the cathode of the diode Di. The p-type layer 44 is grounded. Also, the other n-type layer 42c of the n-p-n structure 42 is connected to the anode of the diode Di and the resistor R.

This configuration can also produce the same effect as the 14th embodiment. Since the capacitor C is not provided outside the IGBT chip, the chip can have its own protective function when used in the same manner as in the conventional device.

(17th embodiment)

Figure 33:
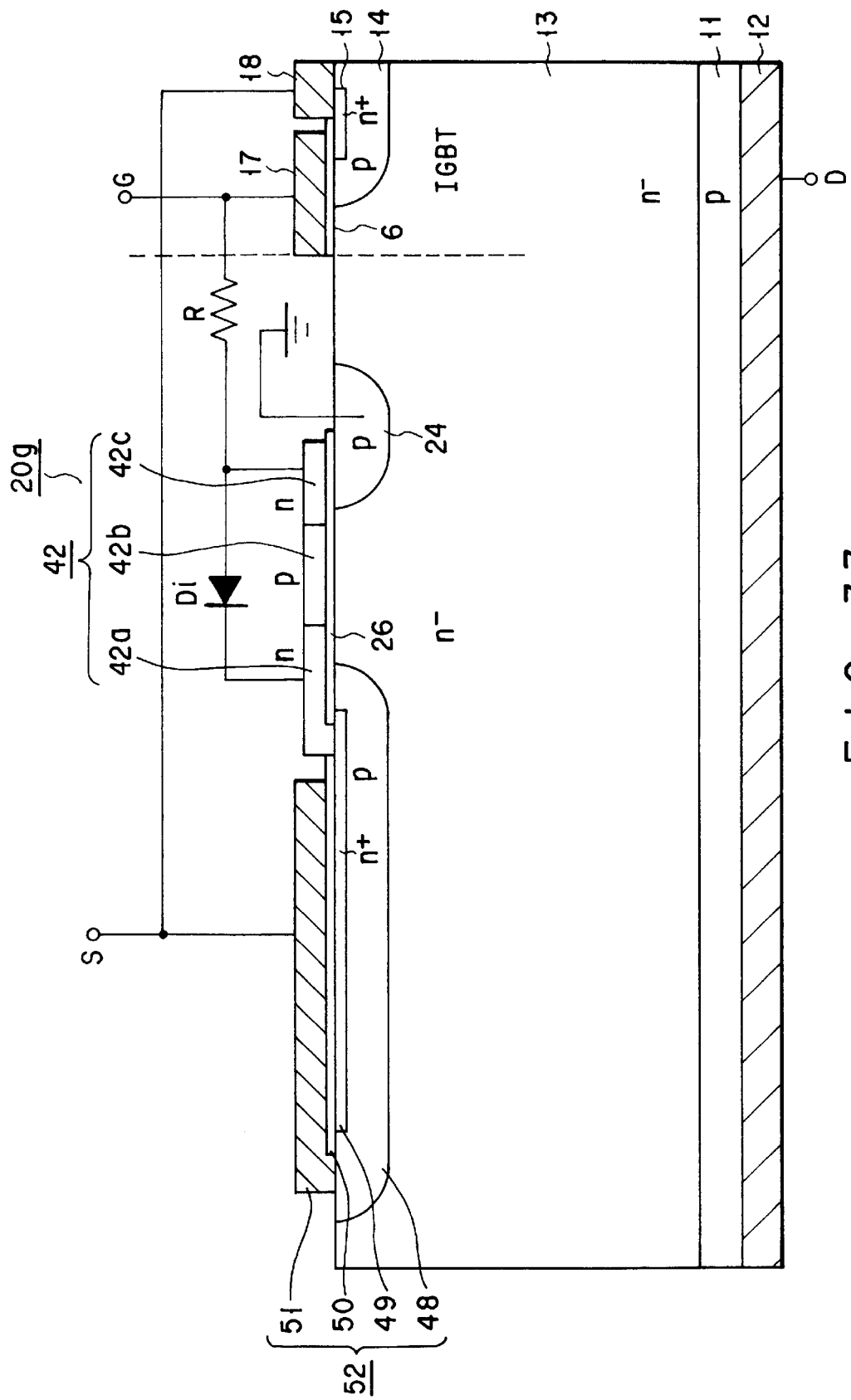
FIG. 33 is a sectional view schematically showing a configuration of a semiconductor device according to a 17th embodiment the invention.

FIG. 33 is a sectional view schematically showing a configuration of a semiconductor device according to a 17th embodiment of the invention.

This semiconductor device is a modification of the 16th embodiment, and comprises a MOS capacitor 52 including a p-type layer 48 formed selectively on the surface of a n-type base layer 13, a low-resistance n-type layer 49 formed selectively on the p-type layer 48, an insulating film 50 formed in contact with a part of the p-type layer 48 and the n-type layer 49, and a source electrode pad 51 formed on the insulating film 50 and having a part thereof in contact with the p-type layer 48.

The MOS capacitor 52 is formed with the n-type layer 49 thereof in contact with the n-type layer 42a of the n-p-n structure 42. The source electrode pad 51 is grounded. Also, the n-type layer 42a of the n-p-n structure 42 is connected to the cathode of the diode Di, and the other n-type layer 42c is connected to the resistor R and the anode of the diode Di.

This configuration can also produce the same effect as the 16th embodiment.

Further, the presence of the MOS capacitor 52 under the source electrode pad 51 reduces the required space as compared with the 16th embodiment.

(18th embodiment)

Figure 34:
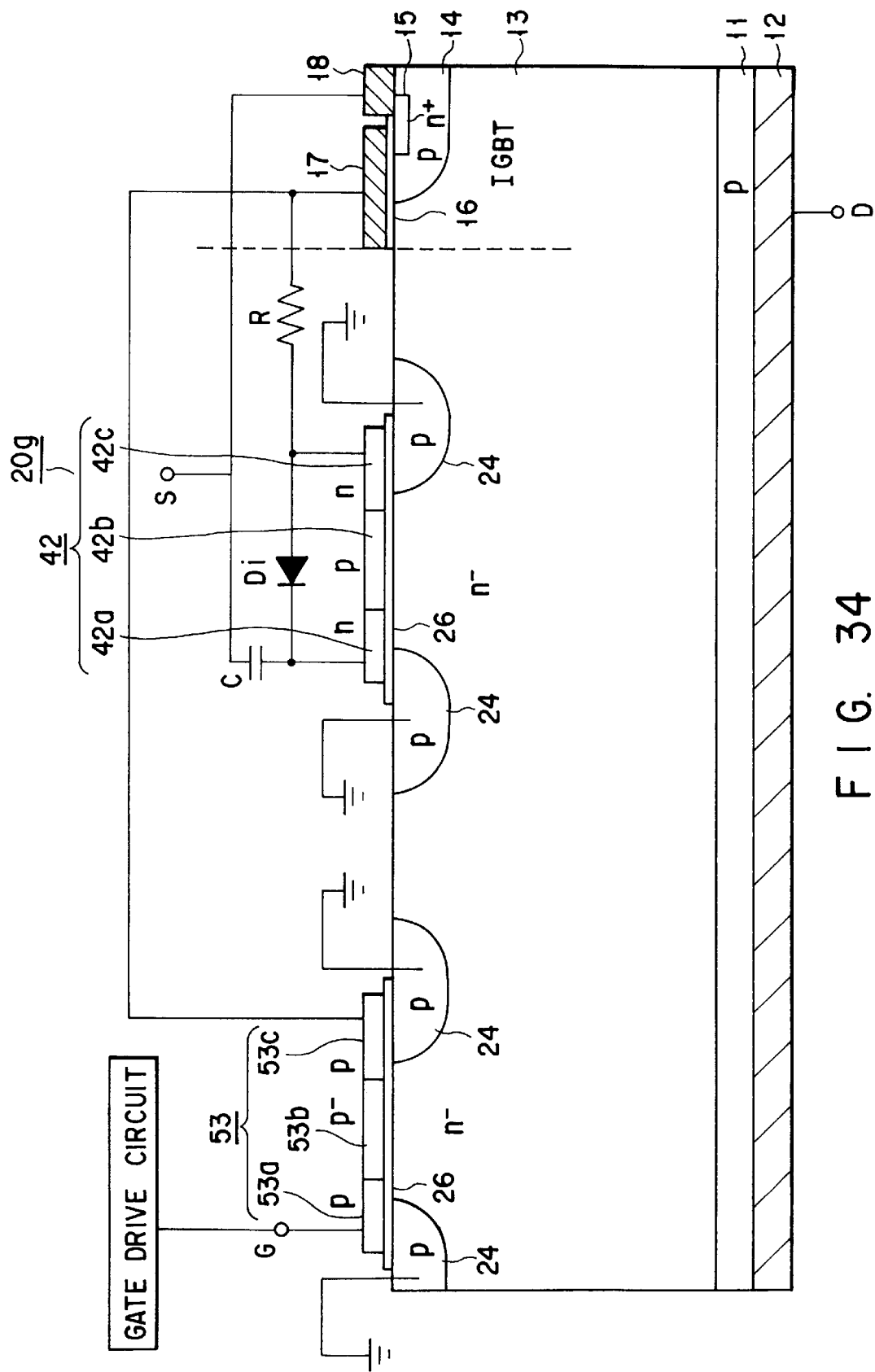
FIG. 34 a sectional view schematically showing a configuration of a semiconductor device according to a 18th embodiment of the invention.

FIG. 34 is a sectional view schematically showing a configuration of a semiconductor device according to an 18th embodiment of the invention.

This semiconductor device, which is a modification of the 14th embodiment, is intended to stabilize the gate voltage by disconnecting the first gate electrode 17 and the gate drive circuit at the time of protection. A p-p$^-$-p structure 53 including a p-type layer 53a, a high-resistance p-type layer 53b and a p-type layer 53c is laterally formed of a polycrystal Si through the insulating film 26 on the n-type base layer 13 constituting the same substrate as the IGBT. In the p-p$^-$-p structure 53, the p-type layer 53a is connected to the gate drive circuit, and the other p-type layer 53c is connected to the resistor R and the first gate electrode 17. The first gate electrode 17 is connected through the resistor R to the anode of the diode Di and the n-type layer 42c of the n-p-n structure 42.

In the p-p$^-$-p structure 53, as shown in FIGS. 35 and 36, the electrical resistance of the interface of the central p-type layer 53b with the insulating film 26 increases in accordance with the electric field E in the n-type base layer 13.

For this reason, when the high electric field E is applied into the n-type base layer 13, the p-p$^-$-p structure 53 disconnects the gate drive circuit and the first gate electrode 17 due to the increase in the electrical resistance Rp$^-$.

The n-p-n structure 42, on the other hand, connects the capacitor C to the first gate electrode 17 through the resistor R due to the drop in the electrical resistance Rp as in the preceding case, when the high electric field E is applied into the n-type base layer 13.

As a result, the first gate electrode 17 thus cut off from the gate drive circuit is supplied with a positive voltage through the resistor R from the capacitor C. The IGBT thus is turned on and prevented from breakdown.

As described above, this embodiment, in addition to the effects of the 14th embodiment, has the advantage that since the gate drive circuit and the first gate electrode 17 are disconnected at the time of protection, the positive voltage applied to the first gate electrode 17 from the capacitor C can be stabilized.

Also, the disconnection between the gate drive circuit and the first gate electrode 17 at the time of protection eliminates the current flow to an external gate drive circuit for a reduced capacitance of the capacitor C.

(19th embodiment)

FIG. 37 is a partial sectional view schematically showing a part of the configuration of a semiconductor device according to a 19th embodiment of the invention.

This semiconductor device is a modification of the 13th to 18th embodiments respectively, and comprises an electric field detector 20$h$ having an n-p$^-$-n structure 42$x$ in place of the n-p-n structure in any of the 13th to 18th embodiments.

The n-p$^-$-n structure 42$x$, as shown in FIG. 38, is such that the electrical resistance Rp$^-$ of the central high-resistance p-type layer 22$bx$ has the property of dropping in the interface with the insulating film 26 in accordance with the electric field E in the n-type base layer 13.

This configuration can also produce the effect corresponding to the applicable ones of the 13th to 18th embodiments.

(20th embodiment)

FIG. 39 is a partial sectional view schematically showing a part of the configuration of a semiconductor device according to a 20th embodiment of the invention.

This semiconductor device is a modification of the 18th embodiment, and the p-p$^-$-p structure 53 is replaced by a p-p$^-$-p structure 54 formed on the surface of the n-type base layer 13 providing the same substrate as the IGBT.

Figure 40:
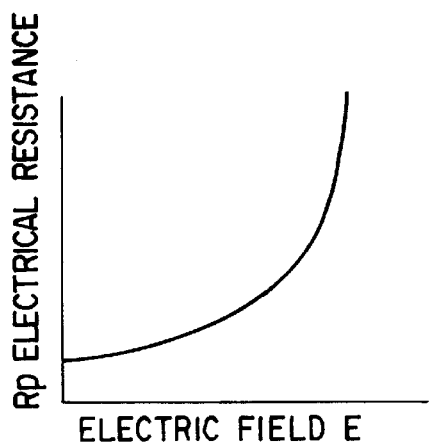
FIG. 40 is a diagram showing the relation between the electric field and the electric resistance of a semiconductor device according to the same embodiment.

In the p-p$^-$-p structure 54, a high-resistance p-type layer 54$b$ is formed on the surface of the n-type base layer 13, and the p-type layers 54$a$, 54$c$ are formed selectively on the p-type layer 54$b$ with such a depth as to reach the n-type base layer 13. Also, the p-p$^-$-p structure 54 has electrodes 55, 56 individually formed on the p-type layers 54$a$, 54$c$ at the ends thereof. The p-type layer 54$a$ is connected to the gate drive circuit through the electrode 55, and the other p-type layer 54$c$ is connected to the first gate electrode 17 and the resistor R through the electrode 56. As in the preceding embodiments, FIG. 40 shows that the electrical resistance Rp$^-$ of the central p-type layer 54$b$ has the property of increasing in accordance with the electric field E in the n-type base layer 13.

This configuration also has the same effect as the 18th embodiment.

(21st embodiment)

Figure 41:
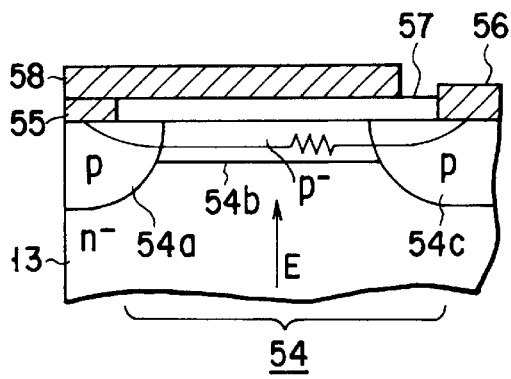
FIG. 41 is a partial sectional view schematically showing a part of a configuration of a semiconductor device according to a 21st embodiment of the invention.

FIG. 41 is a partial sectional view schematically showing a part of the configuration of a semiconductor device according to a 21st embodiment of the invention.

In this semiconductor device which is a modification of the 20th embodiment, an insulating film 57 is formed in a position between electrodes 55 and 56. An electrode 58 doubling as a shield is formed on the electrode 55 and the insulating film 57. The electrode 58 doubling as a shield is electrically connected to the electrode 55 but electrically insulated from the electrode 56.

This configuration can also produce the same effect as the sixth embodiment. In view of the fact that the insulating film 57 and the shield-acting electrode 58 are formed to cover the p-p$^-$-p structure 54, the electrical effect of the wiring and the like above the element (on the surface) can be eliminated.

(22nd embodiment)

Figure 42:
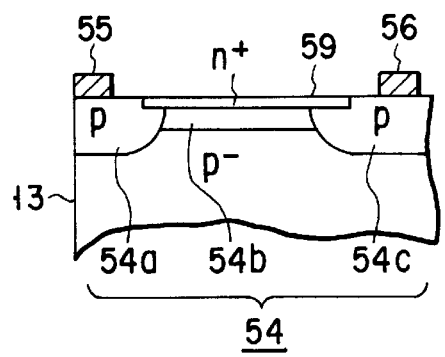
FIG. 42 is a partial sectional view schematically showing a part of a configuration of a semiconductor device according to a 22nd embodiment of the invention.

FIG. 42 is a partial sectional view schematically showing a part of the configuration of a semiconductor device according to a 22nd embodiment of the invention.

This semiconductor device, which is a modification of the 20th embodiment, comprises a low-resistance n-type layer 59 formed on the surface extending from the p-type layer 54$a$ through the p-type layer 54$b$ to the p-type layer 54$c$.

This configuration also produces the same effect as the 20th embodiment. Also, since a n-type layer 59 is formed on the surface of the p-p$^-$-p structure 54, the effect of the charge of the Si interface can be eliminated.

(23rd embodiment)

Figure 43:
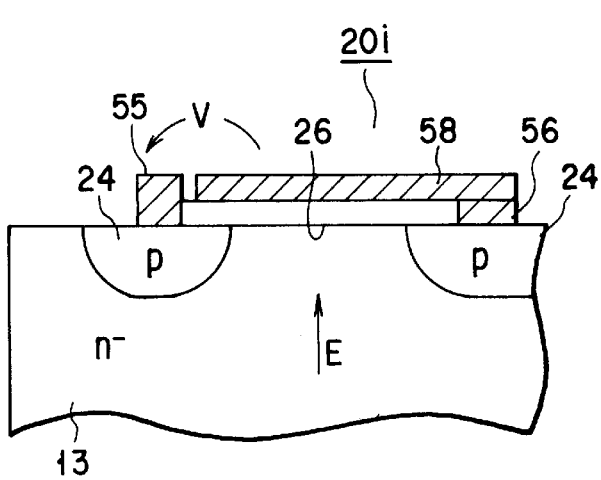
FIG. 43 is a partial sectional view schematically showing a part of a configuration of a semiconductor device according to a 23rd embodiment of the invention.

FIG. 43 is a partial sectional view schematically showing a part of the configuration of a semiconductor device according to a 23rd embodiment of the invention.

This semiconductor device, which is a modification of the 13th to 18th embodiments respectively, comprises an electric field detector 20$i$ including electrodes 55 and 56 formed on two p-type base layers 24 in such a position as to hold the insulating layer 26 therebetween, and an electrode 58 doubling as a shield formed on the electrode 56 and the insulating film 26.

Figure 44:
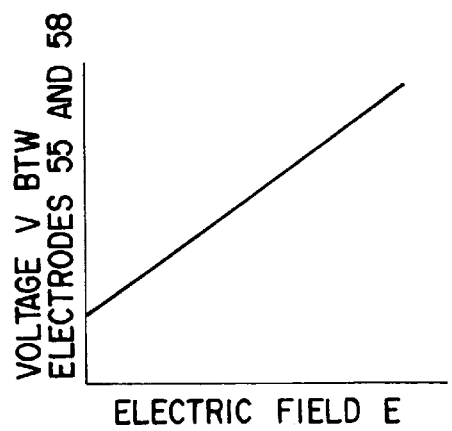
FIG. 44 is a diagram showing the relation between the electric field and the voltage BTW electrodes of a semiconductor device according to the same embodiment.

Also, the electric field detector 20$i$, as shown in FIG. 44, has the property of increasing the voltage between the electrodes 55 and 56 in accordance with the electric field E in the n-type base layer 13.

This configuration can also produce the same effect as the applicable ones of the 13th to 18th embodiments by providing a voltage detection means like a comparator in a subsequent stage of the electric field detector 20$i$.

(24th embodiment)

Figure 45:
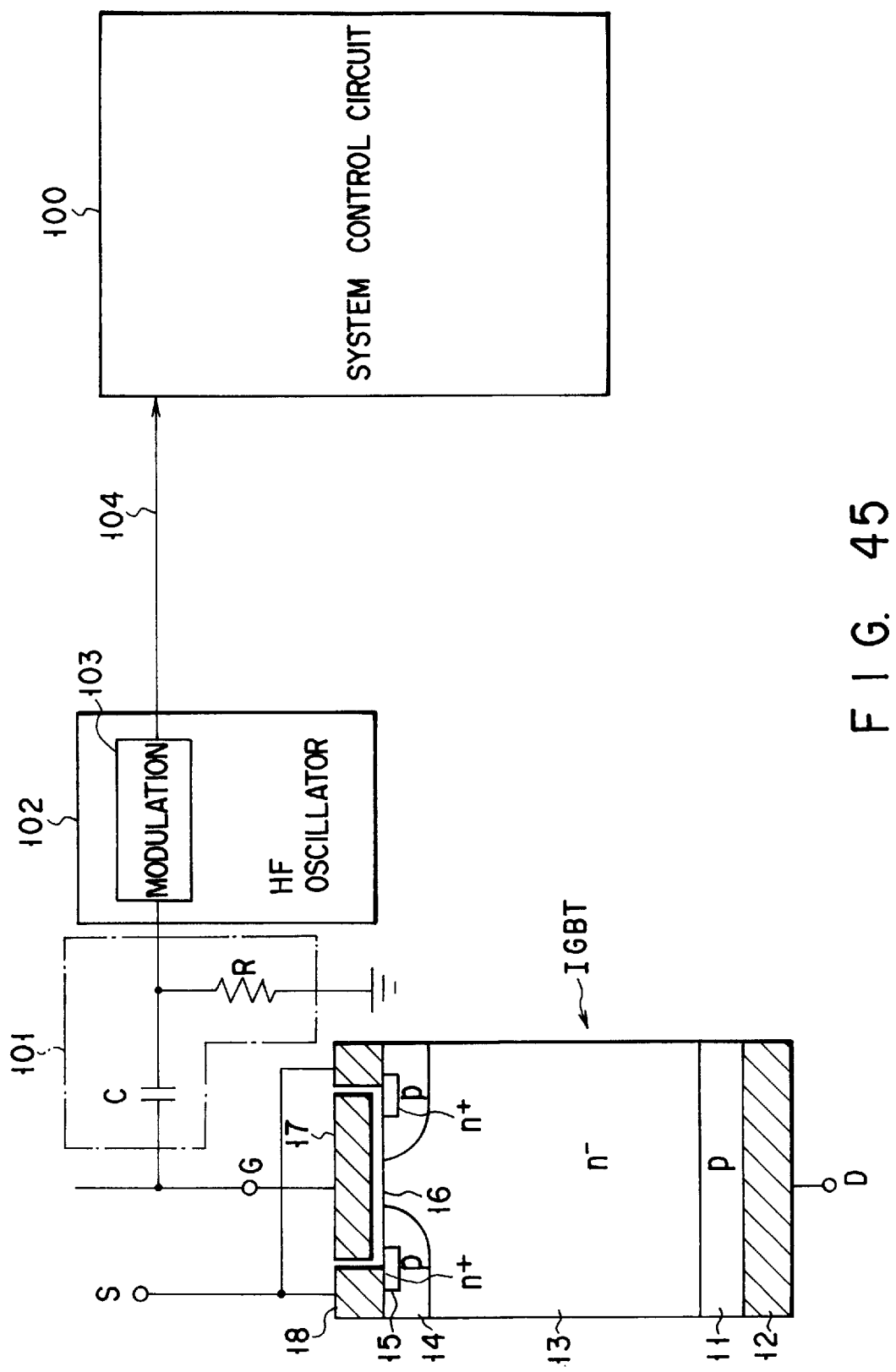
FIG. 45 is a sectional view schematically showing a configuration of a semiconductor device according to a 24th embodiment of the invention.

FIG. 45 is a sectional view schematically showing a configuration of a semiconductor device according to a 24th embodiment of the invention.

In this semiconductor device, the change of the electric field E in the n-type base layer 13 of the IGBT can be notified to a system control circuit 100, and a high-frequency oscillation circuit 102 is connected through a high-pass filter 101 including a capacitor C and a resistor R to the first gate electrode 17.

The high-pass filter 101 detects the change in gate voltage and applies it to a modulation circuit 103 in the high-frequency oscillation circuit 102.

The high-frequency oscillation circuit 102 has the functions of oscillating an arbitrary high frequency of 1 MHz to several GHz and sending out a high frequency to a coaxial cable 104 directed to the system control circuit 100. The coaxial cable 104 may be replaced by a feeder or an aerial antenna as required.

The modulation circuit 103 has the function of modulating the high frequency sent out from the high-frequency oscillation circuit 103 in accordance with the change in the gate voltage applied from the high-pass filter 101.

The system control circuit 100 has the function of demodulating the high frequency supplied from the coaxial cable 104, deciding on the IGBT condition on the basis of the demodulation, regulating the gate drive waveform and turning on and off the IGBT in accordance with the decision of the system control circuit 100.

Consequently, when a high electric field E is applied to the n-type base layer 13, the signal passed through the high-pass filter 101 in accordance with the change in the electric field E of the n-type base layer 13 is applied to the high-frequency oscillation circuit 102.

In response to this signal, the modulation circuit 103 in the high-frequency oscillation circuit 102 modulates the high-frequency and sends the modulated high frequency to the coaxial cable 104.

The system control circuit 100 demodulates the high frequency, and on the basis of the demodulation result, decides on the IGBT condition and turns on and off the IGBT or regulates the gate drive waveform in accordance with the decision result.

In this way, the high frequency is modulated and sent out in accordance with the change in the electric field E of the n-type base layer 13. Even in the case where the system control circuit 100 is located at a distance from the IGBT, therefore, the IGBT condition can be notified and a rapid measure can be taken against an error condition.

(25th embodiment)

Figure 46:
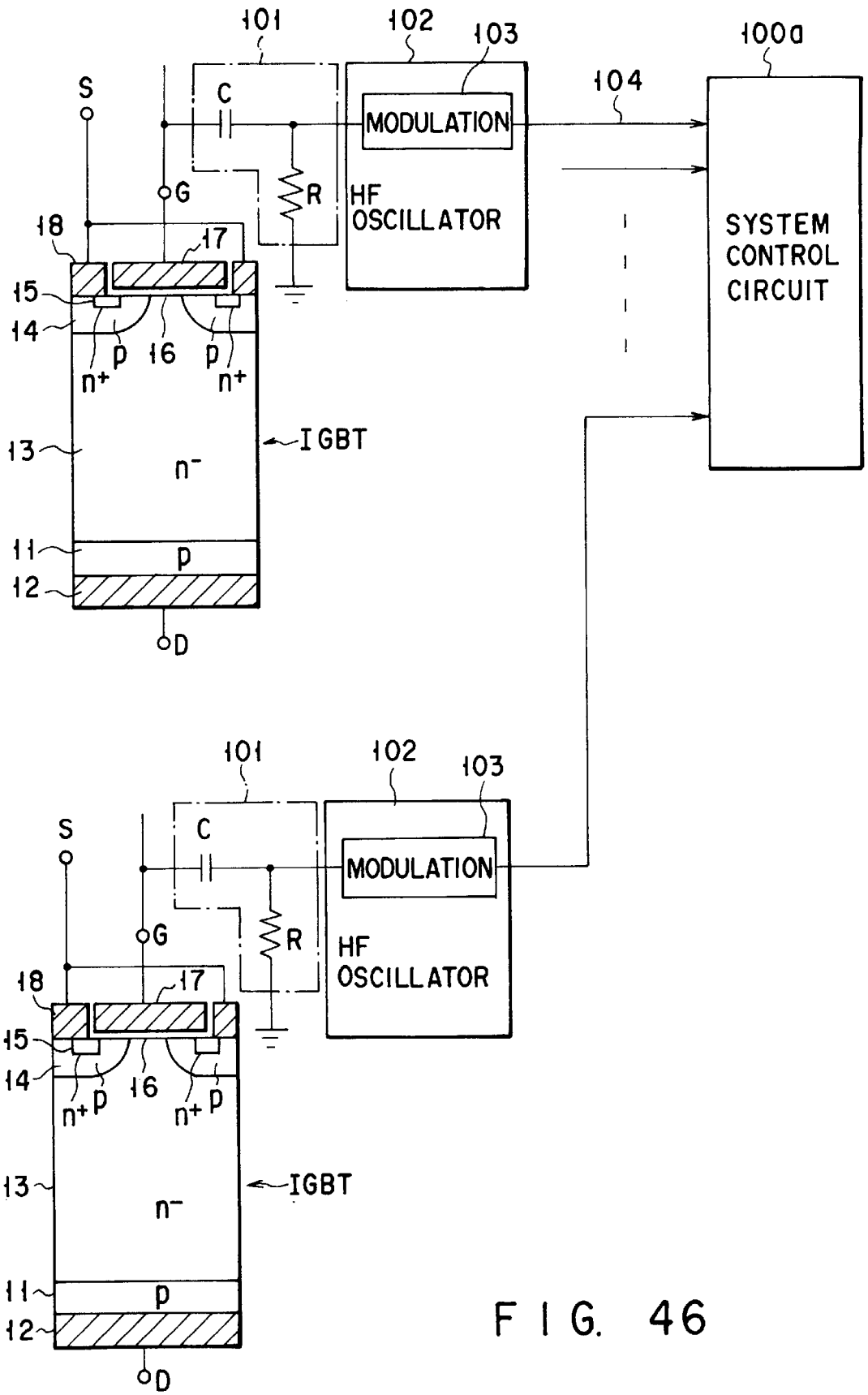
FIG. 46 is a sectional view schematically showing a configuration of a semiconductor device according to a 25th embodiment of the invention.

FIG. 46 is a sectional view schematically showing a configuration of a semiconductor device according to a 25th embodiment of the invention.

This semiconductor device, which is a modification of the 24th embodiment, is such that a plurality of semiconductor elements each including an IGBT, a high-pass filter and a high-frequency oscillation circuit 102 are connected individually to a system control circuit 100a through a coaxial cable 104.

The system control circuit 100a, in addition to the function of the system control circuit 100 described above, has the function of individually demodulating the high frequency supplied from the coaxial cable 104 and deciding on the condition of each IGBT on the basis of the demodulation result and the function of controlling the on-off state of each IGBT and regulating the gate drive waveform in accordance with the decision of the IGBT condition. The IGBT condition includes, for example, the unbalance between the IGBTs, deviation of the switching timing, temperature and the sharing of current.

As a result, in addition to the effect of the 24th embodiment, this embodiment has the advantage that the conditions of a plurality of IGBTs can be notified and a rapid measure can be taken against abnormal conditions of the IGBTs such as the unbalance or sharing of current among the IGBTs.

(26th embodiment)

Figure 47:
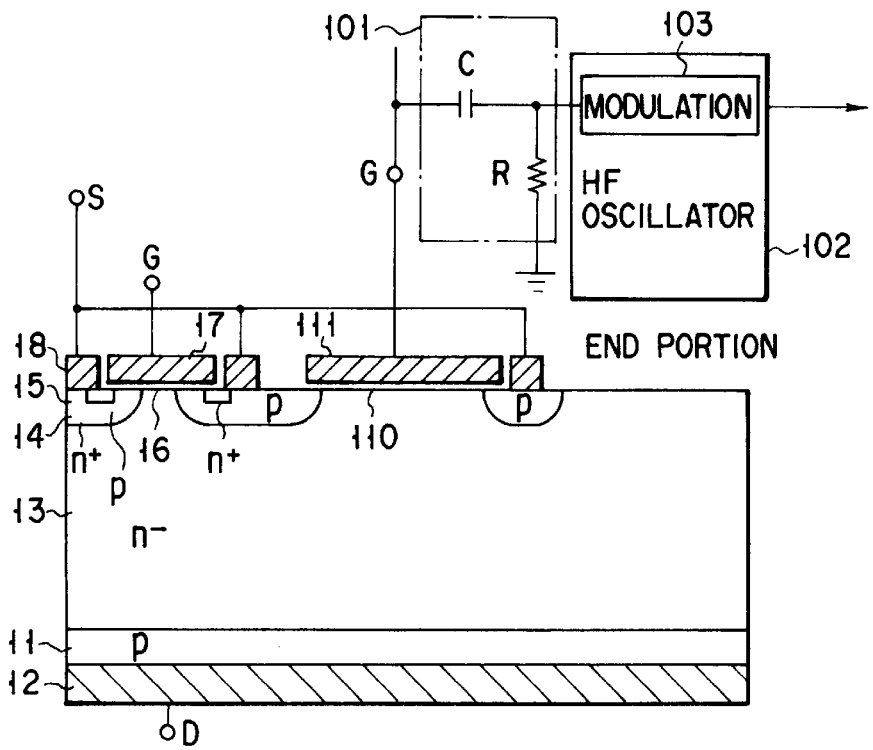
FIG. 47 is a sectional view schematically showing a configuration of a semiconductor device according to a 26th embodiment of the invention.

FIG. 47 is a sectional view schematically showing a configuration of a semiconductor device according to a 26th embodiment of the invention.

This semiconductor device is a modification of the 24th embodiment, and is so configured that a detection gate electrode 111 is formed through an insulating film 110 on a n-type base layer 13 constituting the same substrate as the IGBT. Unlike in the 24th embodiment, however, the high-pass filter 101 is connected to the detection gate electrode 111.

In this configuration, the same effect as that of the 24th embodiment is obtained. Further, since the change in the electric field E of the n-type base layer 13 is detected by the detection gate electrode 111 distant from the IGBT, the effect of the gate circuit on the IGBT can be avoided, thereby improving the reliability of the protective function.

(27th embodiment)

Figure 48:
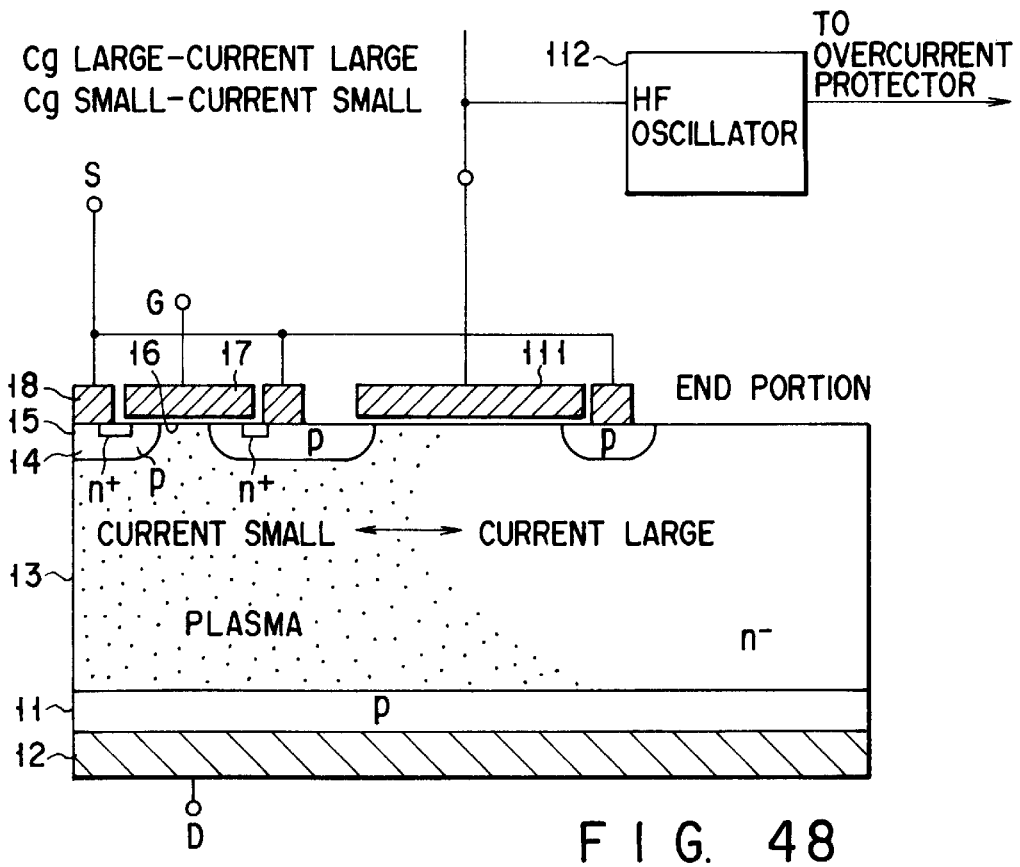
FIG. 48 is a sectional view schematically showing a configuration of a semiconductor device according to a 27th embodiment of the invention.

FIG. 48 is a sectional view schematically showing a configuration of a semiconductor device according to a 27th embodiment of the invention.

This semiconductor device is a modification of the 26th embodiment and uses the detection gate electrode 111 for detection of the current amount of the IGBT. In this embodiment, a high-frequency oscillation circuit 112 is used in place of the high-pass filter and the high-frequency oscillation circuit 102 is connected to the detection gate electrode 111.

The high-frequency oscillation circuit 112 includes an LC oscillator for oscillating and transmitting a high frequency to an overcurrent protection circuit (not shown). In addition, the resonant frequency of the oscillator can be modulated by the change of the gate capacitance Cg of the detection gate electrode 111.

Now, the operation of this semiconductor device will be explained.

Assume that the IGBT is in on state. In the n-type base layer 13, the plasma area is enlarged in proportion to the increase in current. The gate capacitance Cg of the detection gate electrode 111, on the other hand, increases in proportion to the expansion of the plasma area (or the increase in current).

The high-frequency oscillation circuit 112 sends out high-frequency a changing oscillation frequency to the overcurrent protection circuit in accordance with the change in the gate capacitance Cg. On the basis of this modulated high frequency, the overcurrent protection circuit detects the increase in the gate capacitance Cg, and then turns off the IGBT thereby to protect the circuit from the breakdown due to an overcurrent.

As described above, according to this embodiment, the gate capacitance Cg changing in accordance with the IGBT current is connected in parallel with the LC oscillator, and the high frequency is modulated in accordance with the gate capacitance Cg. In this way, upon detection of an increased IGBT current, the overcurrent protection circuit is activated. The breakdown of the IGBT due to an overcurrent can thus be prevented.

(28th embodiment)

Figure 49:
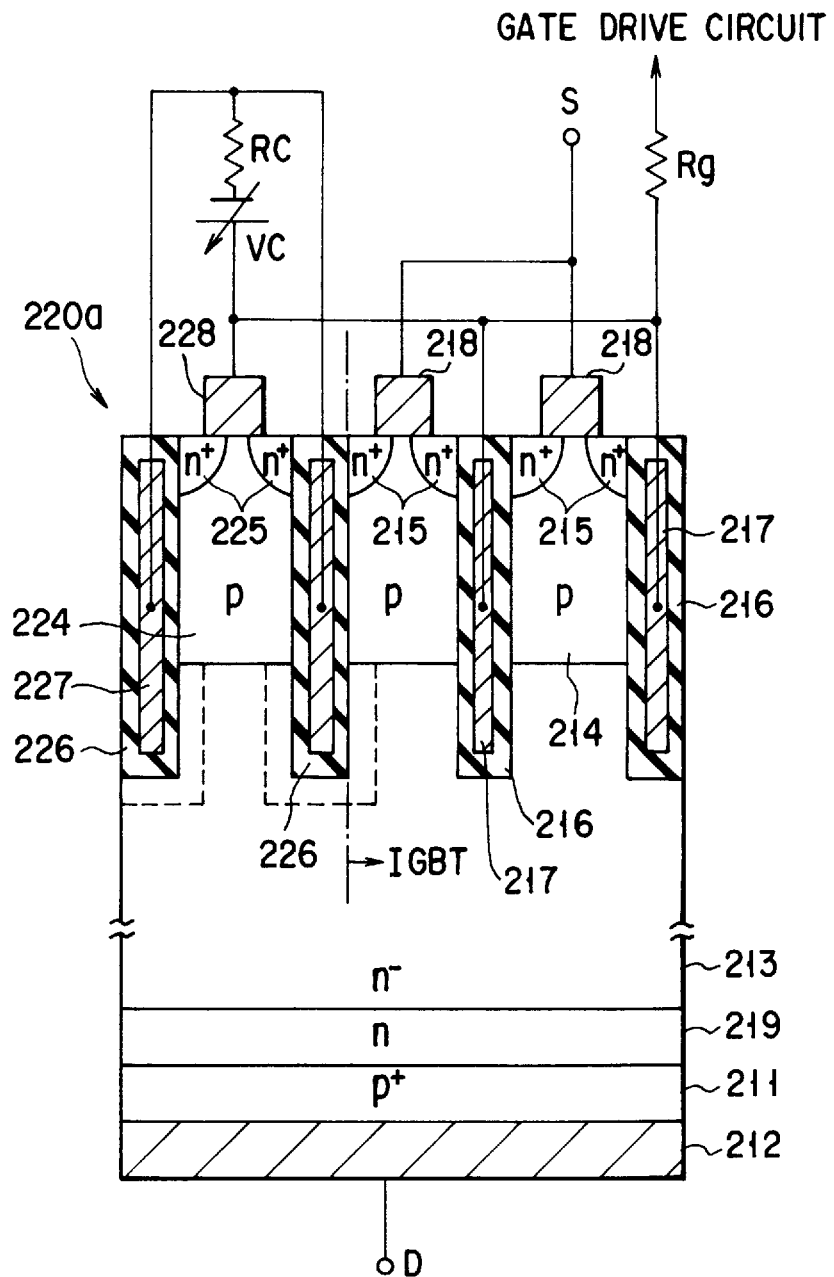
FIG. 49 is a sectional view schematically showing a configuration of a semiconductor device according to a 28th embodiment of the invention.

FIG. 49 is a sectional view schematically showing a configuration of a semiconductor device according to a 28th embodiment of the invention. The main switching element of this semiconductor device constitutes a trench IGBT and comprises a p-type drain layer 211 having one surface thereof formed with a drain electrode 212. The surface of the p-type drain layer 211 opposite to the drain electrode 212 is formed with a n-type base layer 213 through a n-type buffer layer 219. Grooves 6 μm deep and 1 μm wide are formed at intervals in the surface of the n-type base layer 213.

The surface portion of the n-type base layer 213 not formed with the grooves is selectively formed with a plurality of p-type base layers 214 each having a depth of 4 μm. The surface of each p-type base layer 214 is selectively formed with a n-type source layer 215. Also, each of the grooves has arranged therein a first gate electrode 217 defined by a gate insulating film 216 formed on the side of a p-type base layer 214 held between the n-type base layer 213 and the n-type source layer 215. Further, a source electrode 218 is formed on the n-type source layers 215 and the p-type base layer 214.

As a result of this configuration, an IGBT constituting a main switching element is formed. Also, each first gate electrode 217 is connected to a gate drive circuit through the gate resistor Rg.

An electric field detector 220a, on the other hand, is selectively formed on the surface portion of the n-type base layer 13 not formed with the IGBT. This electric field detector 220a is specifically configured in the manner described below. The surface portion of the n-type base layer 213 not formed with the grooves is formed with a p-type base layer 224 having a depth of 4 μm. The surface of each p-type base layer 224 is selectively formed with n-type source layers 225. Also, a second gate electrode 227 for electric field detection is formed on the portion formed with the grooves. Each gate electrode 227 is defined by the gate insulating film 226 on the side of the p-type base layer 224 held between the n-type base layer 213 and the n-type source layer 225. A source electrode 228 is formed on the n-type source layers 225 and the p-type base layer 224. Also, each second gate electrode 227 is electrically connected to the first gate electrodes 217 and the source electrodes 228 through a gate resistor RC and a variable power supply VC. The size of the grooves is the same as those of the IGBT.

The semiconductor device configured as described above is protected from an overvoltage in the manner described below.

When a negative voltage is applied to a terminal of the gate resistor Rg by a gate drive circuit in order to turn off the IGBT, the gate voltage of each first gate electrode 217 (hereinafter referred to as the first gate voltage as in the preceding cases) begins to fall. With the fall of the first gate voltage, the main voltage between the source and drain of the IGBT begins to rise, and the first gate voltage becomes substantially constant due to the Miller effect.

In the meantime, the second gate electrode 227 are supplied with a negative voltage by the variable power supply VC. As a result, the surface of the n-type base layer 213 in contact with the gate insulating films 226 is formed with a p-type channel layer. Also, a depletion layer as defined by dashed line is formed around each p-type channel layer. This p-type channel layer shields the electric field due to the main voltage of the IGBT. The potential of the second gate electrodes 227, therefore, remains unchanged. The electric field detector 220a thus maintains a nonconductive state.

With the increase of the main voltage of the IGBT to a predetermined value and the resulting increase of the internal electric field of the IGBT to a predetermined level, the electric field in the electric field detector 220a increases, the p-type channel layers are extinguished, and a capacitance is generated between the drain and the gate of the electric field detector 220a. More specifically, in the electric field detector 220a, the increased electric field extends the depletion layer that has been existent in the n-type base layer 213 in contact with the p-type channel layer. Thus the p-type channel is extinguished and the depletion layer reaches each gate insulating film 226. The drain electrode 212 and the second gate electrodes 227 thus are connected through the capacitance of the depletion layer and the gate insulating films 226. Even more specifically, since the gate insulating film 226 and the second gate electrode 227 are buried in a narrow groove, the drain and gate are connected by the sides of the gate insulating film 226 projected to the n-type base layers 213.

As a consequence, the gate voltage of the second gate electrode (hereinafter referred to as the second gate voltage) rapidly rises, so that the polarities of the second gate voltage and the voltage of the source electrode 228 are reversed. In other words, the second gate voltage becomes positive, and the source electrode 228 is supplied with a negative voltage. As a result, a n-type channel layer is formed on the sides of the p-type base layers 224 held between the n-type source layers 225 and the n-type base layer 213. An electron current thus flows into the n-type base layers 224, and the MOSFET structure of the electric field detector 220a turns on into a conductive state.

Consequently, a current flows into the first gate electrodes 217 of the IGBT from the drain electrode 212 of the IGBT through the electric field detector 220a. The resulting voltage drop across the resistor Rg increases the first gate voltage. Thus the IGBT is turned on incompletely, with the resistor thereof falling, thereby protecting the IGBT from an overvoltage condition.

The main voltage of the IGBT at which the electric field detector 220a conducts, i.e., the clamp voltage, is changed with the charge stored per unit area of the p-type channel layer as described above. This stored charge can be changed by the variable power supply VC. In other words, the clamp voltage can be made variable by changing the voltage applied from the variable power supply VC. This cannot be accomplished in the conventional device having a zener diode.

As described above, according to this embodiment, provision of a trench-type electric field detector 220a and a trench IGBT can protect the main switching element while suppressing noises as in the first embodiment.

Also, the electric field detector 220a according to this embodiment mainly detects a high electric field on the sides of the grooves, and therefore the detection sensitivity can be regulated to the desired value by adjusting the groove size.

Further, since the electric field detector 220a is formed on the same substrate as the IGBT, the chip has its own protection function.

(29th embodiment)

FIG. 50 is a sectional view schematically showing a configuration of a semiconductor device according to a 29th embodiment of the invention.

This semiconductor device, which is a modification of the 28th embodiment, is different from the 28th embodiment in that a diode Di is interposed between the source electrode 228 and the first gate electrodes 217.

This configuration has not only the advantages of the 28th embodiment but also the advantage that current can be completely blocked which otherwise might flow from the gate drive circuit to the drain electrode 212 through the electric field detector 220a.

(30th embodiment)

Figure 51:
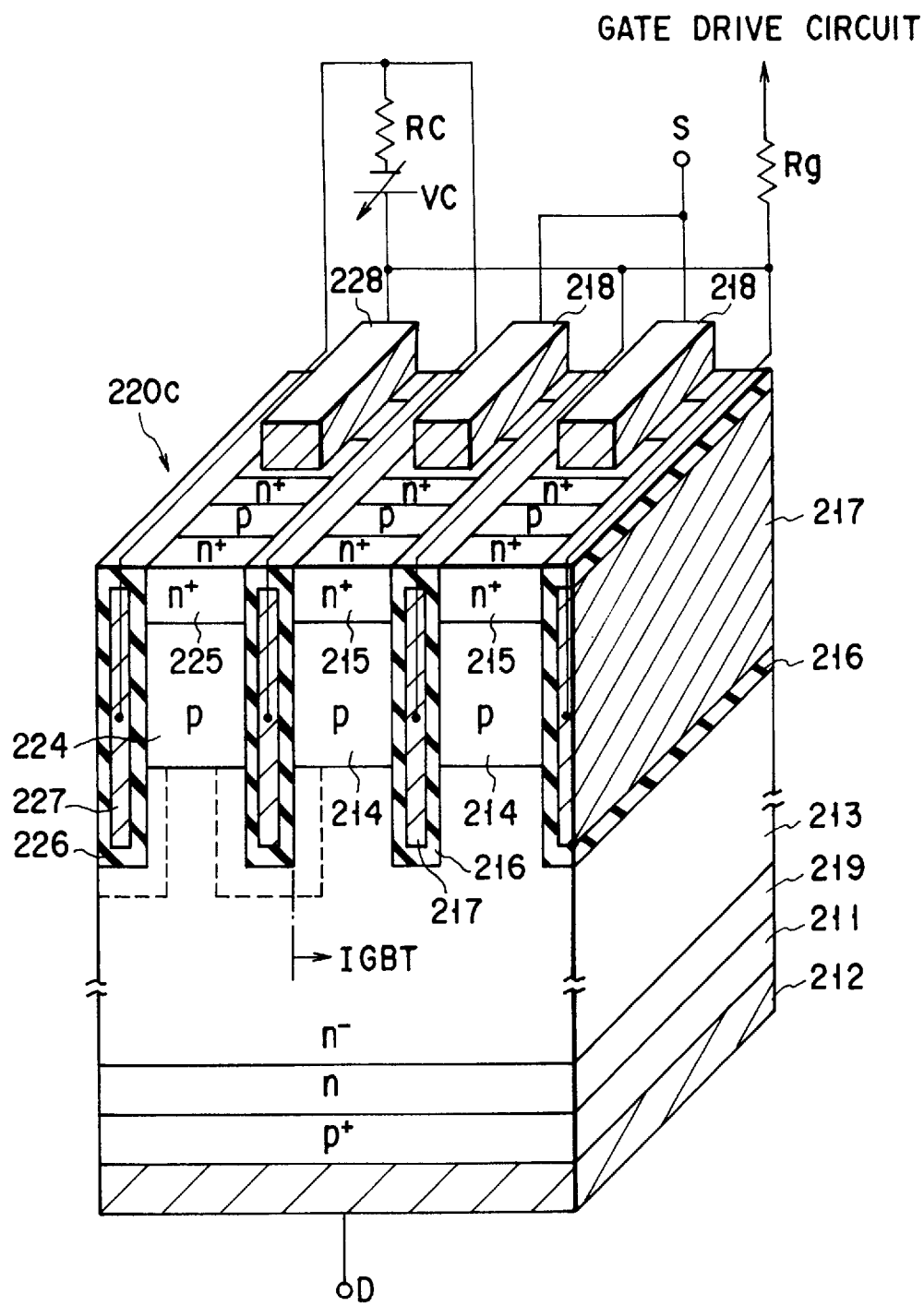
FIG. 51 is a perspective sectional view schematically showing a configuration of a semiconductor device according to a 30th embodiment of the invention.

FIG. 51 is a perspective sectional view schematically showing a configuration of a semiconductor device according to a 30th embodiment of the invention.

This semiconductor device, which is a modification of the 28th embodiment, is different from the 28th embodiment in that the n-type source layers 215 of the IGBT and the n-type source layers 225 of the electric field detector 220c are formed at right angle to but not along the grooves.

This configuration has, in addition to the effect of the 28th embodiment, the advantage that the n-type source layers 215 and the n-type source layers 225 can be formed without mask matching, so that the integration density of the main switching element and the electric field detector can be improved.

(31st embodiment)

Figure 52:
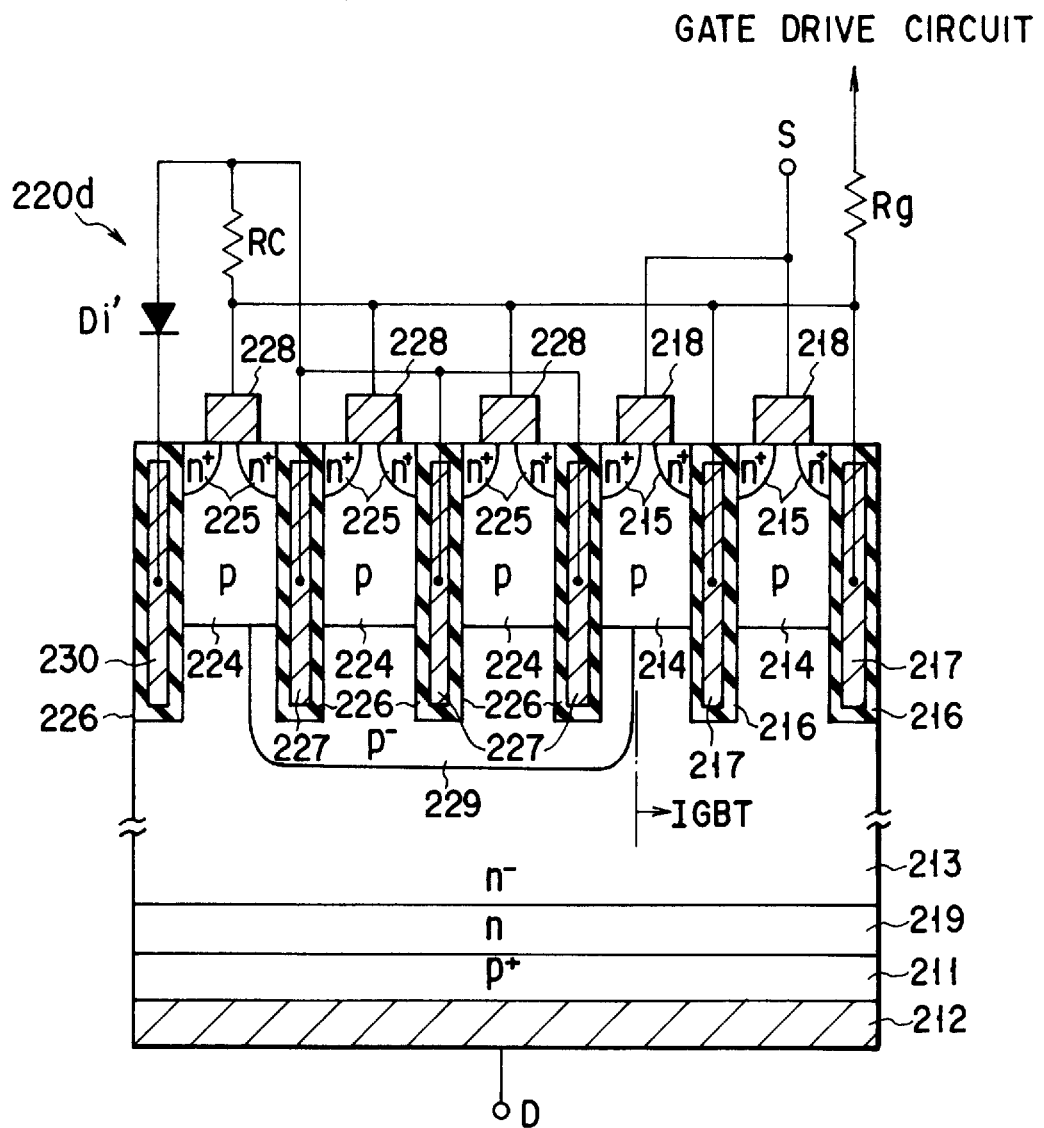
FIG. 52 is a sectional view schematically showing a configuration of a semiconductor device according to a 31st embodiment of the invention.

FIG. 52 is a sectional view schematically showing a configuration of a semiconductor device according to a 31st embodiment of the invention.

This semiconductor device, which is a modification of the 28th embodiment, is different from the 28th embodiment in three points. First, a p-type shield layer 229 is formed on the n-type base layer 213 in contact with the second gate electrodes 227 for detection of the electric field through gate insulating films 226. Second, the variable power supply VC is omitted. Thirdly, a third gate electrode 230 is connected to each second gate electrode 227 through the diode Di'.

In FIG. 52, a p-type shield layer 229 is provided for a plurality of the second gate electrodes 227 and a plurality of the gate insulating layers 226. This is by reason of the fact that the production process is facilitated more than by providing a p-type shield layer 229 for each of the second gate electrodes 227 and the gate insulating layers 226. The number of the second gate electrodes 227 and the gate insulating layers 226 formed with the p-type shield layer 229 can be changed arbitrarily.

Also, for a current to flow to the gate resistor Rg through the electric field detector 220d, a third gate electrode 230 is required to be formed free of the p-type shield layer 229. Provision of the third gate electrode 230 free of a shield, however, reduces the clamp voltage below a predetermined level. In view of this, the diode Di' is interposed between the third gate electrode 230 and the second gate electrodes 227 so that the clamp voltage is not determined by the third gate electrode 230.

In this configuration, the p-type shield layer 229 plays the function of the p-type channel layer formed by the variable power supply VC and exhibits the protection effect similar to that of the 28th embodiment. In spite of the fact that the clamp voltage is fixed by the dose amount of the p-type shield layer 29, this configuration simplifies the circuit.

(32nd embodiment)

Figure 53:
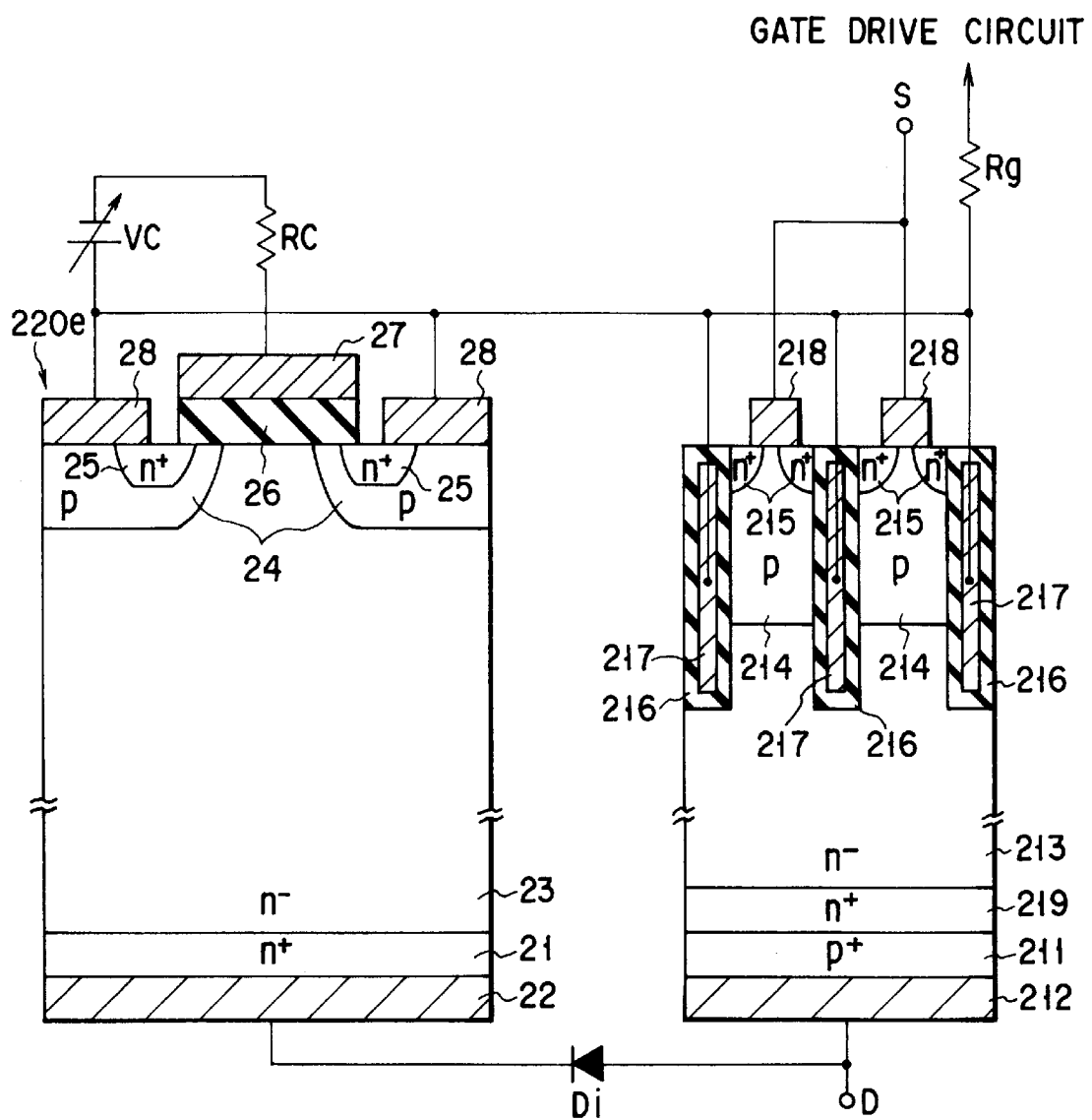
FIG. 53 is a sectional view schematically showing a configuration of a semiconductor device according to a 32nd the invention.

FIG. 53 is a sectional view schematically showing a configuration of a semiconductor device according to a 32nd embodiment of the invention.

This semiconductor device, which is a modification of the 28th embodiment, is different from the 28th embodiment in three points. First, the electric field detector 220 is separated from the main switching element. Second, the electric field detector 220e is made up of a MOSFET of planar structure. Third, a diode Di is inserted between the drain electrodes 212 and the drain electrode 22, so that the electron current is prevented from flowing from the gate drive circuit through the electric field detector 220e to the drain electrode 212.

The electric field detector 220e, which has the same MOS structure as the electric field detector 20a of the first embodiment (FIG. 5), will not be described in detail.

This configuration can also produce the same effect as the 28th embodiment.

(33rd embodiment)

Figure 54:
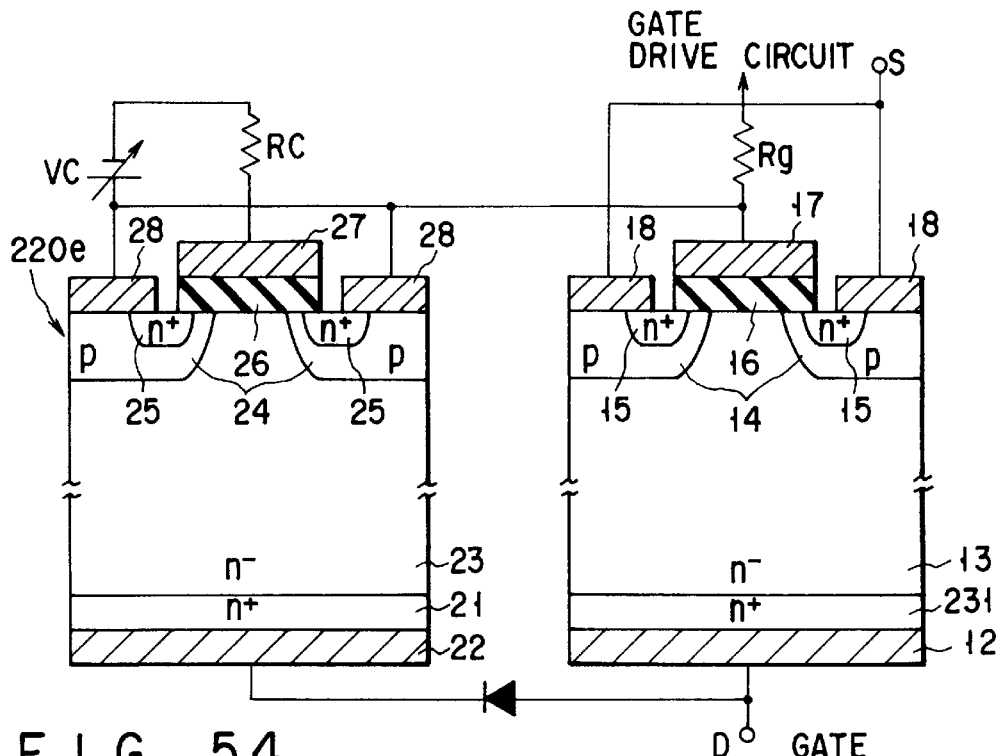
FIG. 54 is a sectional view schematically showing a configuration of a semiconductor device according to a 33rd embodiment of the invention.

FIG. 54 is a sectional view schematically showing a configuration of a semiconductor device according to a 33rd embodiment of the invention.

This semiconductor device, which is a modification of the 32nd embodiment, is different from the 32nd embodiment in that the main switching element is made up of a planar MOSFET instead of a trench IGBT.

Specifically, the main switching element is a planar MOSFET structure including a n-type drain layer 231 in place of the n-type buffer layer 19 and the p-type drain layer 11 of the planar IGBT in the first embodiment (FIG. 5).

This configuration can also produce the same effect as the 32nd embodiment (34th embodiment)

Figure 55:
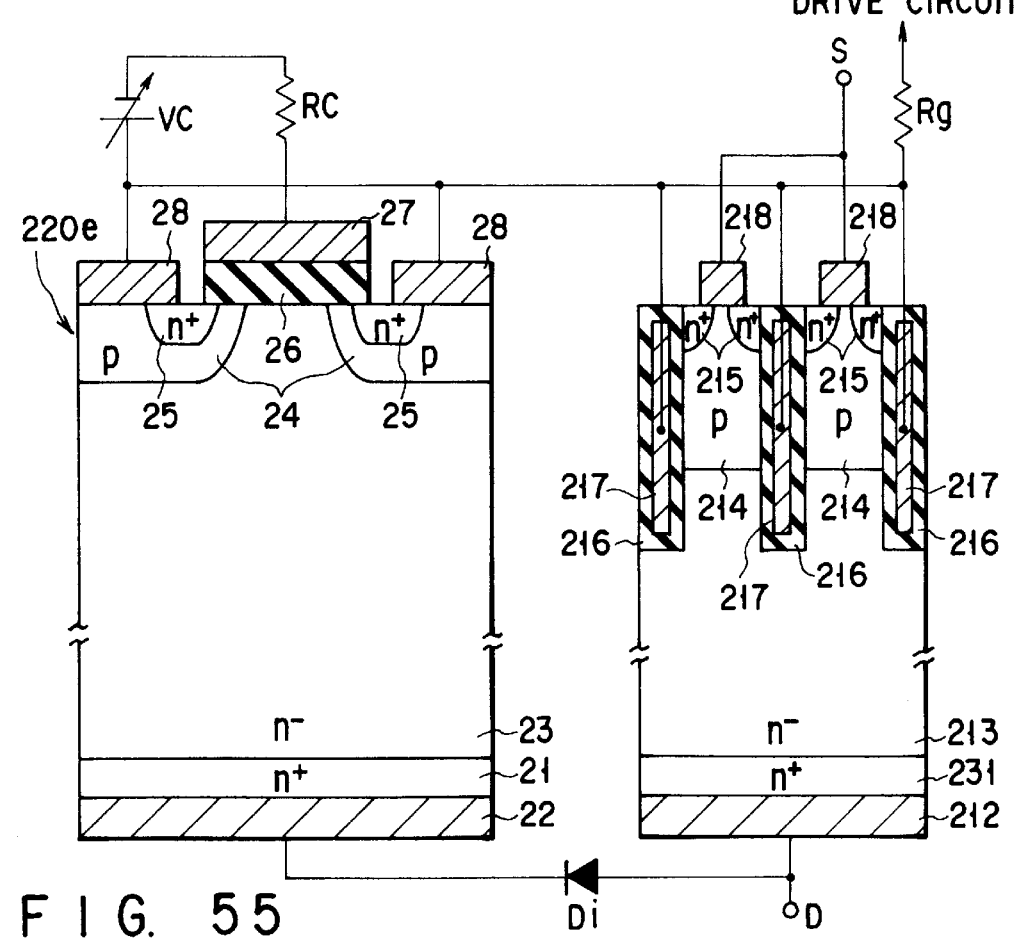
FIG. 55 is a sectional view schematically showing a configuration of a semiconductor device according to a 34th embodiment of the invention.

FIG. 55 is a sectional view schematically showing a configuration of a semiconductor device according to a 34th embodiment of the invention.

This semiconductor device, which is a modification of the 32nd embodiment, is different from the 32nd embodiment in that the main switching element is made up of a trench MOSFET.

Specifically, the main switching element constitutes a trench MOSFET structure with a n-type drain layer 231 in place of the n-type buffer layer 219 and the p-type drain layer 211 of the trench IGBT of the 28th embodiment (FIG. 49).

This configuration can also produce the same effect as the 32nd embodiment.

(35th embodiment)

FIG. 56 is a sectional view schematically showing a configuration of a semiconductor device according to a 35th embodiment of the invention.

This semiconductor device, which is a modification of the 32nd embodiment, is different from the 32nd embodiment in that the main switching element is made up of a bipolar transistor.

A collector electrode 242 is formed on one of the surfaces of a n-type collector layer 241 of this bipolar transistor. This collector electrode 242 is connected to a drain electrode 22 of the electric field detector 220e through the diode Di.

The surface of the n-type collector layer 241 opposite to the collector electrode 242 is formed with a n-type base layer 243. The surface of the n-type base layer 243 is selectively formed with a p-type base layer 244 by diffusion. The surface of the p-type base layer 244 is formed selectively with a n-type emitter layer 245.

A base electrode 246 is formed on the p-type base layer 244. The base electrode 246 is connected to a resistor RG, source electrodes 28 and the positive electrode of a variable power supply VC.

Also, the n-type emitter layer 245 is formed with an emitter electrode 247 thereon.

This bipolar transistor, unlike the IGBT or the MOSFET of the main switching element described above, constitutes a current-driven element. The main voltage, however, can be clamped to a predetermined value or less by the current supplied from the electric field detector 220e. In other words, even when the main switching element is constructed of a bipolar transistor, the same effect is obtained as the 32nd embodiment.

(36th embodiment)

FIG. 57 is a sectional view schematically showing a configuration of a semiconductor device according to a 36th embodiment of the invention.

This semiconductor device has an electric field detector 220f formed at the junction end of the main switching element.

The coupling end of the IGBT is selectively formed with a p-type base layer 254 on the surface of the n-type base layer 13. The surface of the p-type base layer 254 is selectively formed with a n-type source layer 255. A p-type resurf layer 259 is formed in contact with the p-type base layer 254 on the surface of the n-type base layer 13 in such a manner as to extend toward the outer periphery. Also, the most outer peripheral surface of the n-type base layer 13 is formed with a n-type stopper layer 250.

The electric field detector 220f has the p-type resurf layer 259 connected to the first gate electrode 17 through the gate insulating film 256, the second gate electrode 257 and the resistor RC. The second gate electrode 257 does not have such a field plate structure as in the fourth and fifth embodiments.

In this configuration, the p-type resurf layer 259 disappears from the outer peripheral portion in proportion to the magnitude of the electric field. The electric field detector 220f detects this extinction of the p-type resurf layer 259 thereby to enter a conductive state.

As a result, in the same manner as described above, a current flows from the drain electrode 12 of the IGBT to the first gate electrode 17 of the IGBT through the electric field detector 220f, and the IGBT is turned on incompletely. Then, the resistance of the IGBT drops thereby protecting the IGBT from an overvoltage.

In this way, the main switching element can be protected without reducing the effective area thereof. The gate insulating film 256 under the second gate electrode 257 of the electric field detector 220f is partially located on the p-type resurf layer 259. The reason is that the electric field detector 220f enters a conductive state as a result of extinction of the p-type resurf layer 259.

Also, this configuration enables the electric field detector 220f to detect a lower-valued electric field as the gate insulating film 256 under the second gate electrode 257 is formed nearer to the outer peripheral portion.

The structure shown in FIG. 57 is such that the main switching element is a planar IGBT, whereas the main switching element shown in FIG. 49 may be a trench IGBT.

(37th embodiment)

Figure 58:
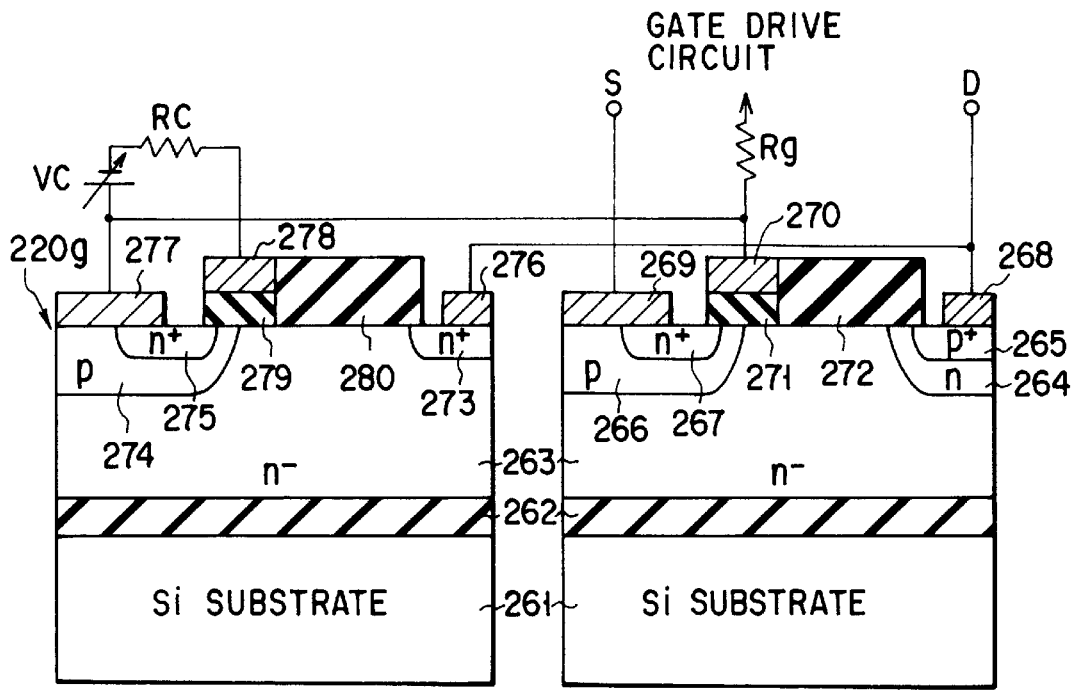
FIG. 58 is a sectional view schematically showing a configuration of a semiconductor device according to a 37th embodiment of the invention.

FIG. 58 is a sectional view schematically showing a configuration of a semiconductor device according to a 37th embodiment of the invention.

This semiconductor device has a structure including a lateral element formed on a SOI (silicon on insulator) substrate. Specifically, the main switching element is a lateral planar IGBT and the electric field detector 220g constitutes a lateral MOSFET.

More specifically, the main switching element includes a buried oxide film 262 and a n-type base layer 263 sequentially formed on a substrate 261.

The surface of the n-type base layer 263 is selectively formed with a n-type buffer layer 264, and the surface of the n-type buffer layer 264 selectively formed with a p-type drain layer 265.

Further, the surface (portion) of the n-type base layer 263 different from (the surface portion formed with) the n-type buffer layer 264 is selectively formed with a p-type base layer 266. A drain electrode 268 is formed on the p-type drain layer 265. A common source electrode 269 is selectively formed on the p-type base layer 266 and the n-type source layer 267.

A first gate electrode 270 is formed through a gate insulating film 271 on a portion of the p-type base layer 266 side of the n-type base layer 263, the p-type base layer 266 and the n-type source layer 267. Also, an insulating film 272 is formed on the n-type base layer 263, the n-type buffer layer 264 and the p-type drain layer 265 between the gate insulating film 271 and the drain electrode 268.

The electric field detector 220g, on the other hand, has a SOI structure similar to the one as described above, and the surface of the n-type base layer 263 is selectively formed with a n-type drain layer 273.

The surface portion of the n-type base layer 263 different from the portion formed with the n-type drain layer 273 is selectively formed with a p-type base layer 274. A n-type source layer 275 is formed selectively on the surface of p-type base layer 274. A drain electrode 276 is formed on the n-type drain layer 273. A common source electrode 277 is formed on the p-type base layer 274 and the n-type source layer 275.

A second gate electrode 278 is formed through a gate insulating film 279 on a part of the p-type base layer 274 side of the p-type base layer 263, the p-type base layer 274 and the n-type source layer 275. Also, an insulating film 280 is formed on the n-type base layer 263 and the n-type drain layer 273 between the gate insulating layer 279 and the drain electrode 276.

The drain electrodes 268 and 276 are connected to each other.

Like in the first embodiment, the second gate electrode 278 is connected to the first gate electrode 270 through the gate resistor RC and the variable power supply VC. The source electrode 277 is also connected to the first gate electrode 270.

This lateral structure, like the first embodiment, can protect the main switching element from an overvoltage while suppressing the generation of noises.

In the structure shown in FIG. 58, the main switching element and the electric field detector were shown as separate chips from each other. In fabrication process, however, the two elements can be formed on the same chip easily.

(38th embodiment)

Figure 59:
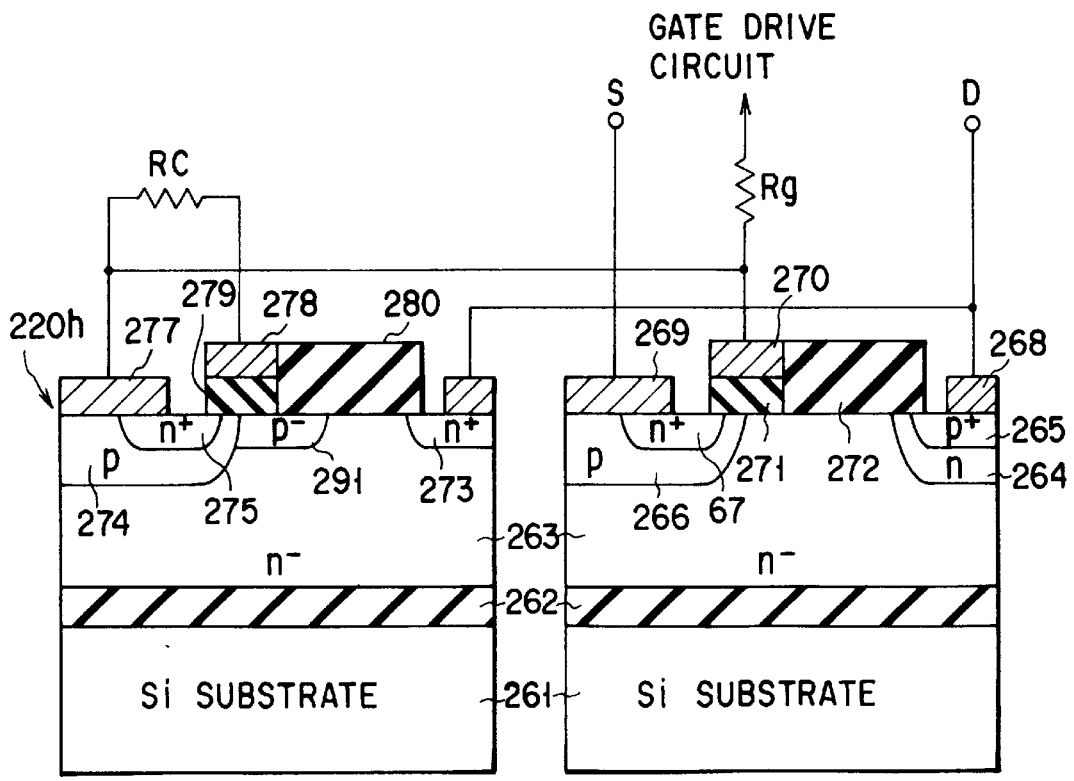
FIG. 59 is a sectional view schematically showing a configuration of a semiconductor device according to a 38th embodiment of the invention.

FIG. 59 is a sectional view schematically showing a configuration of a semiconductor device according to a 38th embodiment of the invention.

In this semiconductor device, which is a modification of the 37th embodiment, unlike the 37th embodiment, the variable power supply VC is omitted, and a high-resistance p-type shield layer 291 is formed on the surface of the n-type base layer 263 in contact with the p-type base layer 274. As described above, the main switching element and the electric field detector 220h can be easily formed on the same chip in the fabrication process.

In this configuration, like the 37th embodiment, the main switching element can be protected from an overvoltage while suppressing noises.

Also, although the clamp voltage is fixed by the p-type shield layer 291, the circuit can be simplified by omitting the variable power supply VC.

Since certain changes may be made in the above device and method without departing from the scope of the invention herein involved, it is intended that all matter contained in the above description or shown in the accompanying drawings shall be interpreted as illustrative and not in a limiting sense.

What is claimed is:

1. A semiconductor device comprising:

a main switching element including a high-voltage main electrode, a low-voltage main electrode and a first gate electrode;

an electric field detector including a MOS structure formed independent of said first gate electrode, wherein said MOS structure conducts between said high-voltage main electrode and said first gate electrode in a path other than said main switching element in accordance with a carrier condition of a semiconductor layer at an interface between said semiconductor layer and an insulating film in said MOS structure, and wherein said carrier condition changes when an electric field in said semiconductor layer increases over a value corresponding to an electric field in said main switching element; and on-voltage application means for applying an on-voltage to said first gate electrode on the basis of said conductive state in said electric field detector.

2. A semiconductor device according to claim 1, wherein:

said semiconductor layer is of a first conductivity type;

said insulating film forming on said semiconductor layer is of the first conductivity type; and the portion of said semiconductor layer of the first conductivity type adjacent to said insulating film is formed with a selected one of a channel layer of a second conductivity type and a shield layer of the second conductivity type.

3. A semiconductor device according to claim 1, wherein:

said main switching element and said electric field detector are formed on the same substrate.

4. A semiconductor device according to claim 1, wherein:

said main switching element is selected one of an IGBT and a MOSFET.

5. A semiconductor device comprising:

a main switching element including a high-voltage main electrode, a low-voltage main electrode and a first gate electrode;

an electric field detector including a semiconductor layer of a first conductivity type electrically connected to said high-voltage main electrode, a plurality of semiconductor layers of a second conductivity type formed selectively on the surface of said semiconductor layer of the first conductivity type, a second gate electrode formed through a gate insulating film on said semiconductor layer of the first conductivity type, a second gate electrode formed through a gate insulating film on said semiconductor layer of the first conductivity type held between said semiconductor layers of the second conductivity type and electrically connected to said first gate electrode, and means for conducting between said high-voltage main electrode and said first gate electrode in a path other than said main switching element in accordance with a carrier condition of said semiconductor layer of the first conductivity type at an interface between said semiconductor layer of the first conductivity type and said gate insulating film, and wherein said carrier condition changes when an electric field in said semiconductor layer of the first conductivity type increases over a value corresponding to an electric field in said main switching element; and on-voltage application means for applying an on-voltage to said first gate electrode on the basis of said conductive state in said electric field detector.

6. A semiconductor device according to claim 5, wherein:

a selected one of a channel layer of the second conductivity type and a shield layer of the second conductivity type are formed in a manner to be held between said semiconductor layers of the second conductivity type.

7. A semiconductor device according to claim 5, wherein:

said main switching element and said electric field detector are formed on the same substrate.

8. A semiconductor device according to claim 5, wherein:

said main switching element is selected one of an IGBT and a MOSFET.

9. A semiconductor device according to claim 5, wherein:

an emitter layer of the first conductivity type is formed selectively in said semiconductor layer of the second conductivity type whereby said electric field detector has a MOSFET structure.

10. A semiconductor device according to claim 5, further comprising a variable power supply electrically connected between said first gate electrode and said second gate electrode.

* * * * *